United States Patent
Hata

(10) Patent No.: US 8,536,687 B2
(45) Date of Patent: Sep. 17, 2013

(54) SEMICONDUCTOR DEVICE HAVING SEPARATED HEATSINK AND CHIP MOUNTING PORTION

(75) Inventor: Toshiyuki Hata, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/345,954

(22) Filed: Jan. 9, 2012

(65) Prior Publication Data

US 2012/0175762 A1 Jul. 12, 2012

(30) Foreign Application Priority Data

Jan. 12, 2011 (JP) ................. 2011-003691

(51) Int. Cl.
*H01L 23/495* (2006.01)
*H01L 23/28* (2006.01)

(52) U.S. Cl.
USPC ........... 257/675; 257/796; 257/E23.051; 257/E23.101; 257/E23.102; 257/E23.103; 257/E23.104; 257/E23.105

(58) Field of Classification Search
USPC ........... 257/675, 796, E23.051, E23.101, 257/E23.102, E23.103, E23.104, E23.105
See application file for complete search history.

(56) References Cited

U.S. PATENT DOCUMENTS

| | | | | |
|---|---|---|---|---|
| 5,072,283 A | * | 12/1991 | Bolger | 257/676 |
| 5,345,106 A | * | 9/1994 | Doering et al. | 257/675 |
| 5,659,200 A | * | 8/1997 | Sono et al. | 257/713 |
| 6,307,272 B1 | * | 10/2001 | Takahashi et al. | 257/787 |
| 7,091,603 B2 | * | 8/2006 | Mamitsu et al. | 257/706 |
| 7,294,912 B2 | * | 11/2007 | Takeuchi et al. | 257/675 |
| 7,321,161 B2 | * | 1/2008 | Teixeira et al. | 257/675 |
| 7,374,965 B2 | * | 5/2008 | Muto et al. | 438/106 |
| 7,598,603 B2 | * | 10/2009 | Otremba | 257/675 |
| 7,714,455 B2 | * | 5/2010 | Son et al. | 257/787 |
| 7,884,385 B2 | * | 2/2011 | Wu | 257/98 |
| 7,955,902 B2 | * | 6/2011 | Hata et al. | 438/123 |
| 8,304,871 B2 | * | 11/2012 | Yu et al. | 257/676 |
| 2002/0008327 A1 | * | 1/2002 | Cutter | 257/788 |
| 2004/0075100 A1 | * | 4/2004 | Bogner et al. | 257/99 |
| 2007/0052072 A1 | * | 3/2007 | Iwade et al. | 257/675 |
| 2007/0296077 A1 | * | 12/2007 | Moline | 257/712 |
| 2008/0017907 A1 | * | 1/2008 | Otremba | 257/306 |
| 2008/0017998 A1 | * | 1/2008 | Pavio | 257/787 |
| 2008/0036057 A1 | * | 2/2008 | Chou et al. | 257/676 |
| 2010/0289137 A1 | * | 11/2010 | Eom et al. | 257/712 |

FOREIGN PATENT DOCUMENTS

JP 06-132457 A 5/1994
JP 2000-031338 A 1/2000

* cited by examiner

*Primary Examiner* — Ida M Soward
(74) *Attorney, Agent, or Firm* — Mattingly & Malur, PC

(57) ABSTRACT

A technology with which the reliability of a package making up a semiconductor device can be enhanced is provided. A feature of the technical idea of the invention is that: a heat sink unit and an outer lead unit are separated from each other: and the outer lead unit is provided with chip placement portions and each of the chip placement portions and each heat sink are joined together. As a result, when a sealing body is formed at a resin sealing step, tying portions function as a stopper for preventing resin leakage and the formation of resin burr in a package product can be thereby prevented. In addition, camber does not occur in the heat sink unit and cracking in a sealing body caused by winding (camber) can be suppressed.

16 Claims, 68 Drawing Sheets

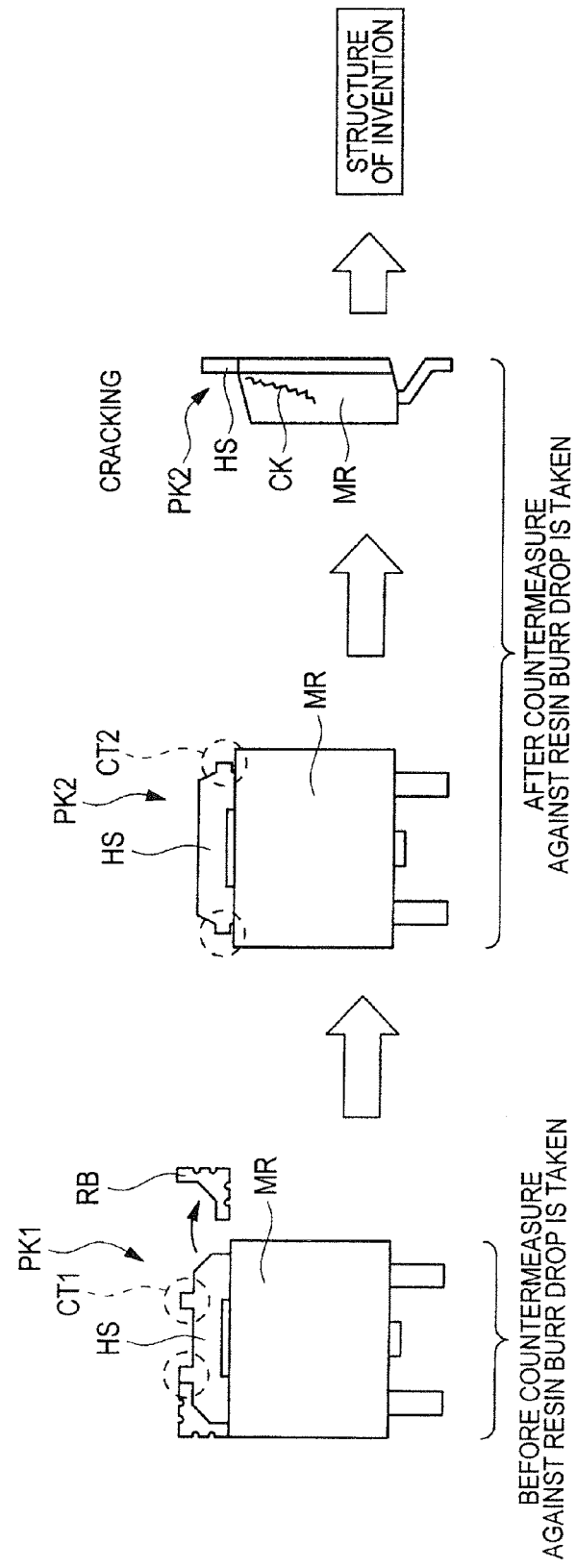

FIG. 12

| | STATE OF FRAME | IDEAL STATE | ACTUAL STATE |
|---|---|---|---|
| BEFORE COUNTER-MEASURE AGAINST RESIN BURR DROP IS TAKEN | | HS, PJ1, MR | HS, PJ1, MR |
| AFTER COUNTER-MEASURE AGAINST RESIN BURR DROP IS TAKEN | | HS, CON, PJ2, MR | HS, CON, PJ2, MR |

FIG. 17(a)
FIG. 17(b)
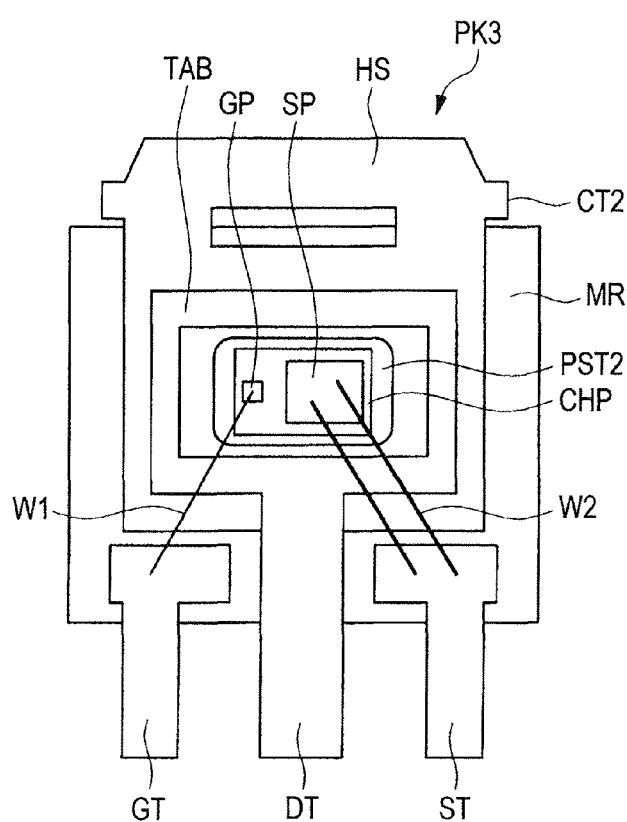
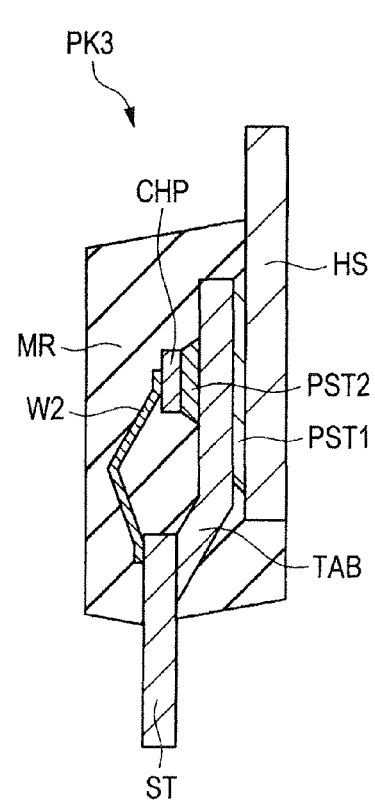

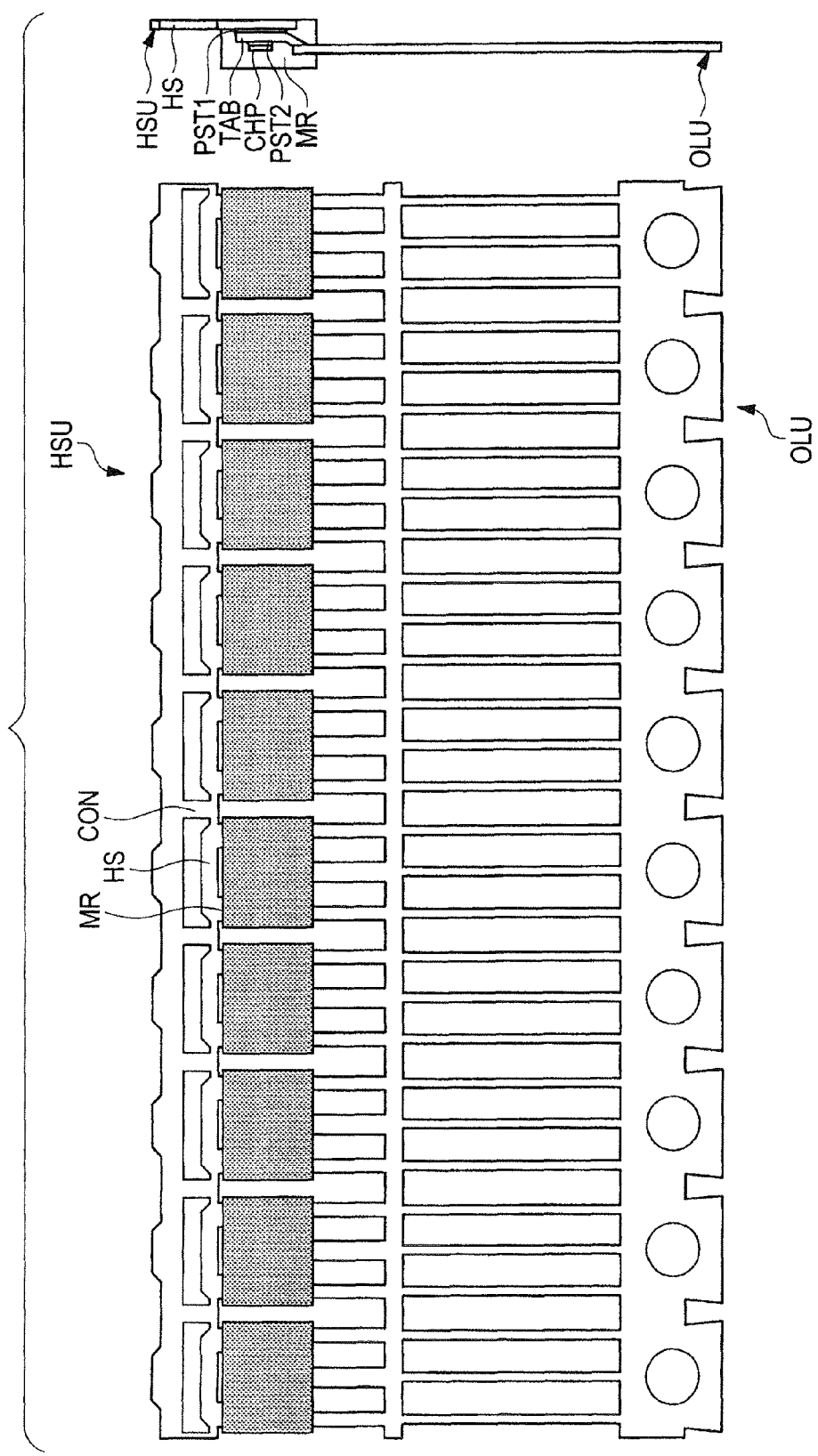

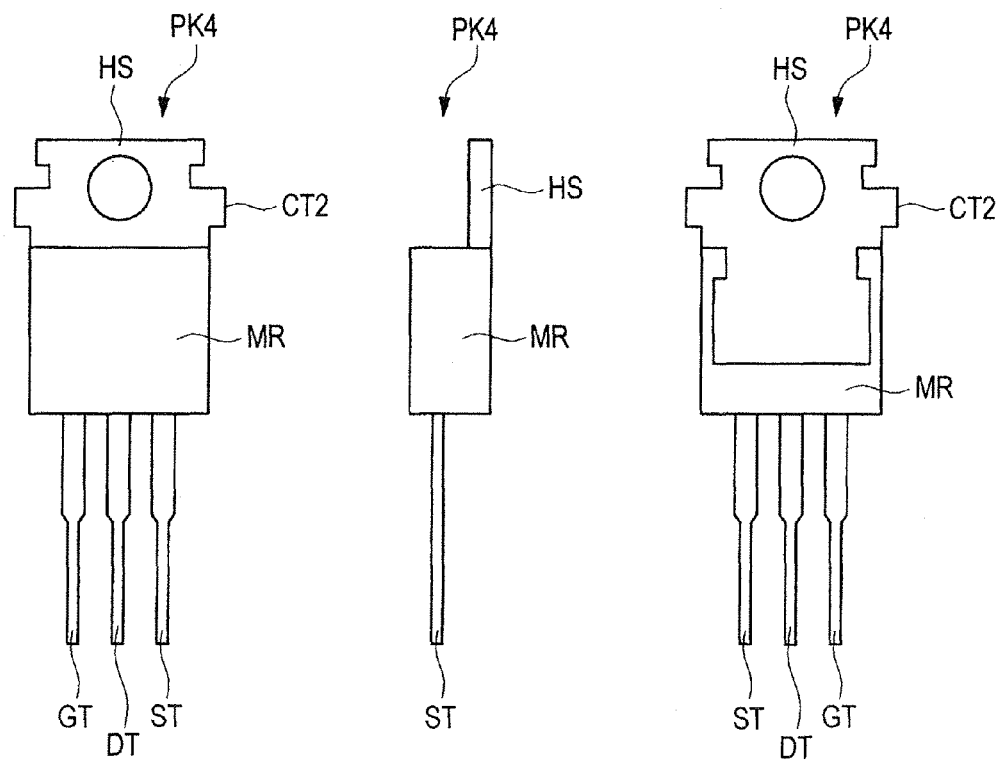

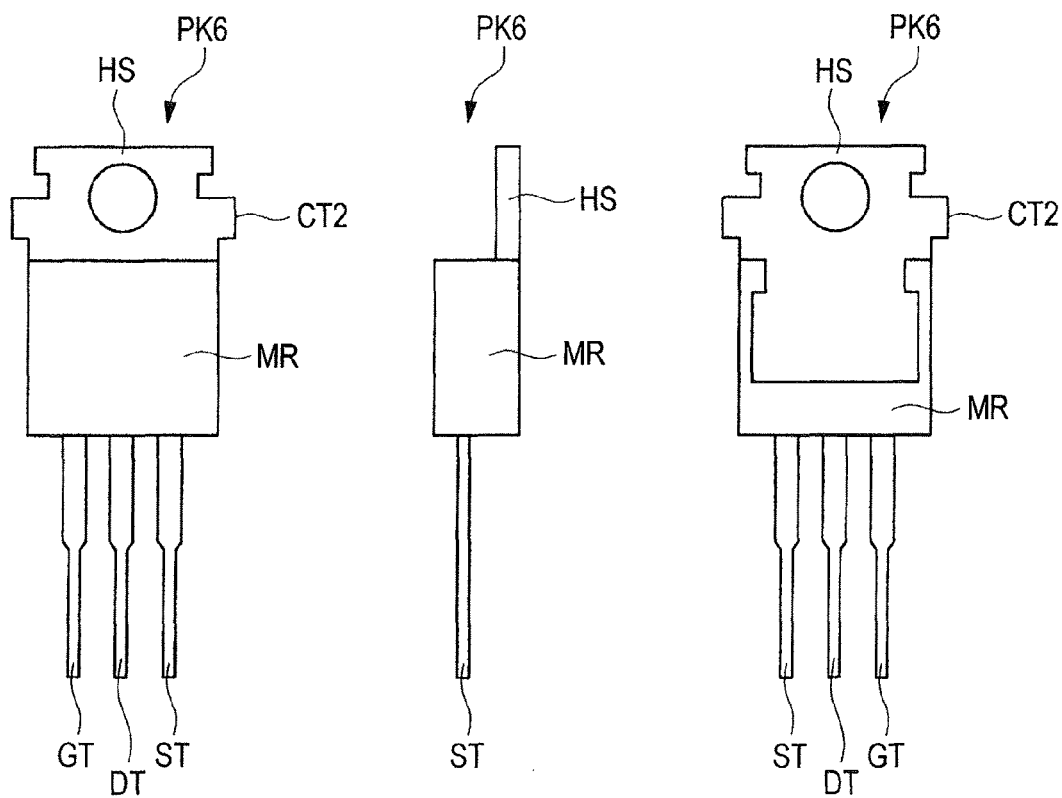

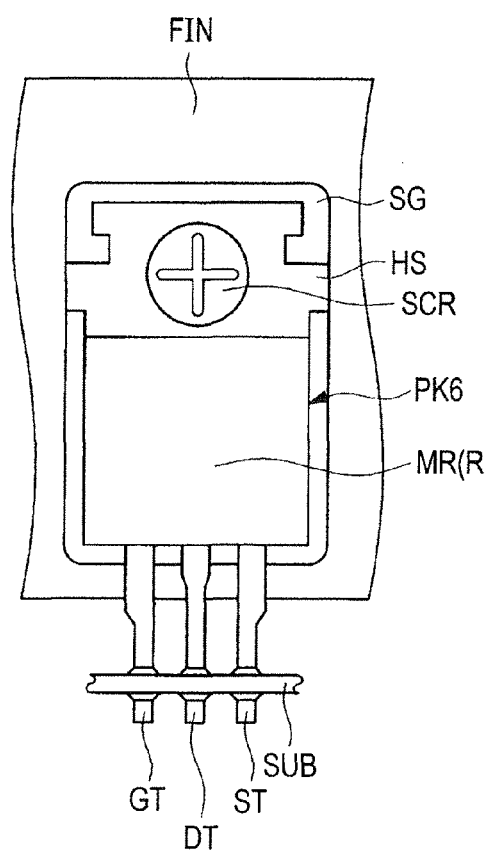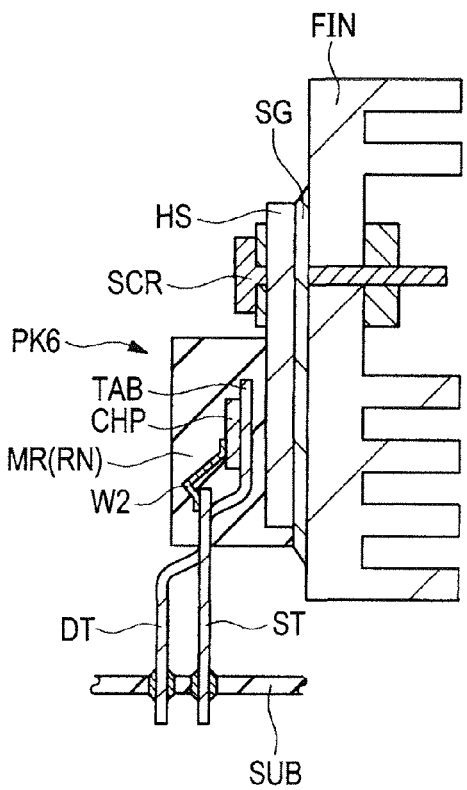

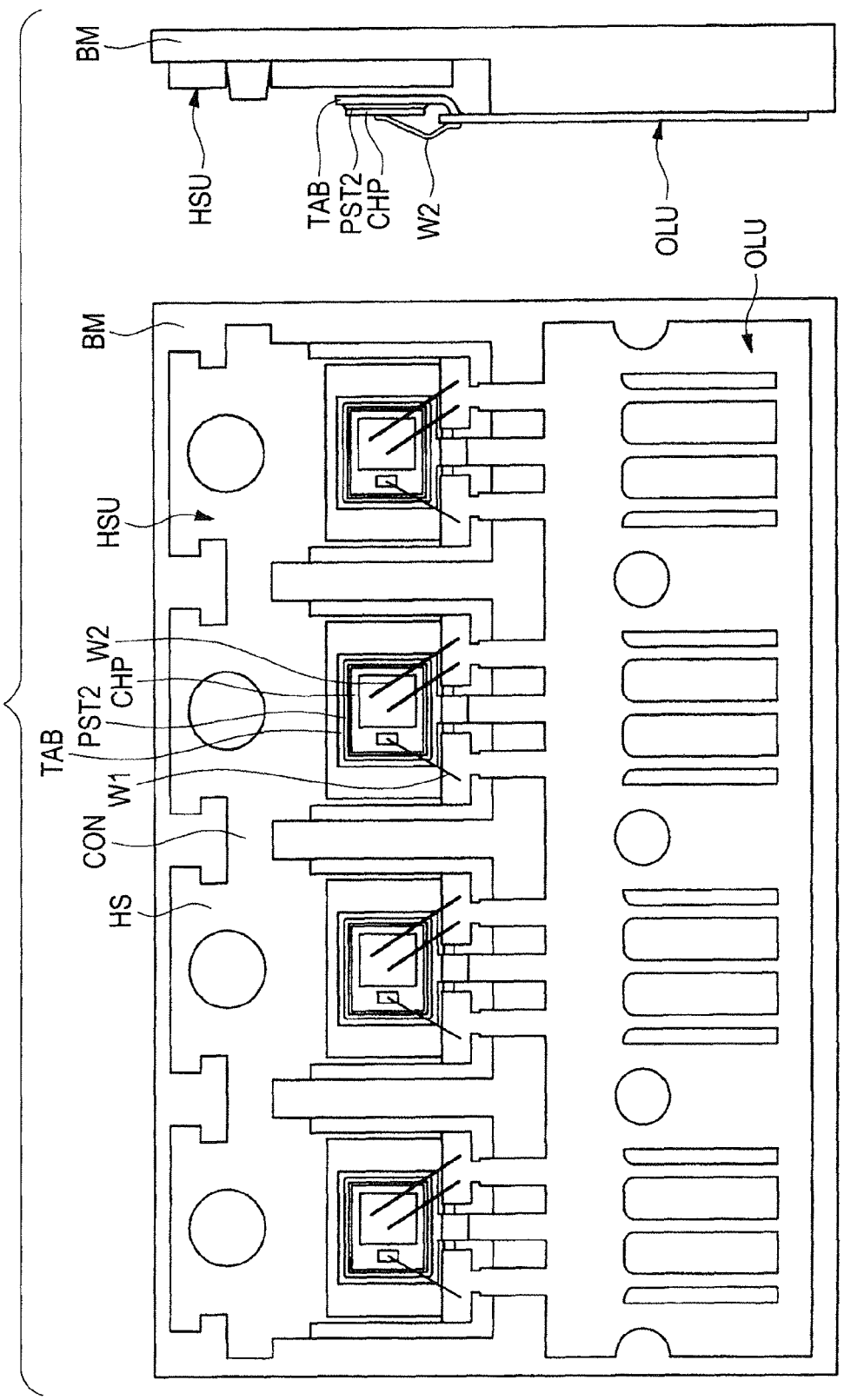

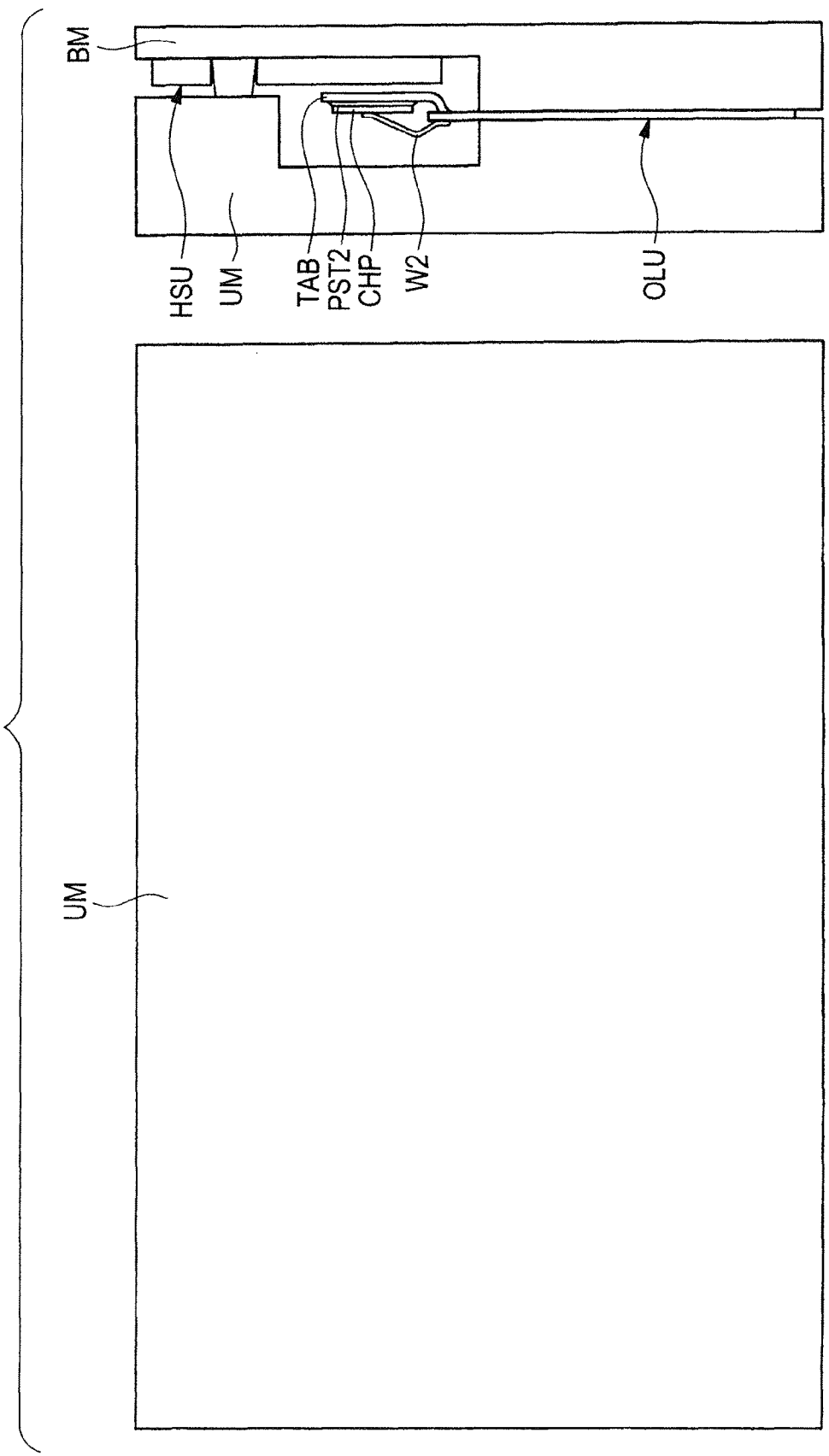

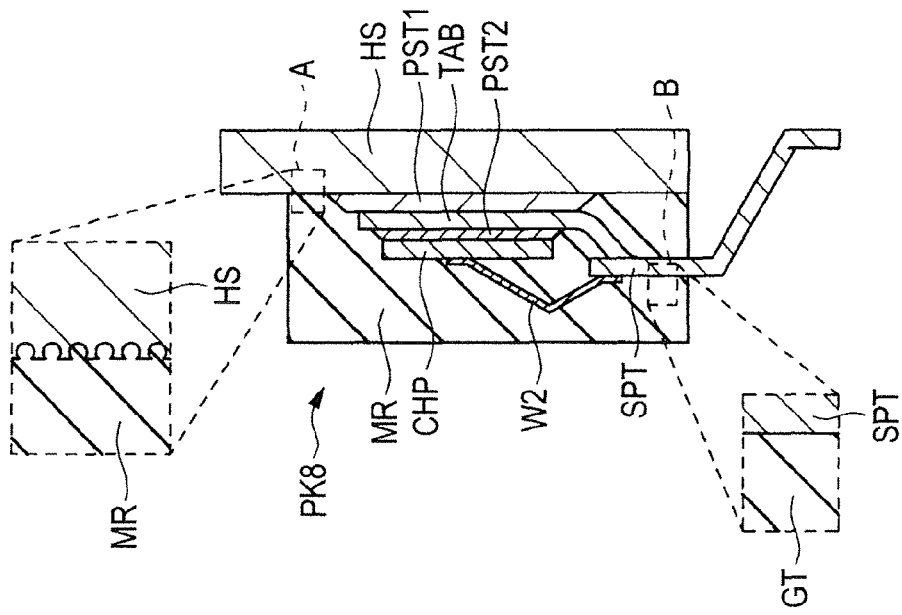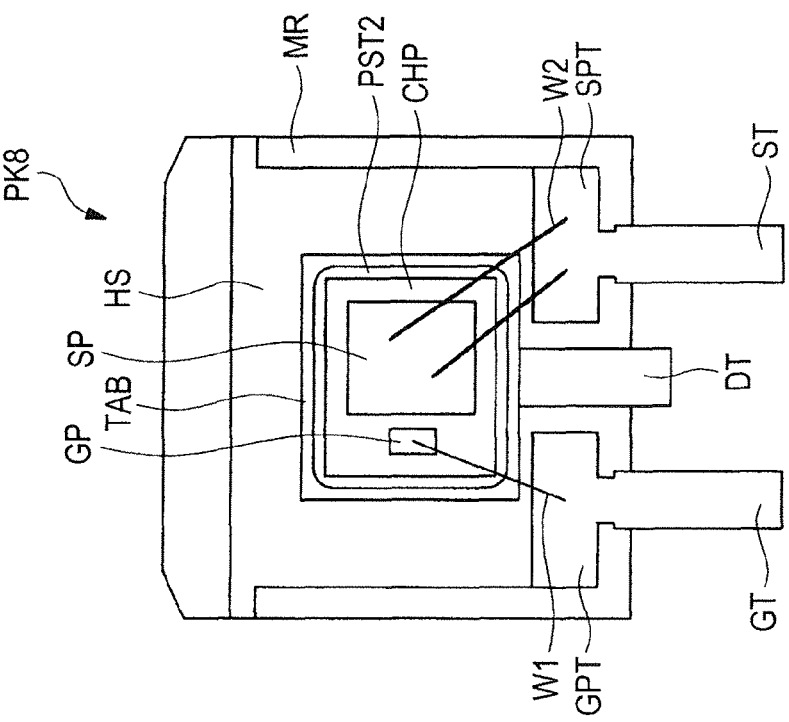

SEMICONDUCTOR DEVICE HAVING SEPARATED HEATSINK AND CHIP MOUNTING PORTION

CROSS-REFERENCE TO RELATED APPLICATIONS

The disclosure of Japanese Patent Application No. 2011-3691 filed on Jan. 12, 2011 including the specification, drawings and abstract is incorporated herein by reference in its entirety.

BACKGROUND

The present invention relates to semiconductor devices and manufacturing technologies thereof and in particular to a technology effectively applicable to a resin-sealed semiconductor device and a manufacturing technology thereof.

Japanese Unexamined Patent Publication No. Hei 6(1994)-132457 (Patent Document 1) describes a structure in which a thick transistor placement portion and thin inner leads are separately configured. According to Patent Document 1, a transistor element is placed over a transistor placement portion and this transistor placement portion and inner leads are joined and integrated with each other by inserting a dowel (joining portion) into a hole and swaging it. As illustrated in FIG. 5 in Patent Document 1, the transistor placement portion and the inner leads are sealed with sealing resin so that it is completely covered.

Japanese Unexamined Patent Publication No. 2000-31338 (Patent Document 2) describes the structure illustrated in FIG. 2 and FIG. 6 in Patent Document 2. In this structure, a lead frame is placed over a base substrate with a resin insulating layer in between and a switching semiconductor element is placed over this lead frame.

[Patent Document 1]
Japanese Unexamined Patent Publication No. Hei 6 (1994)-132457
[Patent Document 2]
Japanese Unexamined Patent Publication No. 2000-31338

SUMMARY

A semiconductor device is formed of: a semiconductor chip in which a semiconductor element such as MOSFET (Metal Oxide Semiconductor Field Effect Transistor) and multilayer interconnection are formed; and a package so formed as to cover this semiconductor chip.

The above-mentioned package has the functions of (1) electrically coupling together the semiconductor element formed in the semiconductor chip and an external circuit; and (2) protecting the semiconductor chip from the external environment, such as humidity and temperature, to prevent breakage due to vibration or impact and degradation in the characteristics of the semiconductor chip. In addition, the package has the functions of: (3) facilitating handling of the semiconductor chip; and (4) dissipating heat produced when the semiconductor chip is in operation to make full use of the functionality of the semiconductor element. Therefore, it is important to enhance the reliability of the package making up the semiconductor device to allow the package to sufficiently deliver the required functions mentioned above.

It is an object of the invention to provide a technology that enables the enhancement of the reliability of the package making up a semiconductor device.

The above and other objects and novel features of the invention will be apparent from the description in this specification and the accompanying drawings.

The following is a brief description of the gist of the representative elements of the invention laid open in this application.

A semiconductor device in a representative embodiment includes: (a) a heat sink having a first front surface and a first back surface located on the opposite side to the first front surface; and (b) a lead portion having multiple leads and a chip placement portion having a second front surface and a second back surface located on the opposite side to the second front surface. The semiconductor device further includes: (c) a semiconductor chip placed over the second front surface of the chip placement portion; and (d) a sealing body that seals part of the heat sink, part of the lead portion, and the semiconductor chip. The semiconductor chip and the leads making up the lead portion are electrically coupled together. In the sealing body, the first front surface of the heat sink and the second back surface of the chip placement portion are so arranged that they are opposed to each other.

A manufacturing method of a semiconductor device in a representative embodiment includes the steps of (a) preparing a first frame in which multiple heat sinks are tied together through a tying portion; (b) preparing a second frame in which multiples lead portions each having multiple leads and a chip placement portion are tied together; and (c) forming the second frame so that the surface of the chip placement portion is located lower than the surfaces of the leads. The manufacturing method further includes the steps of (d) placing a semiconductor chip over each the chip placement portion; (e) electrically coupling together each the semiconductor chip and the leads; and (f) sealing part of each the heat sink, part of each the lead portion, and each the semiconductor chip. The step (f) includes the steps of: (f1) positioning and setting the first frame and the second frame in molding dies from above so that each the chip placement portion overlaps with each the heat sink as viewed in a plane; and (f2) filling the interior of the molding dies with resin using the tying portions formed in the first frame as a resin stopper. The step (f) further includes the step of: (f3) taking the molded first frame and second frame out of the molding dies.

The following is a brief description of the gist of the effect obtained by the representative elements of the invention laid open in this application.

The reliability of the package making up a semiconductor device can be enhanced.

BRIEF DESCRIPTION OF THE DRAWINGS

FIG. 1 is a drawing schematically illustrating the flow from the structure of a first package product to the structure of the invention;

FIG. 12 is a drawing explaining the mechanism by which cracking occurs in a sealing body only when winding (camber) occurs in a lead frame used to manufacture the second package in contrast with a case where winding (camber) occurs in a lead frame used to manufacture the first package;

FIG. 17A is a plan view illustrating the internal structure of a package in an embodiment;

FIG. 17B is a sectional view illustrating the internal structure of the package in the embodiment;

FIG. 33 is a drawing illustrating the manufacturing process of the semiconductor device, following FIG. 32;

FIG. 34A is a front view of a fourth package as viewed from front;

FIG. 34B is a side view of the fourth package as viewed laterally;

FIG. 34C is a back view of the fourth package as viewed from rear;

FIG. 45A is a front view of a package in an embodiment as viewed from front;

FIG. 45B is a side view of the package in the embodiment as viewed laterally;

FIG. 45C is a back view of the package in the embodiment as viewed from rear;

FIG. 47A is a drawing illustrating how a package in an embodiment is mounted over a mounting substrate as viewed from front;

FIG. 47B is a sectional view illustrating how the package in the embodiment is mounted over the mounting substrate as viewed laterally;

FIG. 54 is a drawing illustrating the manufacturing process of the semiconductor device, following FIG. 53;

FIG. 55 is a drawing illustrating the manufacturing process of the semiconductor device, following FIG. 54;

FIG. 64A is a plan view illustrating the internal structure of a package in an embodiment;

FIG. 64B is a sectional view illustrating the internal structure of the package in the embodiment;

FIG. 74B is a drawing illustrating the cross section structure of the 12th package;

FIG. 74C is a plan view of the 12th package as viewed from rear; and

FIG. 75 is a sectional view illustrating how the 12th package is mounted over a mounting substrate.

DETAILED DESCRIPTION

Figure 2A:
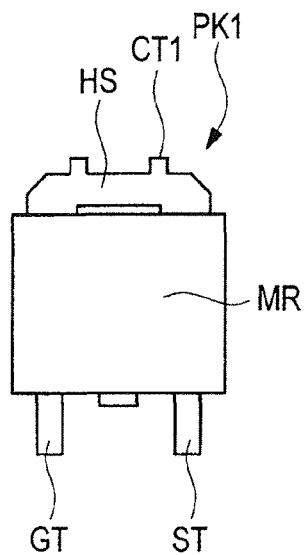
FIG. 2A is a front view of a first package as viewed from front.

In the following description, each embodiment will be divided into multiple sections if necessary for the sake of convenience. Unless explicitly stated otherwise, they are not unrelated to one another and they are in such a relation that one is a modification, details, supplementary explanation, or the like of part or all of the other.

When mention is made of any number of elements or the like (including a number of pieces, a numeric value, a quantity, a range, and the like) in the following description of embodiments, the number is not limited to that specific number. Unless explicitly stated otherwise or the number is obviously limited to a specific number in principle, the foregoing applies and the number may be above or below that specific number.

In the following description of embodiments, needless to add, their constituent elements (including elemental steps and the like) are not always indispensable unless explicitly stated otherwise or they are obviously indispensable in principle.

Similarly, when mention is made of the shape, positional relation, or the like of a constituent element or the like in the following description of embodiments, it includes those substantially approximate or analogous to that shape of the like. This applies unless explicitly stated otherwise or it is apparent in principle that some shape of the like does not include those substantially approximate or analogous to that shape or the like. This is the same with the above-mentioned numeric values and ranges.

In every drawing for explaining embodiments, the same members will be marked with the same reference numerals as a rule and the repetitive description thereof will be omitted. Even a plan view may be hatched for making the drawing easily understandable.

<Basic Technical Idea of the Invention>

The invention is characterized in that it is configured as described below to enhance the reliability of the package making up a semiconductor device. The semiconductor device of the invention includes: (a) a heat sink having a first front surface and a first back surface located on the opposite side to the first front surface; (b) a lead portion having multiple leads and a chip placement portion having a second front surface and a second back surface located on the opposite side to the second front surface; (c) a semiconductor chip placed over the second front surface of the chip placement portion; and (d) a sealing body that seals part of the heat sink, part of the lead portion, and the semiconductor chip. The semiconductor chip and the leads making up the lead portion are electrically coupled with each other. In the sealing body, the first front surface of the heat sink and the second back surface of the chip placement portion are so arranged that they are opposed to each other. Adoption of this characteristic configuration makes it possible to enhance the reliability of the package in package products in various modes. That is, the above-mentioned characteristic configuration of the invention has the following advantages: it can be applied to various package products and it makes it possible to solve problems involved in each package product. Hereafter, description will be given to concrete examples in which the basic technical idea of the invention is applied to individual package products. Further, specific and concrete description will be given to that the problems involved in individual package products can be solved according to the invention.

<Problem Involved in First Package Product>

Description will be given to an example in which the technical idea of the invention is applied to a first package product. First, description will be given to a problem involved in the first package product with reference to drawings. FIG. 1 schematically illustrates the flow from the structure of the first package product to the structure of the invention. As illustrated in FIG. 1, there is the form of package PK1 as a package structure before countermeasure is taken against resin burr. In this package PK1, a heat sink HS having a heat radiation function is protruded from the upper part of a rectangular sealing body MR. Each package PK1 is manufactured as is tied through a lead frame and is obtained by cutting each heat sink HS at cutting portions CT1 when the work piece is finally segmented into individual packages PK1. The package PK1 has such a structure that there are cutting portions CT1 at the upper part of the heat sink HS. It was found that in the package PK1 having this structure, resin leaked out and resin burr RB was formed when a sealing body MR was formed. If the package PK1 with resin burr RB formed thereon is shipped as a product, the resin burr RB may drop off from the package PK1 at the destination of shipment and the dropped resin burr RB may stick to a terminal on a mounting substrate. In this case, the following problem arises, for example, when a terminal of the mounting substrate and a lead of the package (semiconductor device) are electrically coupled together: the resin burr RB as a resin insulator sticking to the terminal of the mounting substrate interferes with electrical coupling between the terminal on the mounting substrate and the lead of the package. For this reason, it was found that it was necessary to improve such a structure of the package PK1 that resin burr RB is formed.

Consequently, it was considered changing the structure of the package PK1 to the structure of a package PK2 as illustrated in FIG. 1. This package PK2 has such a structure that there are cutting portions CT2 lateral to the heat sink HS. It was verified that in the package PK2 having this structure, resin leakage could be suppressed when the sealing body MR was formed and as a result, the resin burr RB was hardly formed on the package PK2. Therefore, it was guessed that the formation of resin burr RB could be prevented by taking the following measure: the structure of the package PK1 in which cutting portions CT1 are located at the upper part of a heat sink is changed to the structure of the package PK2 in which cutting portions CT2 are located at the side of a heat sink.

However, it was revealed that in the package PK2, a new problem that had not occurred in the package PK1 arose. That is, it was found that the following took place when the structure of the package PK1 was changed to the structure of the package PK2 to solve the problem of resin burr RB that occurred in the package PK1: as a new problem, cracking CK occurs in the sealing body MR. That is, when the structure of the package PK2 is adopted from the view point of preventing the formation of resin burr RB, a new problem, cracking in the sealing body MR, arises. Therefore, it can be understood that: the structure of the package PK1 involves the problem of the formation of resin burr RB; and the structure of the package PK2 is a structure in which the formation of resin burr RB can be suppressed but cracking CK occurs in the sealing body MR.

Figure 2B:
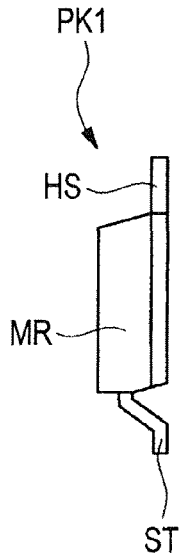
FIG. 2B is a side view of the first package as viewed laterally.
Figure 2C:
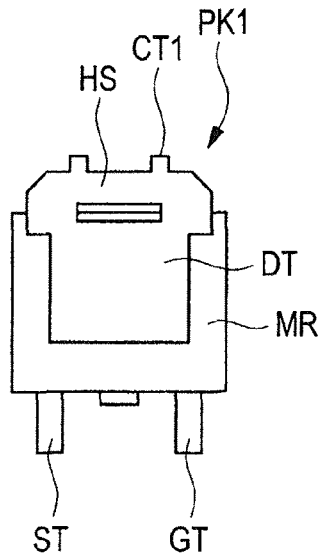
FIG. 2C is a back view of the first package as viewed from rear.

Hereafter, description will be given to the structure of the package PK1 and subsequently to a reason why resin burr RB is formed in this structure of the package PK1. FIGS. 2A to 2C illustrate the configuration of the appearance of the package PK1; FIG. 2A is a front view of the package PK1 as viewed from front; and FIG. 2B is a side view of the package PK1 as viewed laterally. FIG. 2C is a back view of the package PK1 as viewed from rear.

In FIG. 2A, the package PK1 has a rectangular sealing body MR and a semiconductor chip in which, for example, an integrated circuit is formed is buried in this sealing body MR. Part of a heat sink HS is protruded from the upper part of the sealing body MR and cutting portions CT1 that are traces of separation from a lead frame are formed at the upper part of the heat sink HS. Meanwhile, a gate terminal GT and a source terminal ST are protruded from the lower part of the sealing body MR. It is seen from FIG. 2B that the package PK1 is provided at the bottom portion of the sealing body MR with the heat sink HS and, for example, the source terminal ST is protruded from the sealing body MR. Further, it is seen from the FIG. 2C that in the package PK1, the heat sink HS is placed in the back surface of the sealing body MR and this heat sink HS functions also as a drain terminal DT.

Figure 3:
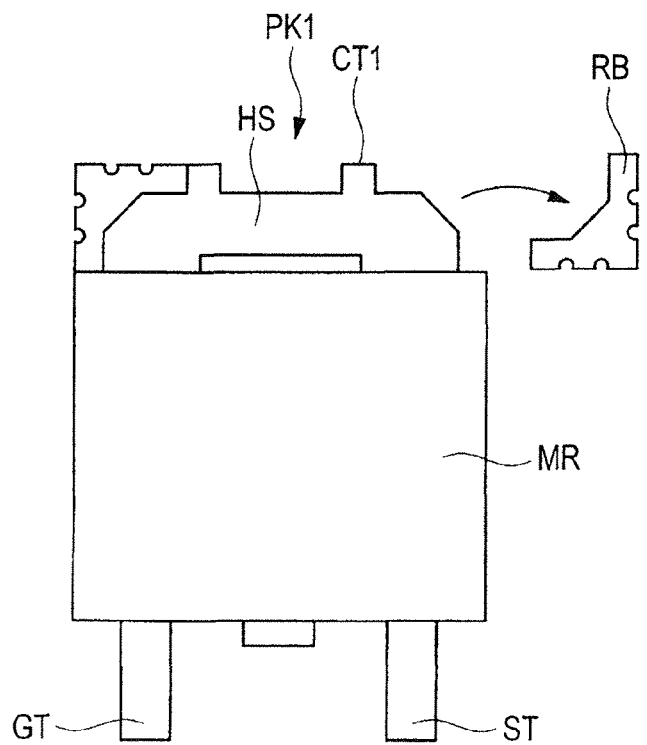
FIG. 3 is a drawing illustrating the configuration of the appearance of the first package with resin burr formed thereon.

FIG. 3 illustrates the configuration of the appearance of the package PK1 with resin burr RB formed thereon. It is seen from FIG. 3 that the resin burr RB is formed at the side of the heat sink HS protruded from the upper part of the sealing body MR. That is, with the structure of the package PK1, resin burr RB is prone to be formed as illustrated in FIG. 3. Hereafter, description will be given to a reason why resin burr RB is frequently formed in the above-mentioned structure of the package PK1.

Figure 4:
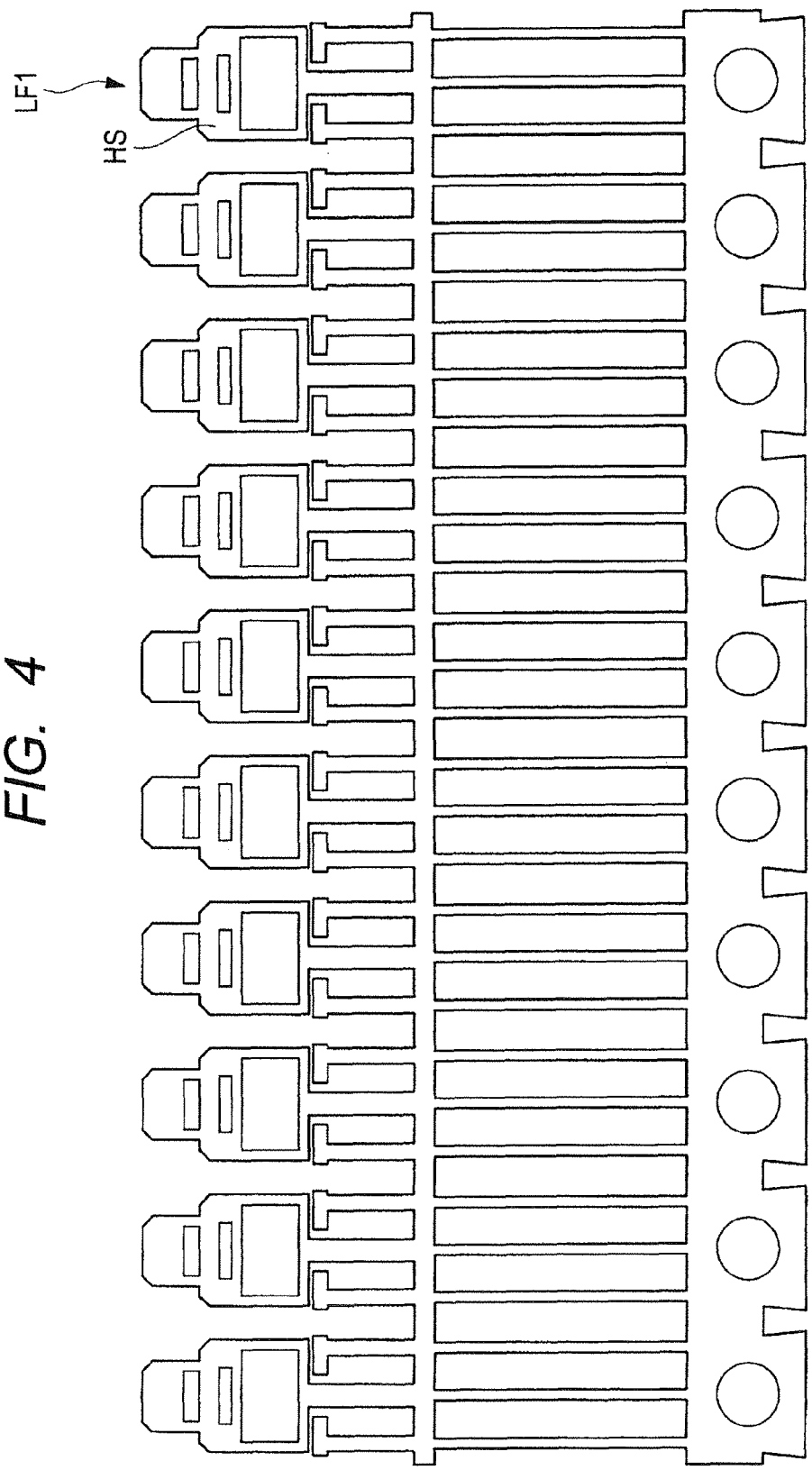
FIG. 4 is a drawing illustrating the structure of a lead frame used when the first package is manufactured.

FIG. 4 illustrates the structure of a lead frame LF1 used when the package PK1 is manufactured. As illustrated in FIG. 4, this lead frame LF1 is so structured that multiple heat sinks HS are provided but individual heat sinks HS are not so configured that they are joined with one another. That is, adjoining heat sinks HS are not tied with one another; therefore, resin is prone to leak out from the gaps between multiple heat sinks HS when part of each heat sink HS is sealed (molded) with resin. Resin leaks out from gaps existing between adjoining heat sinks HS and resin burr is formed in each package PK1. That is, it is guessed that a cause for the formation of resin burr in the package PK1 is the structure of the lead frame LF1. More specific description will be given. The multiple heat sinks HS formed in the lead frame LF1 are not tied with one another. As a result, gaps are produced between heat sinks HS during resin sealing and the resin leaks out from these gaps and causes resin burr to be formed in each package PK1.

To solve the above-mentioned problem involved in the package PK1, the structure of the package PK2 could be used. Hereafter, description will be given to the structure of the package PK2.

Figure 5A:
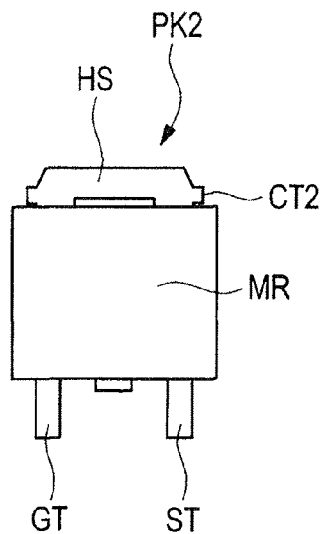
FIG. 5A is a front view of a second package as viewed from front.
Figure 5B:
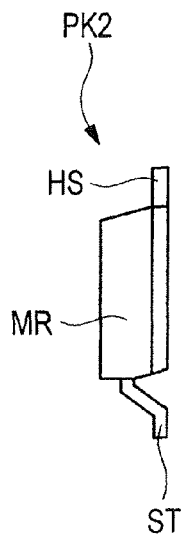
FIG. 5B is a side view of the second package as viewed laterally.
Figure 5C:
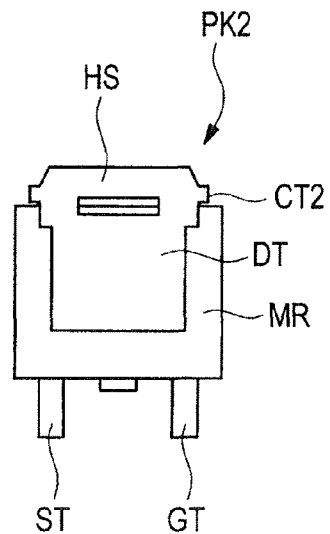
FIG. 5C is a back view of the second package as viewed from rear.

FIGS. 5A to 5C illustrate the configuration of the appearance of the package PK2; FIG. 5A is a front view of the package PK2 as viewed from front; and FIG. 5B is a side view of the package PK2 as viewed laterally. FIG. 5C is a back view of the package PK2 as viewed from rear.

In FIG. 5A, the package PK2 has a rectangular sealing body MR and a semiconductor chip in which, for example, an integrated circuit is formed is buried in this sealing body MR. Part of the heat sink HS is protruded from the upper part of the sealing body MR and cutting portions CT2 that are traces of separation from a lead frame are formed at the side of the heat sink HS. As mentioned above, the structure of the package PK2 is different from the structure of the package PK1 in that the cutting portions CT2 are formed at the side of the heat sink HS. Meanwhile, a gate terminal GT and a source terminal ST are protruded from the lower part of the sealing body MR. It is seen from FIG. 5B that the package PK2 is provided at the bottom portion of the sealing body MR with the heat sink HS and, for example, the source terminal ST is protruded from the sealing body MR. Further, it is seen from FIG. 5C that in the package PK2, the heat sink HS is placed in the back surface of the sealing body MR and this heat sink HS functions also as a drain terminal DT.

Figure 6:
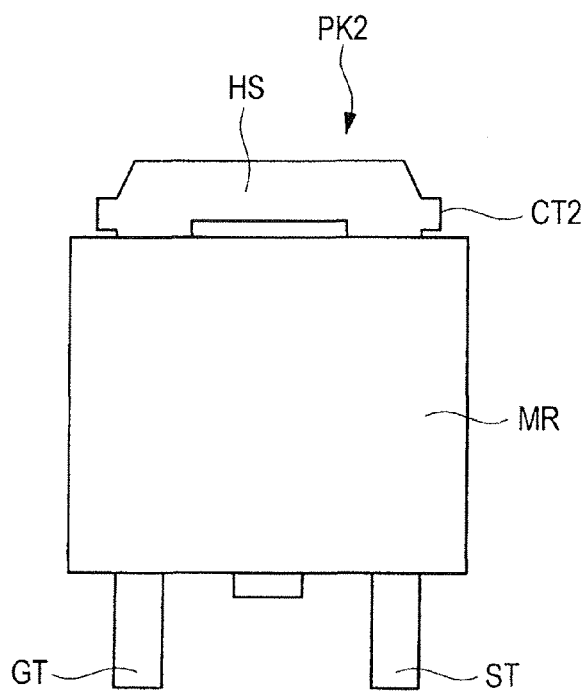
FIG. 6 is a drawing illustrating the configuration of the appearance of the second package.

FIG. 6 illustrates the configuration of the appearance of the package PK2. It is seen from FIG. 6 that resin burr is not formed at the side of the heat sink HS protruded from the upper part of the sealing body MR. That is, with the structure of the package PK2, resin burr is less prone to be formed as illustrated in FIG. 6. Description will be given to a reason why resin burr is less prone to be formed in the structure of the package PK2 as mentioned above.

Figure 7:
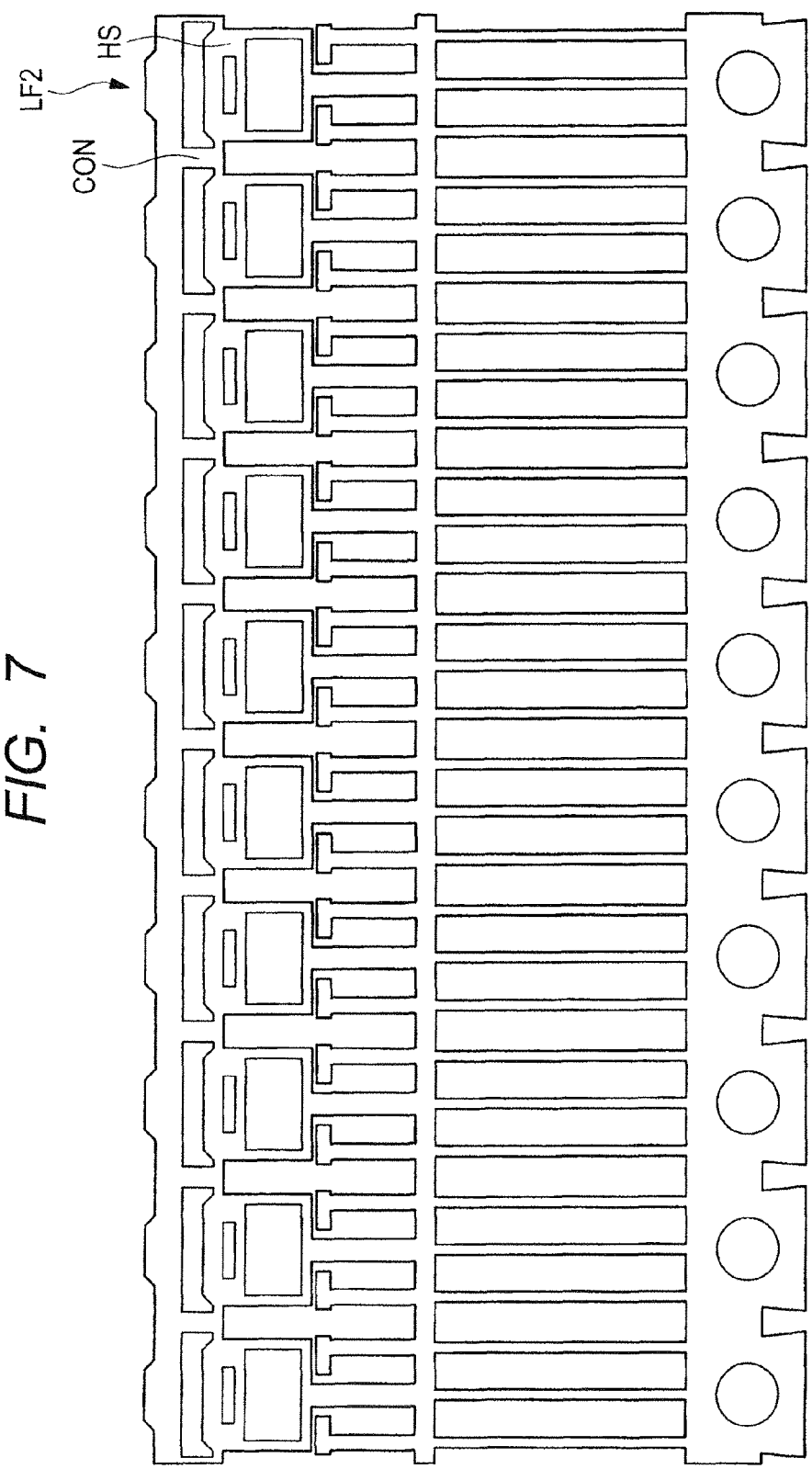
FIG. 7 is a drawing illustrating the structure of a lead frame used when the second package is manufactured.

FIG. 7 illustrates the structure of a lead frame LF2 used when the package PK2 is manufactured. As illustrated in FIG. 7, this lead frame LF2 is so structured that multiple heat sinks HS are provided and individual heat sinks HS are joined with one another through tying portions CON. This lead frame is different from the lead frame LF1 (Refer to FIG. 4) used to manufacture the package PK1. That is, in the lead frame LF2 illustrated in FIG. 7, adjoining heat sinks HS are tied with one another through the tying portions CON; therefore, a gap is not produced between multiple heat sinks HS when part of each heat sink HS is sealed (molded) with resin. In the lead frame LF2 illustrated in FIG. 7, the tying portions CON are formed in the gaps formed between heat sinks HS and these tying portions CON function as a stopper against resin leakage and make resin leakage less prone to occur. In the lead frame LF2 illustrated in FIG. 7, the tying portion CON exists between adjoining heat sinks HS and these tying portions CON function as a stopper against resin leakage; therefore, resin burr can be prevented from being formed in the package PK2. Because of the foregoing, the formation of resin burr can be suppressed by adopting the lead frame LF2 in which adjoining heat sinks HS are tied together through the tying portions CON in the manufacture of the package PK2. When the lead frame LF2 is used to manufacture the package PK2, the tying portions CON are cut after resin sealing; therefore, the package PK2 is so structured that the cutting portions CT2 are formed at the side of the heat sink HS protruded from the sealing body MR as illustrated in FIG. 6.

Because of the foregoing, resin burr is formed in the package PK1 illustrated in FIG. 3 arising from the following: the heat sinks HS formed in the lead frame LF1 are not joined with one another. (Refer to FIG. 4.) In the package PK2 illustrated in FIG. 6, consequently, the formation of resin burr is suppressed by taking the following measure: the heat sinks HS formed in the lead frame LF2 are tied together through the tying portions CON and the tying portions CON are thereby caused to function as a stopper against resin leakage. In the package PK2, therefore, the formation of resin burr that poses a problem in the structure of the package PK1 can be suppressed.

In the structure of the package PK2, however, a new problem that does not manifest itself in the structure of the package PK1 arises. The new problem is cracking in the sealing body MR. That is, in the structure of the package PK2, the formation of resin burr can be suppressed but cracking in the sealing body MR manifests itself as a new problem. Description will be given to a reason why cracking in the sealing body MR, which does not manifest itself in the structure of the package PK1, manifests itself in the structure of the package PK2.

Figure 8:
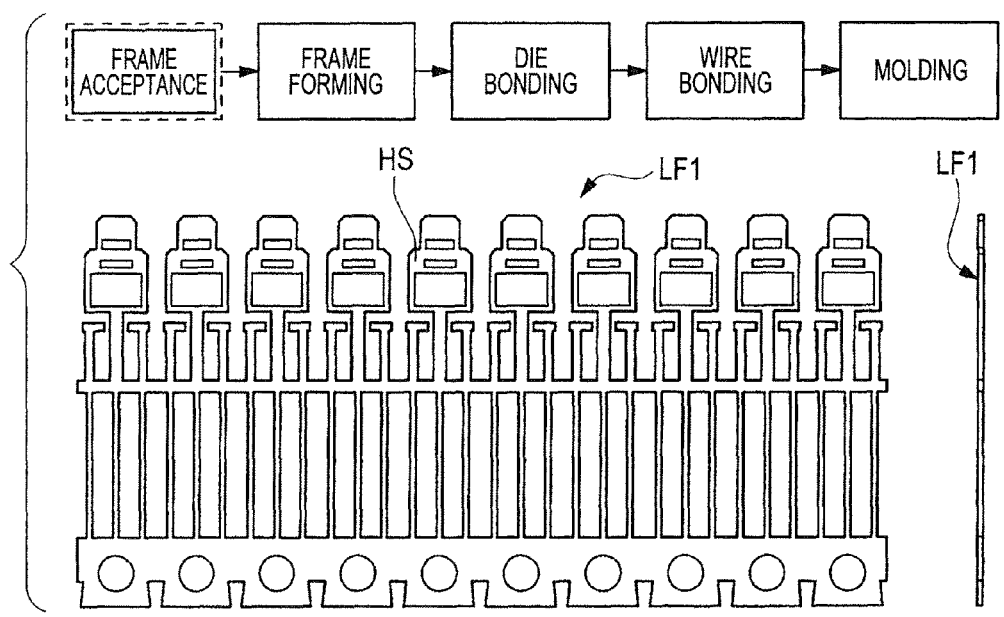
FIG. 8 is a drawing illustrating a lead frame as is purchased.
Figure 9:
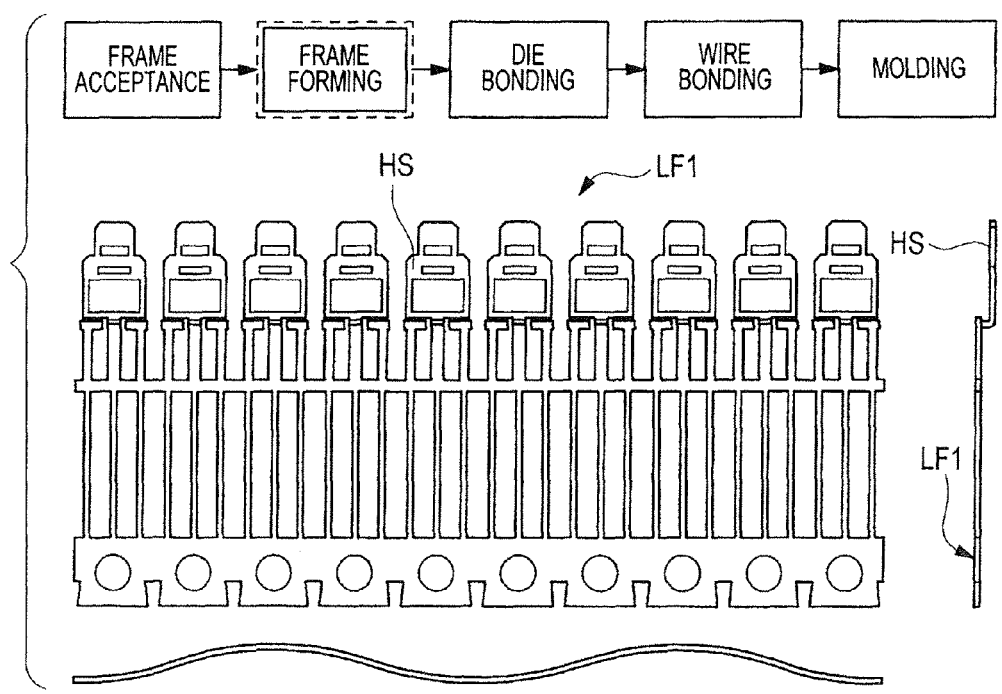
FIG. 9 is a drawing illustrating a lead frame that underwent forming.

As shown at the upper part of FIG. 8, a package product takes the following flow. A lead frame is accepted and this lead frame is subjected to forming processing. Thereafter, semiconductor chips are placed over the lead frame (die bonding) and the placed semiconductor chips and the leads (outer leads) making up the lead frame are joined together through wires (wire bonding). Then the semiconductor chips are sealed (molded) with resin and the package product is thereby finished. In FIG. 8, attention is paid to the lead frame LF1 for manufacturing the package PK1. FIG. 8 illustrates the lead frame LF1 as is purchased. As illustrated in FIG. 8, the lead frame LF1 is accepted as is in a flattened state (straight state) with transportation after purchase taken into account. That is, the lead frame LF1 is accepted as is in the straight state in consideration of the suppression of bulkiness in packing, the prevention of bending of the frame, and the like. As illustrated in FIG. 9, thereafter, the lead frame LF1 accepted as is in the straight state is formed. FIG. 9 illustrates the lead frame LF1 as is formed. As illustrated in FIG. 9, forming of the lead frame LF1 is specifically carried out by bending each heat sink HS by press so that the heat sink HS is positioned lower than the leads.

At this time, forming of the lead frame LF1 by press is not carried out on the multiple heat sinks HS formed in the lead frame LF1 in a lump. Instead, press forming is carried out, for example, by two or three adjoining heat sinks HS among the heat sinks HS formed in one lead frame LF1. As illustrated in FIG. 9, therefore, variation is produced in pressure from press to press. As a result, variation is also produced in the forming position of each formed heat sink HS in one lead frame LF1 and winding (camber) occurs throughout the lead frame LF1. Up to this point, description has been given to that camber (winding) occurs in the lead frame LF1 with the lead frame LF1 for manufacturing the package PK1 taken as an example. Camber (winding) similarly occurs also in the lead frame LF2 for manufacturing the package PK2.

Figure 10:
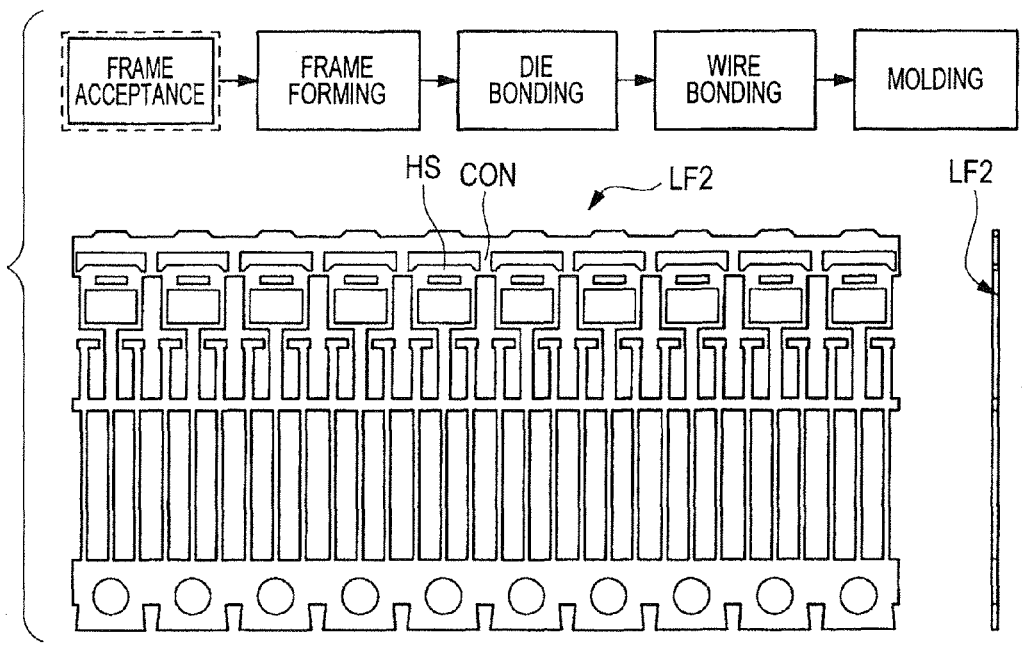
FIG. 10 is a drawing illustrating a lead frame as is purchased.
Figure 11:
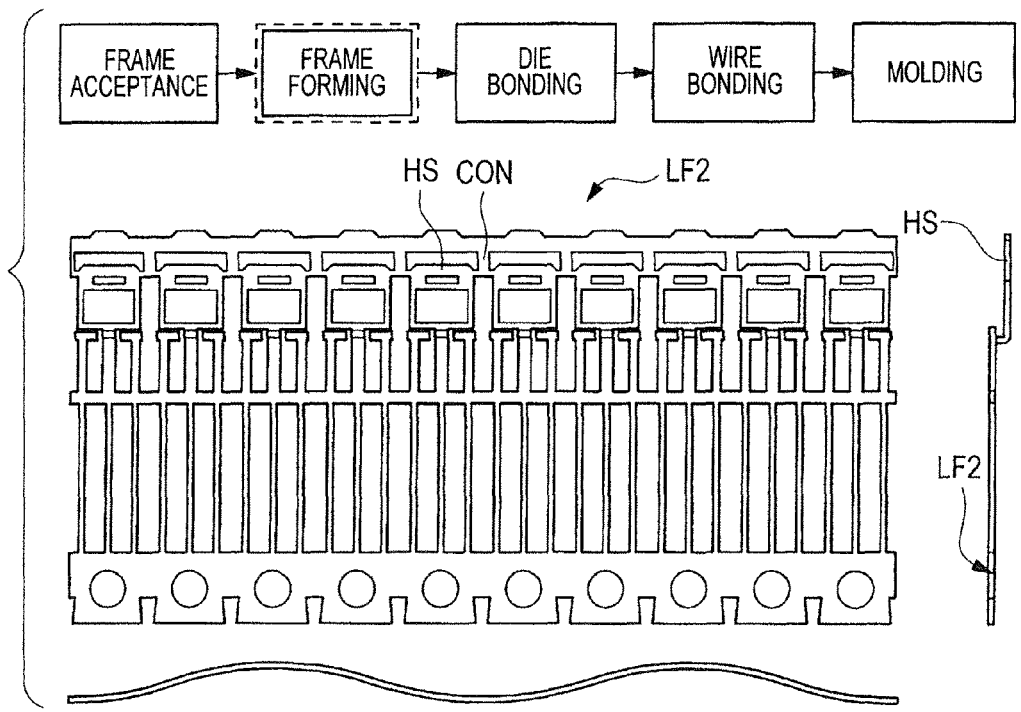
FIG. 11 is a drawing illustrating a lead frame that underwent forming.

More specific description will be given. In FIG. 10, attention is paid to the lead frame LF2 for manufacturing the package PK2. FIG. 10 illustrates the lead frame LF2 as is purchased. As illustrated in FIG. 10, the lead frame LF2 is also accepted as is in a flattened state (straight state) with transportation after purchase taken into account. That is, the lead frame LF2 is accepted as is in the straight state in consideration of the suppression of bulkiness in packing, the prevention of bending of the frame, and the like. As illustrated in FIG. 11, thereafter, the lead frame LF2 accepted as is in the straight state is formed. FIG. 11 illustrates the lead frame LF2 as is formed. As illustrated in FIG. 11, forming of the lead frame LF2 is specifically carried out by bending each heat sink HS by press so that the heat sink HS is positioned lower than the leads.

At this time, forming of the lead frame LF2 by press is not carried on the multiple heat sinks HS formed in one lead frame LF2 in a lump, either. Instead, press forming is carried out, for example, by two or three adjoining heat sinks HS among the heat sinks HS formed in one lead frame LF2. As illustrated in FIG. 11, therefore, variation is produced in pressure from press to press. As a result, variation is also produced in the forming position of each formed heat sink HS in one lead frame LF2 and winding (camber) occurs throughout the lead frame LF2.

It is seen from the foregoing that winding (camber) occurs both in the lead frame LF1 used for manufacturing the package PK1 and in the lead frame LF2 used for manufacturing the package PK2. In the structure of the package PK2, this winding (camber) causes cracking in the sealing body MR. As mentioned above, however, winding (camber) occurs also in the lead frame LF1 used for manufacturing the package PK1 but cracking in the sealing body MR does not manifest itself as a problem in the package PK1. For this reason, it proves problematical why cracking occurs in the sealing body MR only when winding (camber) occurs in the lead frame LF2 used for manufacturing the package PK2. Hereafter, consequently, description will be given to why cracking occurs in the sealing body MR only when winding (camber) occurs in the lead frame LF2 used for manufacturing the package PK2.

FIG. 12 explains the mechanism through which cracking occurs in the sealing body MR only when winding (camber) occurs in the lead frame LF2 used for manufacturing the package PK2. This explanation is given in contract with a case where winding (camber) occurs in the lead frame LF1 used for manufacturing the package PK1. In FIG. 12, the structure "BEFORE COUNTERMEASURE AGAINST RESIN BURR DROP IS TAKEN" corresponds to the structure of the package PK1; and the structure "AFTER COUNTERMEASURE AGAINST RESIN BURR DROP IS TAKEN" corresponds to the structure of the package PK2.

Attention will be paid to the structure of the package PK1, or the structure "BEFORE COUNTERMEASURE AGAINST RESIN BURR DROP IS TAKEN." The state after the sealing body is formed is indicated as the state of frame. The enlarged view of the area encircled in this drawing is depicted as ideal state and actual state. The ideal state shows the ideal state at a resin sealing step and resin sealing is carried out with a die projection PJ1 positioned between adjoining heat sinks HS. In the ideal state, at this time, the size of the gap between the adjoining heat sinks HS is larger than the size of the die projection PJ1; therefore, it is seen that the die projection PJ1 is positioned between the heat sinks HS with a margin provided. In actuality, however, winding (camber) occurs in the formed lead frame LF1 and there is a possibility that the gap between the heat sinks HS is reduced in size by this winding (camber).

In this case, the die projection PJ1 and the heat sinks HS are brought into contact with each other. However, since adjoining heat sinks HS are separated from one another in the lead frame LF1, the following is implemented even when the gap between the heat sink HS is narrowed by winding (camber): when the die projection PJ1 is inserted, there is such a degree of freedom that the heat sinks HS are laterally shifted. In the lead frame LF1 used for manufacturing the package PK1, therefore, the following takes place even when winding (camber) occurs and the gap between the heat sinks HS is narrowed: when the die projection PJ1 is inserted into this gap, the heat sinks HS are laterally shifted. For this reason, unwanted stress is not exerted between the lead frame LF1 and the die projection PJ1. As a result, cracking in the sealing body MR due to unwanted stress exerted between the lead frame LF1 and the die projection PJ1 does not manifest itself as a problem.

Attention will be paid to the structure of the package PK2, or the structure "AFTER COUNTERMEASURE AGAINST RESIN BURR DROP IS TAKEN." The sate after the sealing body is formed is indicated as the state of frame. The enlarged view of the area encircled in this drawing is depicted as ideal state and actual state. The ideal state shows the ideal state at a resin sealing step. The adjoining heat sinks HS are tied together through a tying portion CON and resin sealing is carried out with a die projection PJ2 positioned in the space located below this tying portion CON. In the ideal state, at this time, the size of the space below the tying portion CON is larger than the size of the die projection PJ2; therefore, it is seen that the die projection PJ2 is positioned in the space below the tying portion CON with a margin provided. In actuality, however, winding (camber) occurs in the formed lead frame LF2 and there is a possibility that the space below the tying portion CON is reduced in size by this winding (camber).

In this case, the die projection PJ2 and the tying portion CON are brought into contact with each other. However, since adjoining heat sinks HS are tied together through the tying portions CON in the lead frame LF2, the space below the tying portion CON is narrowed by winding (camber). As a result, when the die projection PJ2 is inserted, the die projection PJ2 and the heat sinks HS tied through the tying portion CON bite each other. When the space below the tying portion CON is narrowed by winding (camber), the following takes place: when the die projection PJ2 is inserted, the heat sinks HS tied together through the tying portion CON cannot be laterally shifted and the die projection PJ2 is forcedly inserted into the space below the tying portion CON. As a result, the die projection PJ2 and the heat sinks HS bite each other. That is, the following takes place in the lead frame LF2 used for manufacturing the package PK2: when winding (camber) occurs and the space below the tying portion CON is narrowed, the die projection PJ2 and the heat sinks HS bite each other. For this reason, when a resin sealing step is terminated and the die projection PJ2 is removed from the lead frame LF2, stress is exerted between the lead frame LF2 and the die projection PJ2. As a result, cracking occurs in the sealing body MR due to stress exerted between the lead frame LF2 and the die projection PJ2. That is, in the lead frame LF2 used for manufacturing the package PK2, the following takes place by tying adjoining heat sinks HS together through the tying portions CON: the formation of resin burr arising from resin leakage can be suppressed but at the same time, the fixture of the heat sinks HS by the tying portions CON heavily contributes to cracking in the sealing body MR.

It is understood from the foregoing that the formation of resin burr RB poses a problem in the structure of the package PK1 and cracking in the sealing body MR poses a problem in the structure of the package PK2. That is, it is impossible to simultaneously suppress resin burr RB and prevent cracking in the sealing body MR in either of the structure of the package PK1 and the structure of the package PK2. Consequently, the technical idea of the invention was applied to the first package product to suppress resin burr RB and prevent cracking in the sealing body MR. Hereafter, description will be given to this technical idea.

<Structure Obtained by Applying the Invention to First Package Product>

Figure 13:
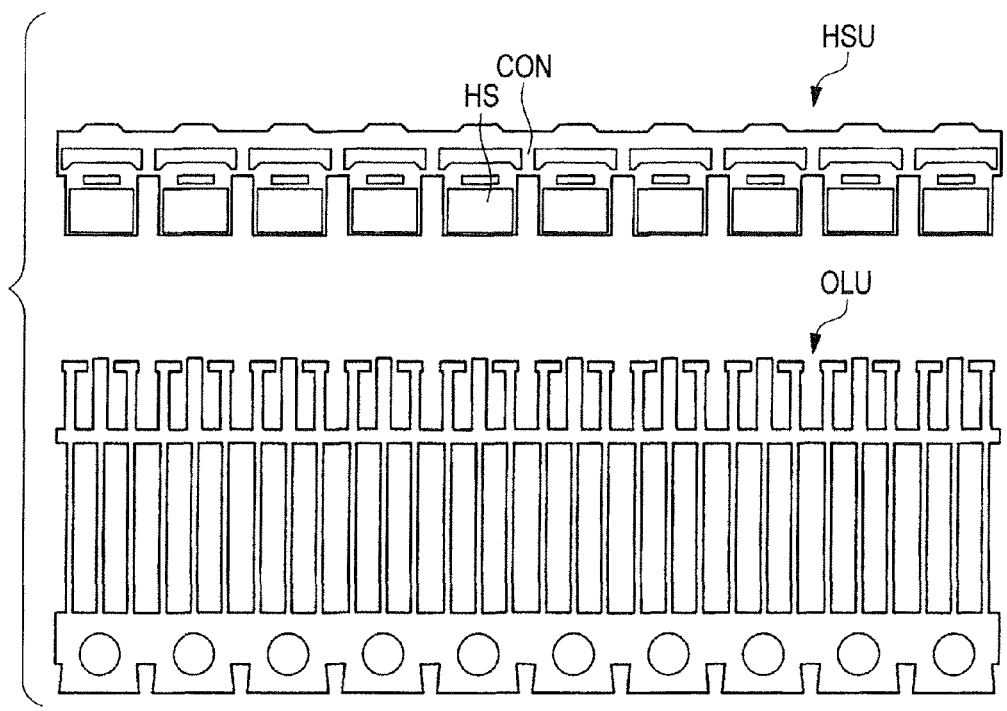
FIG. 13 is a drawing illustrating a lead frame structure in which a heat sink unit with multiple heat sinks tied together through a tying portion and an outer lead unit with outer leads formed therein are separated from each other.

As mentioned above, the following can be implemented by tying adjoining heat sinks HS together through tying portions CON: the formation of resin burr RB can be suppressed because the tying portions CON function as a stopper in resin sealing. Therefore, the structure to which the invention is applied also adopts a configuration in which adjoining heat sinks HS are tied together through tying portions CON. However, when adjoining heat sinks HS are joined together through tying portions CON, cracking is caused in the sealing body MR by winding (camber) in a heat sink HS produced when the lead frame is formed. In the technical idea of the invention, consequently, some contrivance is made to suppress winding (camber) that occurs in heat sinks HS when a lead frame is formed. As illustrated in FIG. 13, this contrivance is that a heat sink unit HSU in which multiple heat sinks HS are joined together through tying portions CON and an outer lead unit OLU in which outer leads are formed are separated from each other. This makes it unnecessary to carry out forming processing so that heat sinks HS are positioned lower than outer leads by pressing the heat sinks HS. That is, the following can be implemented by separating the heat sink unit HSU and the outer lead unit OLU from each other: the heat sink unit HSU can be positioned below the outer lead unit OLU without carrying out forming processing. Since heat sinks HS are not pressed, camber does not occur in the heat sink unit HSU and it is possible to suppress cracking in the sealing body MR arising from winding (camber).

Figure 14:
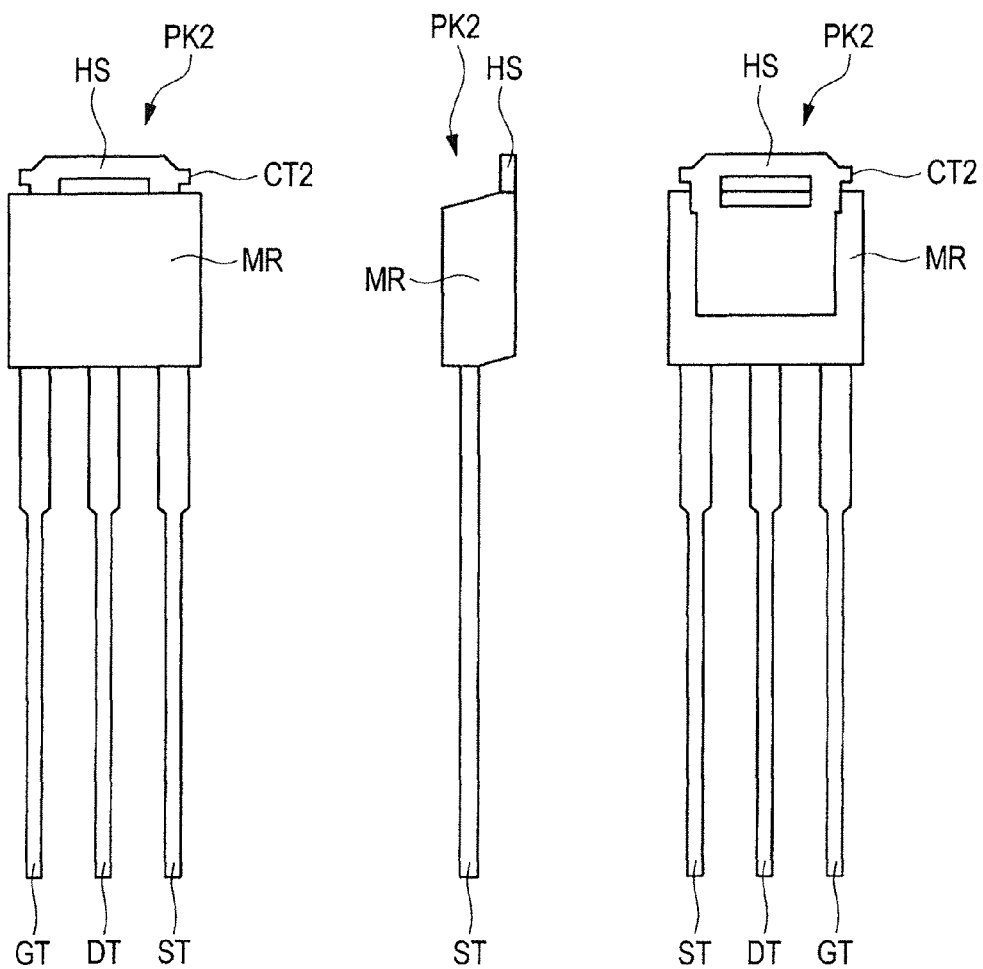
FIG. 14A is a front view of the second package.
FIG. 14B is a side view of the second package.
FIG. 14C is a back view of the second package.

However, a disadvantage is produced just by separating the heat sink unit HSU and the outer lead unit OLU from each other. Hereafter, description will be given to this disadvantage. FIGS. 14A to 14C illustrate the structure of an insertion-type package PK2. FIG. 14A illustrates a front view of the package PK2 and the FIG. 14B illustrates a side view of the package PK2. FIG. 14C illustrates a back view of the package PK2. In the insertion-type package PK2, as illustrated in FIG. 14A to FIG. 14C, a gate terminal GT, a drain terminal DT, and a source terminal ST are protruded downward from the sealing body MR. The drain terminal DT must be electrically coupled with the heat sink HS illustrated in FIG. 14C. A semiconductor chip in which, for example, a power MOSFET is formed is placed over the heat sink HS and the back surface of this semiconductor chip provides a drain electrode. Therefore, the heat sink HS coupled with the back surface of the semiconductor chip is electrically coupled with the drain electrode of the semiconductor chip. Therefore, when the heat sink HS and the drain terminal DT are electrically coupled together, the drain terminal DT is coupled with the drain electrode of the semiconductor chip through the heat sink HS. Thus the heat sink HS and the drain terminal DT must be electrically coupled with each other. In the technical idea of the invention, however, the heat sink unit HSU in which heat sinks HS are formed and the outer lead unit OLU in which drain terminals DT (outer leads) are formed are separated from each other. For this reason, the heat sink HS and the drain terminal DT are separated from each other if nothing is done. As a result, it is impossible to cause the drain terminal DT to effectively function as an external connecting terminal.

Figure 15:
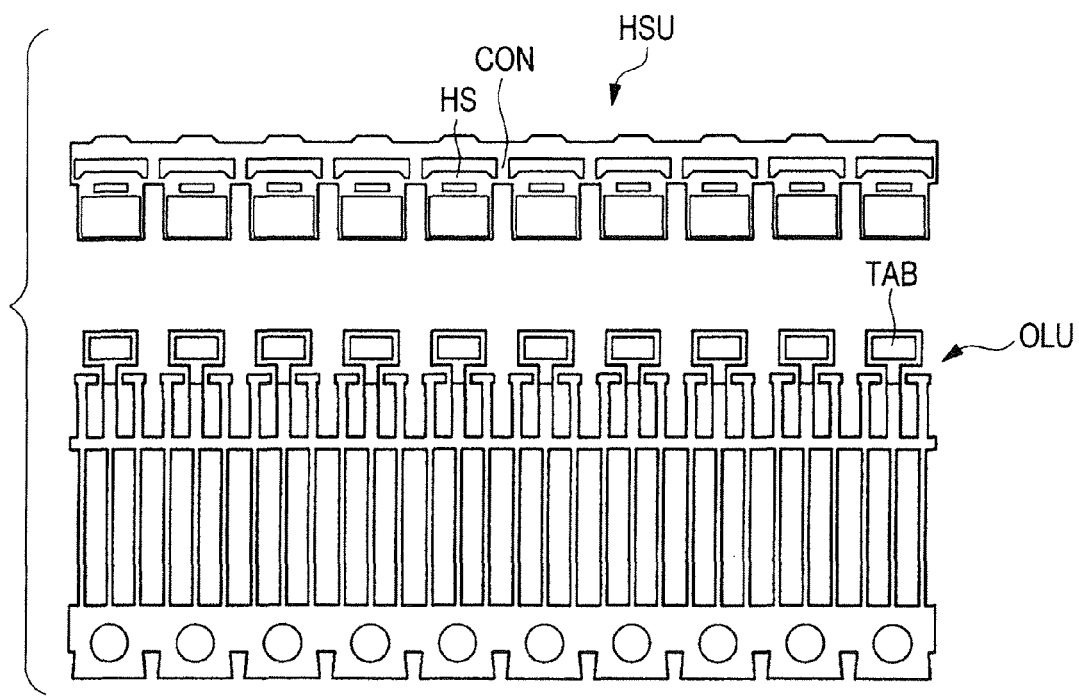
FIG. 15 is a drawing illustrating the configuration of a lead frame in which the technical idea of the invention is realized.
Figure 16:
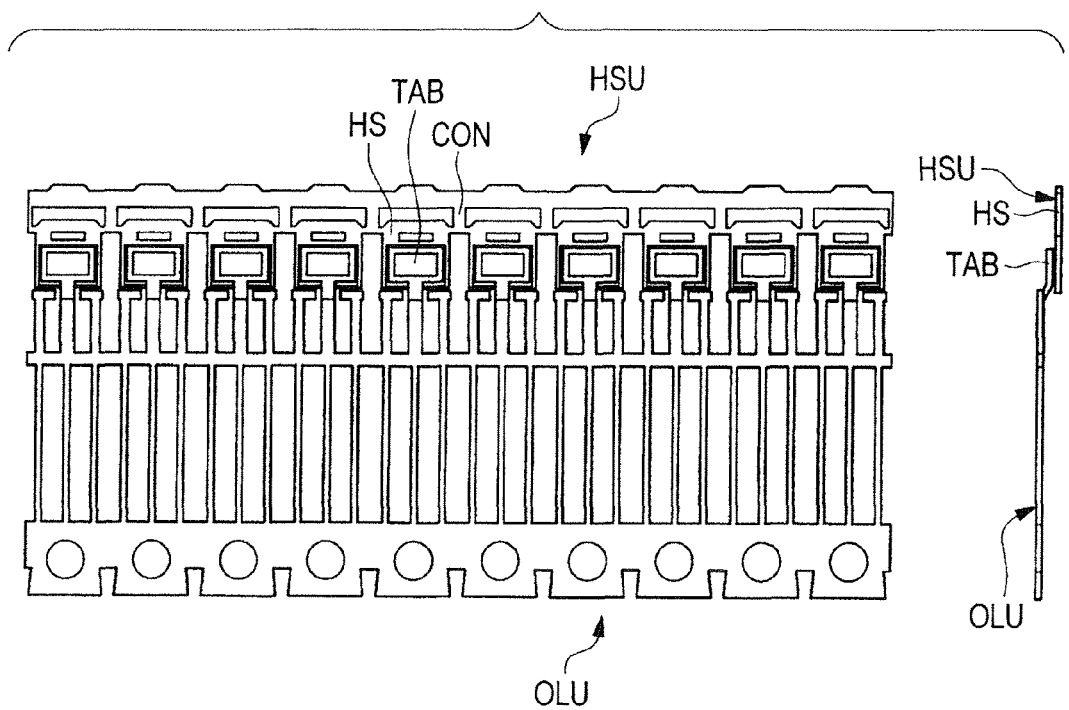
FIG. 16 is a drawing how separated heat sink unit and outer lead unit are spliced together.

In the technical idea of the invention, consequently, another contrivance is made. FIG. 15 illustrates the configuration of a lead frame in which the technical idea of the invention is realized. In the technical idea of the invention, as illustrated in FIG. 15, the heat sink unit HSU and the outer lead unit OLU are separated from each other; and further chip placement portions TAB are provided in the outer lead unit OLU. These chip placement portions TAB are electrically coupled with outer leads (drain terminals) formed in the outer lead unit OLU. Therefore, when a semiconductor chip in which, for example, a power MOSFET is formed is placed over a chip placement portion TAB, the drain electrode formed in the back surface of the semiconductor chip and the chip placement portion TAB are electrically coupled with each other. In addition, since the chip placement portion TAB is coupled with outer leads (drain terminal), the drain electrode formed in the back surface of the semiconductor chip is electrically coupled with an outer lead (drain terminal) through the chip placement portion TAB as a result. Therefore, the drain region of the semiconductor chip and the outer lead (drain terminal) can be electrically coupled with each other even though the heat sink unit HSU and the outer lead unit OLU are separated from each other. As illustrated in FIG. 16, the heat sink unit HSU separated from the outer lead unit OLU is placed below the chip placement portions TAB; and the back surface of each the chip placement portion TAB and the front surface of the heat sink unit HSU are coupled with each other. As mentioned above, features of the technical idea of the invention are as follows: the heat sink unit HSU and the outer lead unit OLU are separated from each other; chip placement portions TAB are provided in the outer lead unit OLU; and each chip placement portion TAB and each heat sink HS are coupled with each other. The following is a concrete description of the features of the technical idea of the invention.

(1) As illustrated in FIG. 15, a first feature of the technical idea of the invention is that the heat sink unit HSU in which multiple heat sinks HS are formed is so configured that the following is implemented: adjoining heat sinks HS are joined with one another through tying portions CON. As a result, the tying portions CON function as a stopper for preventing resin leakage when the sealing body is formed at a resin sealing step and thus resin burr can be prevented from being formed in package products. This makes it possible to prevent package products from being shipped with resin burr formed thereon. For this reason, it is possible to suppress the following from taking place at the destination of shipment: resin burr drops from a package product and the dropped resin burr sticks to a terminal over a mounting substrate. Therefore, it is possible to effectively prevent the following, for example, when a terminal of a mounting substrate and a lead of a package (semiconductor device) are electrically coupled with each other: resin burr as a resin insulator sticking to the terminal of the mounting substrate interferes with electrical coupling between the terminal over the mounting substrate and the lead of the package.

(2) As illustrated in FIG. 15, a second feature of the technical idea of the invention is that the following are separated from each other: the heat sink unit HSU in which multiple heat sinks HS are formed and the outer lead unit OLU in which outer leads are formed. This makes it unnecessary to carry out forming processing so that heat sinks HS are positioned below outer leads by pressing the heat sinks HS. That is, it is possible to place the heat sink unit HSU below the outer lead unit OLU without forming processing by separating the heat sink unit HSU and the outer lead unit OLU from each other. As a result, since heat sinks HS are not pressed, camber does not occur in the heat sink unit HSU and it is possible to suppress cracking in the sealing body MR arising from winding (camber).

(3) As illustrated in FIG. 16, a third feature of the technical idea of the invention is that: chip placement portions TAB are provided in the outer lead unit OLU and these chip placement portions TAB and outer leads (drain terminals) formed in the outer lead unit OLU are electrically coupled with each other. Thus, when a semiconductor chip in which, for example, a power MOSFET is formed is placed over a chip placement portion TAB, the drain electrode formed in the back surface of the semiconductor chip and the chip placement portion TAB are electrically coupled with each other. Further, since the chip placement portion TAB is coupled with an outer lead (drain terminal), the drain electrode formed in the back surface of the semiconductor chip is electrically coupled with the outer lead (drain terminal) through the chip placement portion TAB. That is, it is possible to electrically couple the drain region of the semiconductor chip and the outer lead (drain terminal) with each other even though the heat sink unit HSU and the outer lead unit OLU are separated from each other.

(4) As illustrated in FIG. 16, a fourth feature of the technical idea of the invention is that: the heat sink unit HSU separated from the outer lead unit OLU is placed below each chip placement portion TAB; and the back surface of the chip placement portion TAB and the front surface of the heat sink unit HSU are coupled with each other. This makes it possible to effectively dissipate heat produced in the semiconductor chip placed over each chip placement portion TAB through the chip placement portion TAB and a heat sink HS coupled together.

Description will be given to the configuration of a package PK3 manufactured by applying the technical idea of the invention. FIGS. 17A and 17B illustrate the structure of the package PK3. FIG. 17A is a plan view illustrating the internal structure of the package PK3 and FIG. 17B is a sectional view illustrating the internal structure of the package PK3. The package PK3 is so structured that it is covered with a rectangular sealing body MR and FIG. 17A shows the internal structure of the package PK3 as is seen through this sealing body MR. As illustrated in FIG. 17A, the package PK3 has a heat sink HS and part of the heat sink HS is exposed from the upper part of the sealing body MR. Cutting portions CT2 are formed at the side of the heat sink HS exposed from the upper part of the sealing body MR by cutting tying portions. A chip placement portion TAB is formed over the heat sink HS and the chip placement portion TAB is formed integrally with a drain terminal DT. Therefore, the chip placement portion TAB and the drain terminal DT are electrically coupled with each other.

A semiconductor chip CHP is placed over the chip placement portion TAB with solder PST2 in between. For example, a power MOSFET is formed in this semiconductor chip CHP. Specifically, the semiconductor chip CHP in which the power MOSFET is formed has, for example, a source pad SP and a gate pad GP formed in the front surface of the semiconductor chip CHP. The gate pad GP is electrically coupled with a gate terminal (outer lead) GT through a wire W1 and the source pad SP is electrically coupled with a source terminal (outer lead) ST through a wire W2. A drain electrode (not shown) is formed in the back surface of the semiconductor chip CHP and the drain electrode is electrically coupled with the drain terminal (outer lead) through the chip placement portion TAB.

Description will be given to the cross section structure of the package PK3 with reference to FIG. 17B. As illustrated in FIG. 17B, the heat sink HS is formed so that it is exposed from the bottom surface of the sealing body MR and the chip placement portion TAB is placed over the heat sink HS with solder PST1 in between. The semiconductor chip CHP is placed over the chip placement portion TAB with solder PST2 in between. The source pad (not shown in FIG. 17B) formed in the front surface of the semiconductor chip CHP and the source terminal ST are coupled together through the wire W2. The position of the chip placement portion TAB is lower than the position of the source terminal ST and the heat sink HS is placed at the lower part of the chip placement portion TAB.

The following is a summary of the above configuration of the package PK3. The package PK3 in this embodiment includes: (a) the heat sink HS having a first front surface and a first back surface located on the opposite side to the first front surface; and (b) a lead portion having multiple leads (gate terminal GT, source terminal ST, drain terminal DT) and the chip placement portion TAB having a second front surface and a second back surface located on the opposite side to the second front surface. The package PK3 further includes: (c) the semiconductor chip CHP placed over the second front surface of the chip placement portion TAB; and (d) the sealing body MR that seals part of the heat sink HS, part of the lead portion, and the semiconductor chip CHP. The semiconductor chip CHP and the leads (gate terminal GT, source terminal ST, drain terminal DT) making up the lead portion are electrically coupled with each other. In the sealing body MR, the first front surface of the heat sink HS and the second back surface of the chip placement portion TAB are so arranged that they are opposed to each other. The first front surface of the heat sink HS and the second back surface of the chip placement portion TAB are electrically coupled with each other.

The above-mentioned semiconductor chip CHP is a chip including a power transistor (power MOSFET). The semiconductor chip CHP includes the source pad SP and the gate pad GP in the chip front surface and the drain electrode in the chip back surface located on the opposite side to the chip front surface. Meanwhile, the lead portion includes a source lead (source terminal ST), a gate lead (gate terminal GT), and a drain lead (drain terminal DT). The chip placement portion TAB and the drain lead (drain terminal DT) are joined with each other. The second front surface of the chip placement portion TAB and the drain electrode formed in the chip back surface of the semiconductor chip CHP are electrically coupled with each other through a first conductive member (solder PST1). The source pad SP and the source lead (source terminal ST) are electrically coupled with each other through a second conductive member (wire W2); and the gate pad GP and the gate lead (gate terminal GT) are electrically coupled with each other through a third conductive member (wire W1).

In the thus configured package PK3, the heat sink HS and the chip placement portion TAB are separated from each other as illustrated in FIG. 17B. This makes it easier, for example, to set the thickness of the chip placement portion TAB and the thickness of the heat sink HS to arbitrary values. When the drain terminal (outer lead) DT and the heat sink HS are integrally formed, for example, it is difficult to make the thickness of the drain terminal DT and the thickness of the heat sink HS different from each other. Meanwhile, when a package is so configured that the heat sink HS and the chip placement portion TAB are separated from each other like the package PK3, it is possible to separately set the thickness of the chip placement portion TAB ad the thickness of the heat sink HS with ease. For example, to enhance the heat radiation efficiency of the heat sink HS, the thickness of the heat sink HS is made larger than the thickness of the chip placement portion TAB. Meanwhile, to further reduce the thickness of the package PK3, the thickness of the heat sink HS is made smaller than the thickness of the chip placement portion TAB. Needless to add, it is also possible to make the thickness of the heat sink HS and the thickness of the chip placement portion TAB equal to each other. In the package PK3 in this embodiment, as mentioned above, the heat sink HS and the chip placement portion TAB are separated from each other; therefore, it is possible to enhance the degree of freedom in designing the heat sink HS and the chip placement portion TAB.

In the package PK3 in this embodiment, there are multiple wires W2 joining the source pad SP and the source terminal ST together as illustrated in FIG. 17A. Meanwhile, the gate pad GP and the gate terminal GT are joined together through one wire W1. The reason for this is as described below. Through the wire W1 joining the gate pad GP and the gate terminal GT together, control signals applied to the gate electrode of the power MOSFET formed in the semiconductor chip CHP are transmitted. Meanwhile, through the wires W2 joining the source pad SP and the source terminal ST together, a large load current is passed. That is, a larger current is passed through the wire W2 than through the wire W1 and it is necessary to reduce the on-resistance; therefore, the source pad SP and the source terminal ST are joined together through multiple wires W2. The wire diameter of the wire W2 is larger than the wire diameter of the wire W1 similarly from the view point of making the on-resistance of the wire W2 smaller than that of the wire W1.

Description will be given to the materials of main constituent elements making up the package PK3 in this embodiment. In the example in FIG. 17A, the gate terminal GT, drain terminal DT, source terminal ST, and chip placement portion TAB are formed of, for example, copper material. The heat sink HS separated from the chip placement portion TAB is also formed of, for example, copper material. The wire W1 and the wire W2 can be formed of, for example, aluminum, gold, copper, or the like and the sealing body MR can be formed of, for example, resin material such as epoxy resin.

Description will be given to the internal structure of the semiconductor chip CHP sealed with the sealing body MR. It will be assumed that in this embodiment, for example, a power MOSFET is formed in the semiconductor chip CHP and description will be given to the device structure of this power MOSFET with reference to drawings.

Transistors for large power capable of handling power of several watts or above are designated as power MOSFET and various structures of power MOSFET have been considered. Among power MOSFETs, there are those designated as so-called vertical type and those designated as so-called horizontal type and their structures are classified into trench gate type, planar gate type, and the like according to the structure of their gate portion. In these power MOSFETs, for example, a structure in which a large number (for example, several tens of thousands) of MOSFETs in micropatterns are coupled in parallel is adopted to obtain large power.

Figure 18:
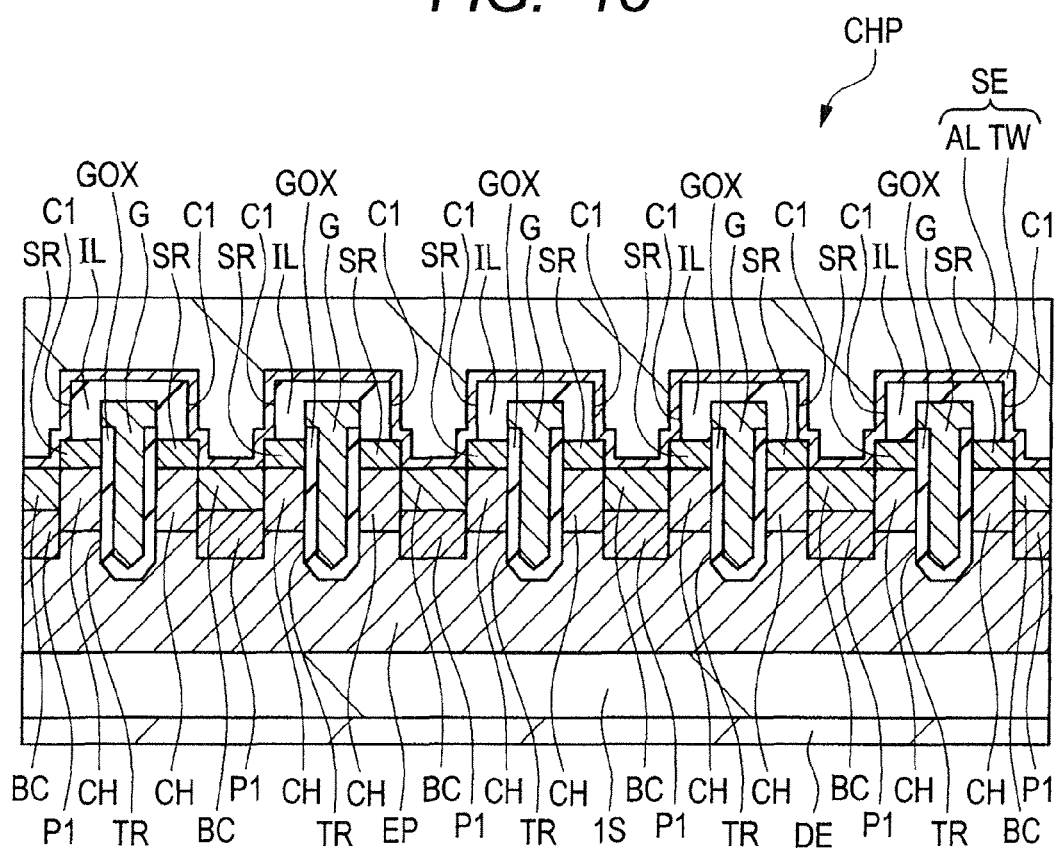
FIG. 18 is a sectional view illustrating the device structure of a power MOSFET.

Description will be given to an example of the configuration of a power MOSFET. FIG. 18 is a sectional view illustrating the device structure of a power MOSFET. As illustrated in FIG. 18, for example, an epitaxial layer EP is formed over a semiconductor substrate 1S implanted with an n-type impurity. This epitaxial layer EP is an n-type semiconductor layer implanted with an n-type impurity. Channel regions CH are formed over the epitaxial layer EP. The channel regions CH are p-type semiconductor regions implanted with a p-type impurity.

Trenches TR are so formed that they penetrate the channel regions CH and are extended to the epitaxial layer EP. A gate insulating film GOX comprised of, for example, a silicon oxide film is formed on the inner wall of each trench TR. Gate electrodes G are so formed as to fill the trenches TR through the gate insulating film GOX. The gate electrodes G are comprised of, for example, a polysilicon film.

A source region SR is formed in an area adjacent to each trench TR over the channel regions CH and an interlayer insulating film IL is so formed as to cover each source region SR and each trench TR from above. The gate electrodes G are so configured that they are protruded from the trenches TR and the interlayer insulating films IL are so formed as to cover also these gate electrodes G.

A contact hole C1 is formed in each interlayer insulating film IL and these contact holes C1 are so formed that they penetrate the interlayer insulating film IL and the source region SR. Owing to the contact holes C1, each source region SR is formed in the area between a contact hole C1 and a trench TR so that it adjoins to the contact hole C1 and the trench TR.

A body contact region BC is formed below each contact hole C1. That is, each body contact region BC is formed below the bottom portion of each contact hole C1 in contact with this bottom portion. Each body contact region BC is comprised of a p-type semiconductor region implanted with a p-type impurity; and its impurity concentration of the p-type impurity is higher than each channel region CH similarly comprised of a p-type semiconductor region. The body contact regions BC have the functions of: ensuring ohmic contact with a source electrode formed by burying a conductive film in each contact hole C1; and suppressing a parasitic bipolar transistor in the power MOSFET from performing on-operation. More specific description will be given. In trench gate-type power MOSFETs, an npn parasitic bipolar transistor is formed of: a source region SR (to be an emitter) as an n-type semiconductor region; a channel region CH (to be a base) as a p-type semiconductor region; and an epitaxial layer EP (to be a collector) as an n-type semiconductor region. Therefore, when this npn parasitic bipolar transistor performs on-operation and so large a current that the gate electrode G of the power MOSFET cannot control flows depending on the operating environment. Then the power MOSFET produces heat more than necessary and breakdown results. For this reason, it is necessary to prevent the npn parasitic bipolar transistor from performing on-operation. To make the npn parasitic bipolar transistor less prone to perform on-operation, it is necessary to reduce the base resistance. Because of the foregoing, the body contact regions BC higher in concentration than the channel regions CH are formed to reduce the base resistance.

A first semiconductor region P1 is formed below each body contact region BC. The first semiconductor regions P1 are comprised of a p-type semiconductor region. They are implanted with a p-type impurity with an impurity concentration lower than the impurity concentration of each body contact region BC but higher than the impurity concentration of each channel region CH. The first semiconductor regions P1 are formed to an area deeper than the boundary between each channel region CH and the epitaxial layer EP.

This makes it possible to relax field concentration at a p-n junction formed at the boundary between each channel region CH and the epitaxial layer EP and to increase the avalanche breakdown voltage of the power MOSFET. In other words, the breakdown voltage of the power MOSFET can be enhanced. The breakdown voltage (BVdss) of the power MOSFET cited here is determined by a voltage at which avalanche breakdown occurs when the voltage is applied to the drain region with the gate electrode G and the source region SR grounded. According to the foregoing, the first semiconductor region P1 formed below each body contact region BC has a function of enhancing the breakdown voltage of the power MOSFET.

A titanium-tungsten film TW is formed over each interlayer insulating film IL including a contact hole C1 and an aluminum film AL is formed over these titanium-tungsten films TW. A source electrode SE is formed of each titanium-tungsten film TW and the aluminum film AL. That is, each source electrode SE is buried in a contact hole C1 and is electrically coupled with a source region SR and a body contact region BC. Meanwhile, a drain electrode DE formed of, for example, a gold film is formed in the back surface of the semiconductor substrate 1S.

The power MOSFET illustrated in FIG. 18 is configured as mentioned above and hereafter, brief description will be given to its operation. For example, a potential difference is provided between a source electrode SE and the drain electrode DE and a voltage equal to or higher than a threshold value is applied to a gate electrode G. Then an inversion layer is formed in the channel region CH in contact with the side face of the trench TR with the gate electrode G buried therein. That is, the inversion layer as an n-type semiconductor region is formed in an area in contact with the trench TR in the channel region CH as a p-type semiconductor region. Thus the source region SR as an n-type semiconductor region and the epitaxial layer EP as an n-type semiconductor layer are electrically coupled with each other through the inversion layer. Therefore, since a potential difference is provided between the source electrode SE and the drain electrode DE, a current flows between the source electrode SE and the drain electrode DE.

The thus configured power MOSFET is formed in the semiconductor chip CHP illustrated in FIG. 17A and FIG. 17B. The source pad SP and the gate pad GP are formed in the front surface of the semiconductor chip CHP illustrated in FIG. 17A and this source pad SP is obtained by exposing part of a source electrode SE of the power MOSFET illustrated in FIG. 18. Meanwhile, the gate pad GP is a pad led out by electrically coupling the multiple gate electrodes G illustrated in FIG. 18. Meanwhile, it is apparent from FIG. 18 that the drain electrode DE is formed in the back surface of the semiconductor substrate 1S (semiconductor chip in FIG. 17A).

Figure 19:
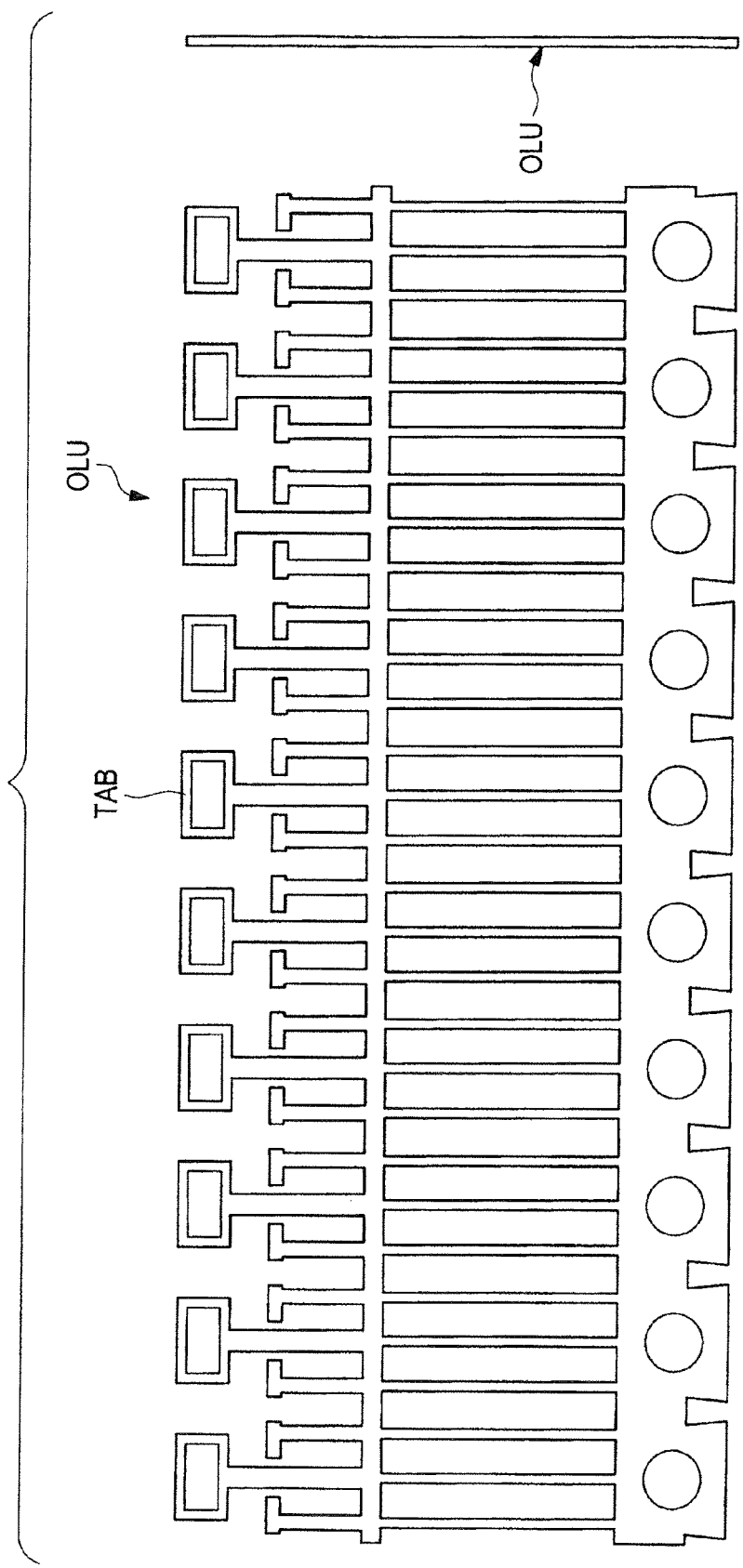
FIG. 19 is a drawing illustrating a manufacturing process of a semiconductor device in an embodiment.

The package PK3 (semiconductor device) in this embodiment is configured as mentioned above and hereafter, description will be given to an example of a manufacturing method thereof with reference to drawings. As illustrated in FIG. 19, first, an outer lead unit (second frame) OLU in which multiple lead portions each having multiple outer leads and a chip placement portion TAB are tied together is prepared. At this stage, the outer lead unit OLU is accepted as is flattened (straight state) with transportation after purchase taken into account. That is, the outer lead unit OLU is prepared as is in the straight state in consideration of the suppression of bulkiness in packing, the prevention of bending of the frame, and the like.

Figure 20:
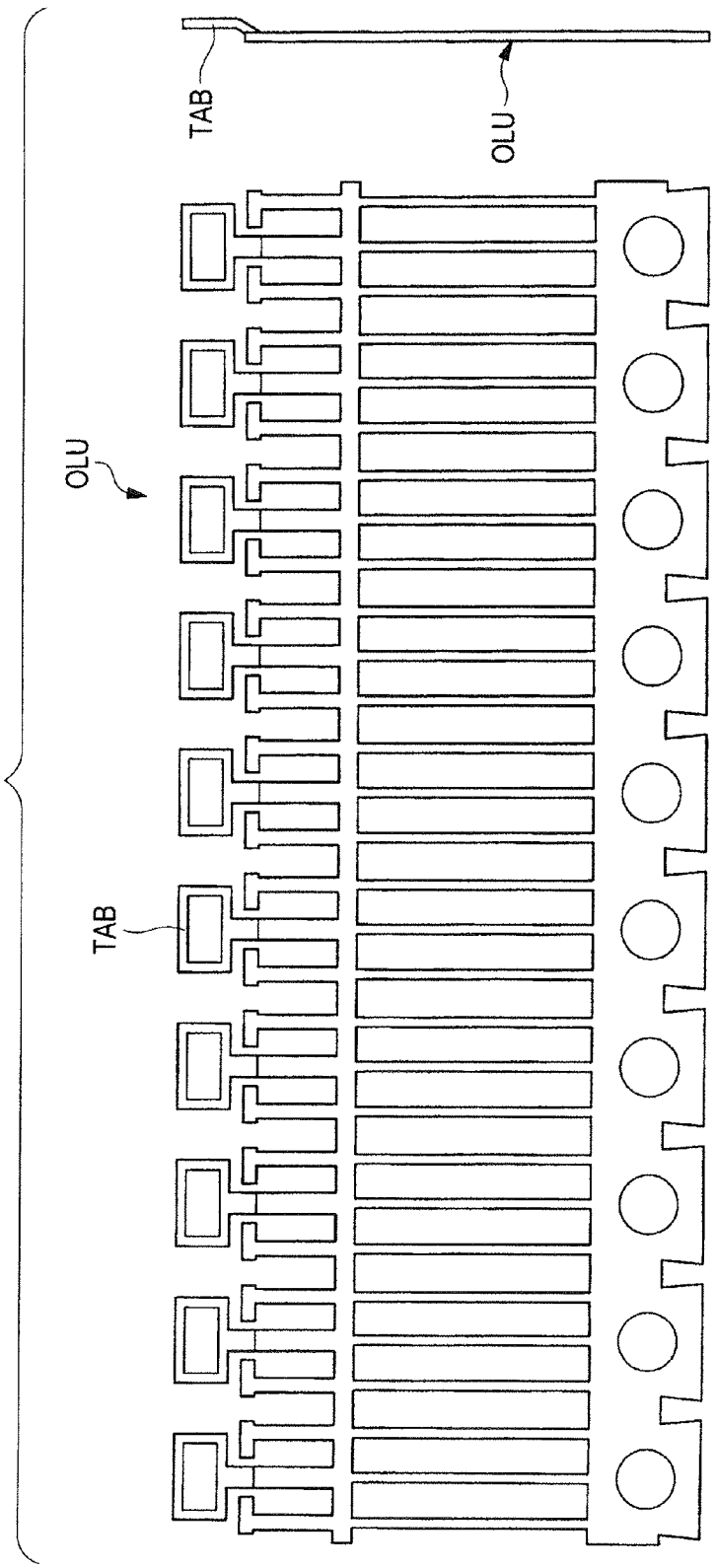
FIG. 20 is a drawing illustrating the manufacturing process of the semiconductor device, following FIG. 19.

As illustrated in FIG. 20, subsequently, the outer lead unit OLU is formed so that the front surface of each chip placement portion TAB is positioned lower than the surfaces of the multiple outer leads. This forming step for the outer lead unit OLU is carried out by bending the chip placement portions TAB by press. At this time, it is difficult to prepare a large press machine in terms of cost and processing and the outer lead unit OLU is formed by press using a small-sized press machine. For this reason, the forming of the outer lead unit OLU by press is not carried out on the multiple chip placement portions TAB formed in one outer lead unit OLU in a lump. Instead, press forming is carried out, for example, by two or three adjoining chip placement portions TAB among the chip placement portions TAB formed in one outer lead unit OLU. Therefore, variation is produced in pressure from press to press and thus there is a possibility that variation is also produced in the forming position of each formed chip placement portion TAB in one outer lead unit OLU. In this embodiment, however, the heat sinks themselves that fix die projections at a resin sealing step are not formed by press; therefore, cracking in the sealing body MR arising from winding (camber) in heat sinks can be suppressed. That is, even if winding (camber) occurs in a chip placement portion TAB, cracking in the sealing body MR does not occurs because the chip placement portion TAB itself is not used to fix a die projection at the resin sealing step.

Figure 21:
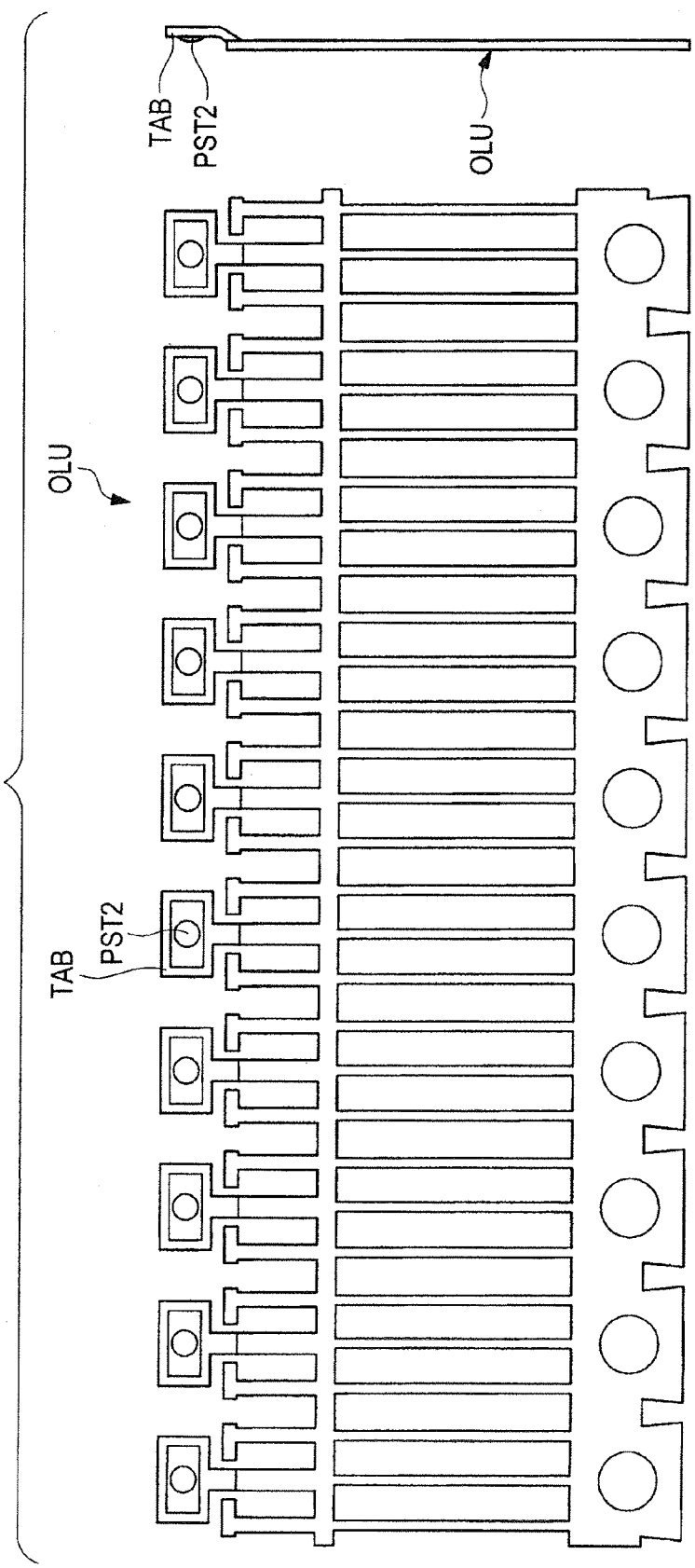
FIG. 21 is a drawing illustrating the manufacturing process of the semiconductor device, following FIG. 20.
Figure 22:
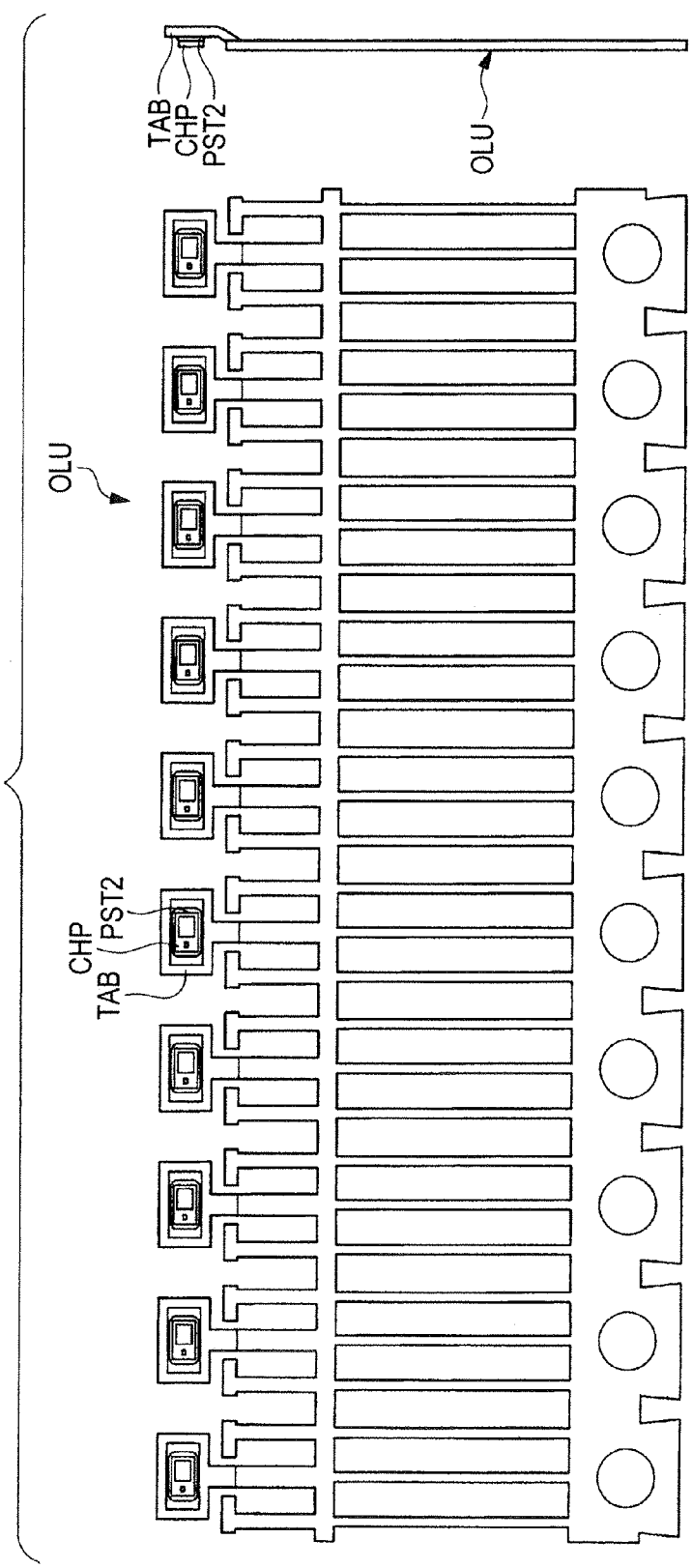
FIG. 22 is a drawing illustrating the manufacturing process of the semiconductor device, following FIG. 21.

As illustrated in FIG. 21, subsequently, solder PST2 is applied to each chip placement portion TAB. Then a semiconductor chip CHP is placed over the chip placement portion TAB with solder PST2 applied thereto as illustrated in FIG. 22 (die bonding) and heating processing is carried out. As the result of this step, the drain electrode formed in the back surface of each semiconductor chip CHP and each chip placement portion TAB are electrically coupled with each other.

The back surface of each semiconductor chip CHP is metalized like, for example, Ti/Ni/Au, Ti/Ni/Ag, Ni/Ti/Ni/Au, or the like outward from the chip side. The solder PST2 and Ni under Au form an alloy and the drain electrode formed in the back surface of each semiconductor chip CHP and each chip placement portion TAB are thereby electrically coupled with each other.

Figure 23:
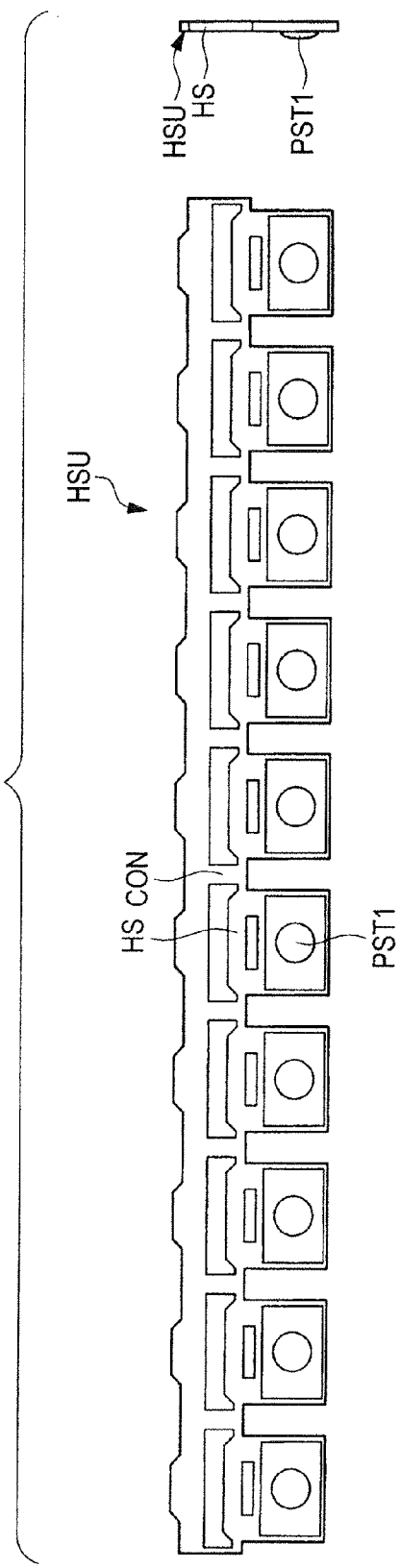
FIG. 23 is a drawing illustrating the manufacturing process of the semiconductor device, following FIG. 22.

As illustrated in FIG. 23, subsequently, a heat sink unit (first frame) HSU in which multiple heat sinks HS are tied together through tying portions CON is prepared. Solder PST1 is applied to each of the heat sinks HS present in this heat sink unit HSU. The heat sink unit HSU prepared at this time is in a straight state.

Figure 24:
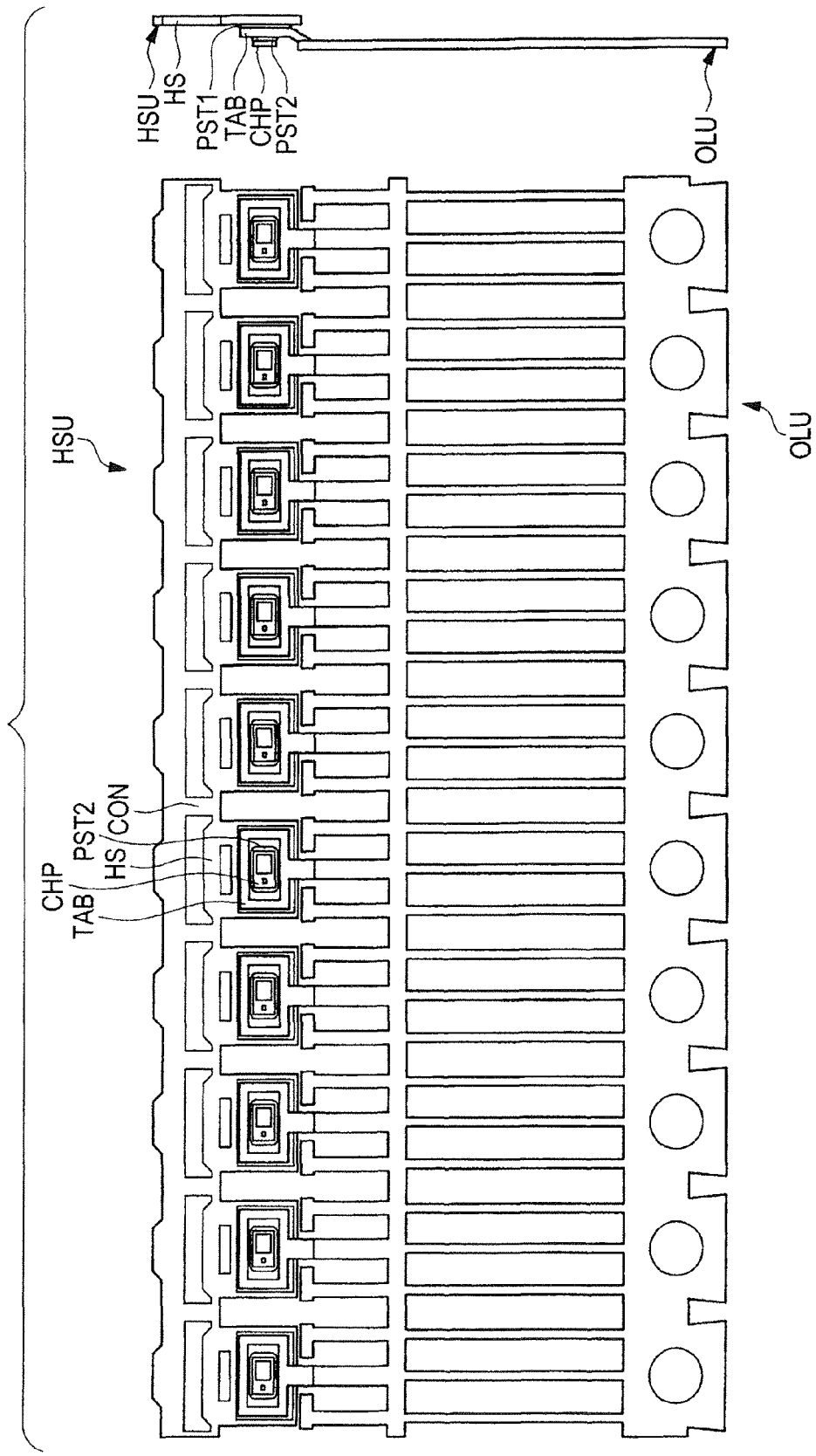
FIG. 24 is a drawing illustrating the manufacturing process of the semiconductor device, following FIG. 23.

As illustrated in FIG. 24, thereafter, the heat sink unit HSU and the outer lead unit OLU are joined with each other. Specifically, the heat sink unit HSU and the outer lead unit OLU are so placed that each chip placement portion TAB present in the outer lead unit OLU is placed over each heat sink HS present in the heat sink unit HSU. Then reflow processing (heating processing) is carried out to melt the solder PST1 and the solder PST2. As a result, each heat sink HS and each chip placement portion TAB are joined together and each chip placement portion TAB and each semiconductor chip CHP are joined together.

The heat sink unit HSU in which multiple heat sinks HS are formed and the outer lead unit OLU in which outer leads are formed are separated from each other. This makes it unnecessary to carry out difficult forming processing to position heat sinks HS below outer leads just by pressing the heat sink HS. That is, the heat sink unit HSU can be placed below the outer lead unit OLU without forming the heat sink unit HSU by preparing the heat sink unit HSU and the outer lead unit OLU as separate components. As a result, the necessity for pressing heat sinks HS is obviated and winding (camber) does not occur in the heat sink unit HSU.

Subsequently, the heat sink unit HSU and outer lead unit OLU joined together are cleaned. This cleaning processing is carried out remove flux contained in the solder PST1 and the solder PST2. To efficiently remove flux, a jet or an ultrasonic wave is frequently used together. In this embodiment, heat sinks HS and chip placement portions TAB are joined together through solder PST1 before the wire bonding step. Therefore, the cleaning step for removing flux contained in the solder PST1 for joining each heat sink HS and each chip placement portion TAB together can be carried out before the wire bonding step. This makes it possible to eliminate damage to wires arising from cleaning processing and enhance the reliability of wire junction.

Figure 25:
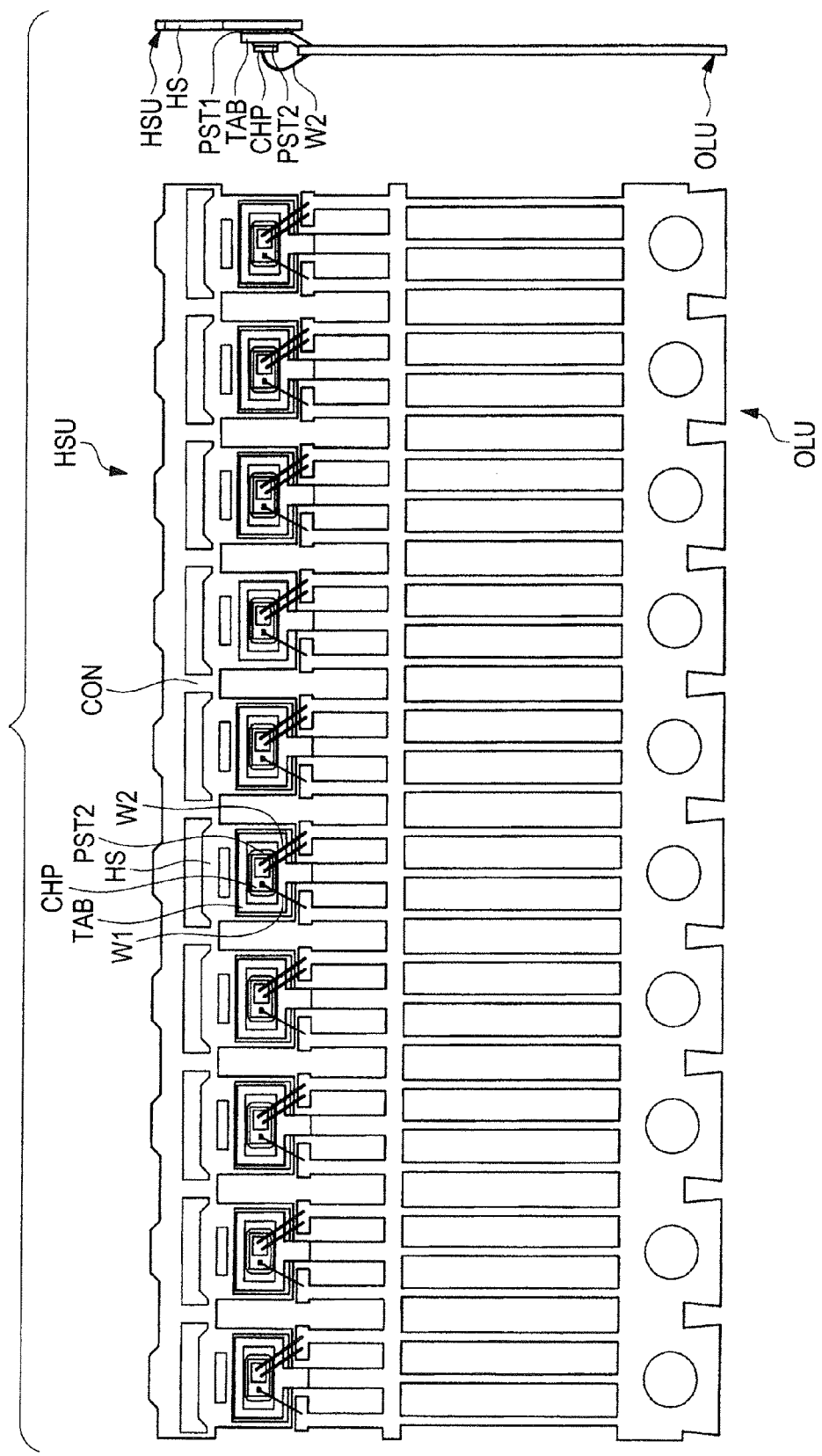
FIG. 25 is a drawing illustrating the manufacturing process of the semiconductor device, following FIG. 24.

As illustrated in FIG. 25, subsequently, the semiconductor chip CHP placed over each chip placement portion TAB and outer leads are joined with each other through wires (wire bonding). Specifically, the gate pad formed in the front surface of each semiconductor chip CHP and a gate terminal (outer lead) are joined together through a wire W1; and the source pad formed in the front surface of each semiconductor chip CHP and a source terminal (outer lead) are joined together through a wire W2. At this time, the wire diameter of the wire W2 is larger than the wire diameter of the wire W1 and the number of wires W1 is one while the number of wires W2 is more than one (two or above).

It is desirable that the wire W2 larger in wire diameter than the wire W1 should be subjected to wire bonding first. The reason for this is as described below. In wire bonding, in general, an ultrasonic wave larger in power is applied to a wire larger in wire diameter than to a wire smaller in the same. Therefore, if a wire smaller in wire diameter is bonded first and then a wire larger in wire diameter is bonded, the ultrasonic wave at that time transmits through the chip; and this increases the possibility that the wire smaller in wire diameter is displaced from a bonding pad.

Figure 26:
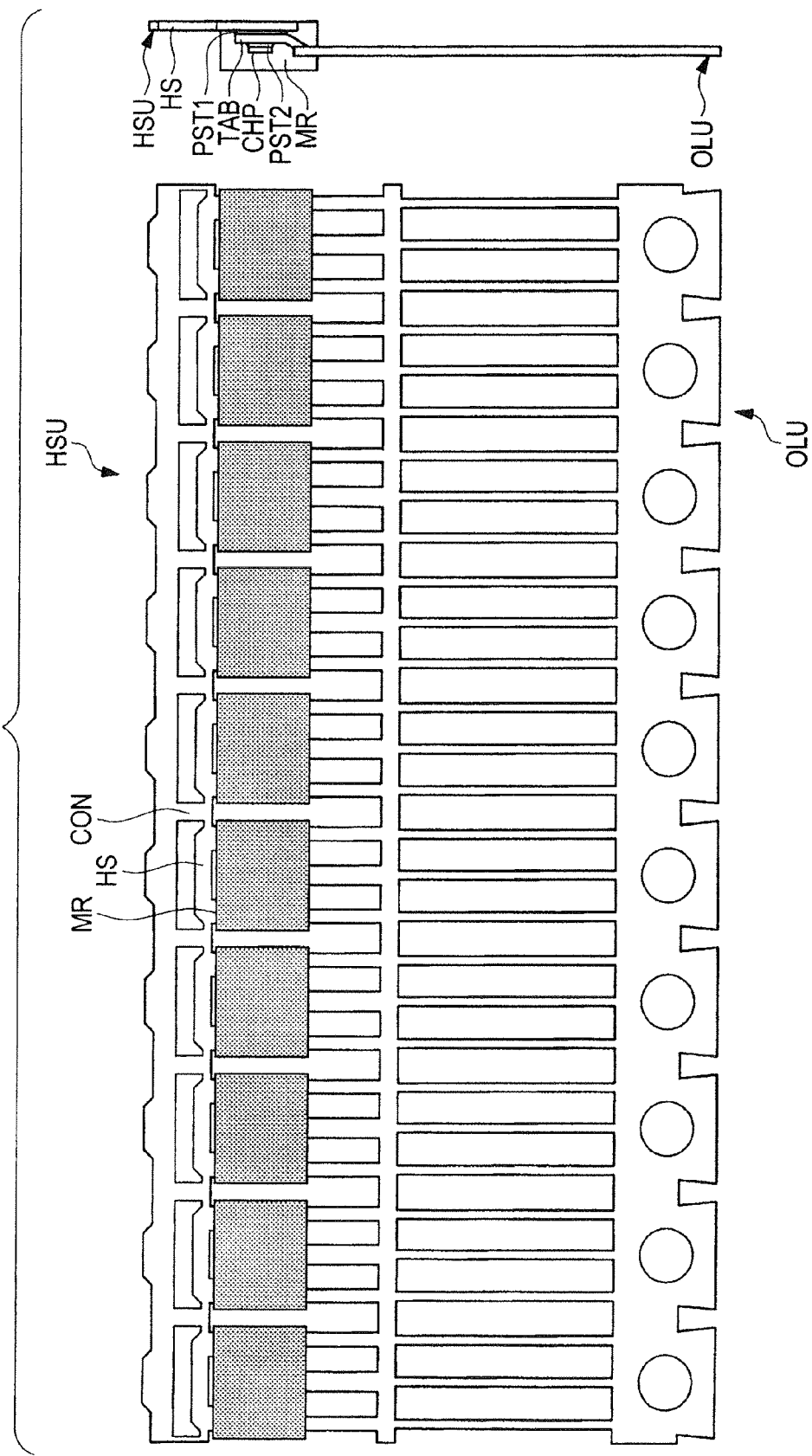
FIG. 26 is a drawing illustrating the manufacturing process of the semiconductor device, following FIG. 25.

As illustrated in FIG. 26, thereafter, part of each heat sink HS, part of each outer lead, each chip placement portion TAB, and each semiconductor chip CHP are sealed with resin to form the sealing body MR (resin sealing step). More specific description will be given. The heat sink unit HSU and outer lead unit OLU joined together are set in molding dies. At this time, the adjoining heat sinks HS are tied together through tying portions CON. Therefore, the heat sink unit HSU and the outer lead unit OLU are fixed with die projections placed in spaces below the tying portions CON.

Thereafter, the interior of the molding dies is filled with resin. In this embodiment, at this time, the tying portions CON tying the adjoining heat sinks HS together function as a resin leakage prevention stopper; therefore, it is possible to prevent resin burr from being formed outside each sealing body MR. As a result, it is possible to prevent package products from being shipped with resin burr formed thereon. This makes it possible to prevent the following from occurring at the destination of shipment: resin burr drops from a package product and the dropped resin burr sticks to a terminal over a mounting substrate. Therefore, the following can be implemented, for example, when a terminal of a mounting substrate and a lead of a package (semiconductor device) are electrically coupled with each other: it is possible to effectively prevent resin burr as a resin insulator sticking to the terminal of the mounting substrate from interfering with electrical coupling between the terminal over the mounting substrate and the lead of the package.

After the sealing bodies MR are subsequently formed, the heat sink unit HSU and outer lead unit OLU with the sealing bodies MR formed thereon are taken out of the molding dies. In this embodiment, heat sinks HS are not pressed; therefore, winding (camber) does not occur in the heat sink unit HSU. For this reason, the die projections do not bite the heat sink unit HSU when the die projections inserted into the spaces below the tying portions CON are removed. Consequently, the heat sink unit HSU and outer lead unit OLU with the sealing bodies MR formed thereon can be taken out of the molding dies without imposing a stress burden on the sealing bodies MR. This makes it possible to prevent cracking in the sealing body MR caused by the phenomenon in which a die projection bites the heat sink unit HSU and unwanted stress is exerted on the sealing body MR.

Then the heat sink unit HSU and the outer lead unit OLU are cut and formed to manufacture individual packages PK3. The package PK3 (semiconductor device) in this embodiment can be manufactured as mentioned above.

Description will be given to an example of another manufacturing method for manufacturing the package PK3 (semiconductor device) in this embodiment with reference to drawings.

Figure 27:
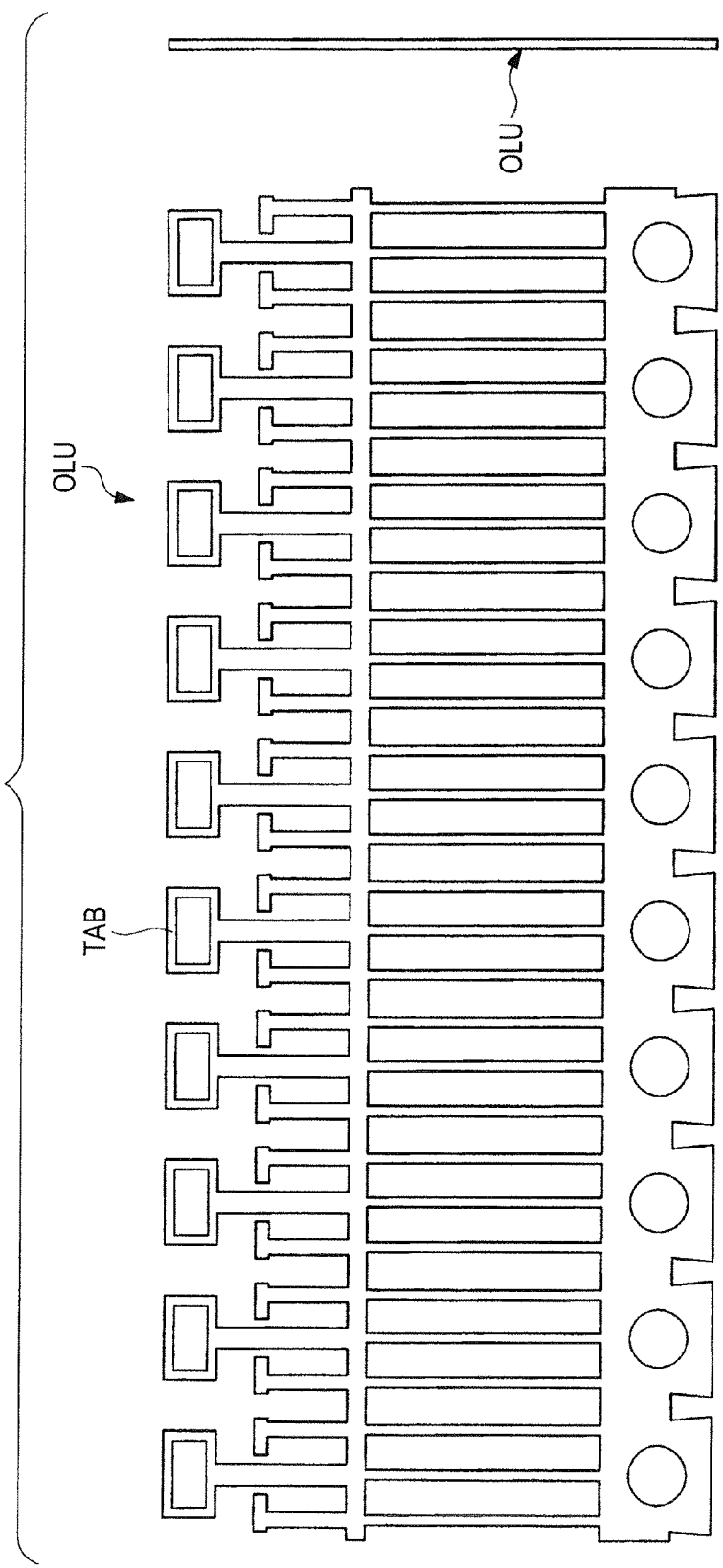
FIG. 27 is a drawing illustrating a manufacturing process of a semiconductor device in an embodiment.

As illustrated in FIG. 27, first, an outer lead unit (second frame) OLU in which multiple lead portions each having multiple outer leads and a chip placement portion TAB are tied together is prepared. At this stage, the outer lead unit OLU is accepted as is flattened (straight state) with transportation after purchase taken into account. That is, the outer lead unit OLU is prepared as is in the straight state in consideration of the suppression of bulkiness in packing, the prevention of bending of the frame, and the like.

Figure 28:
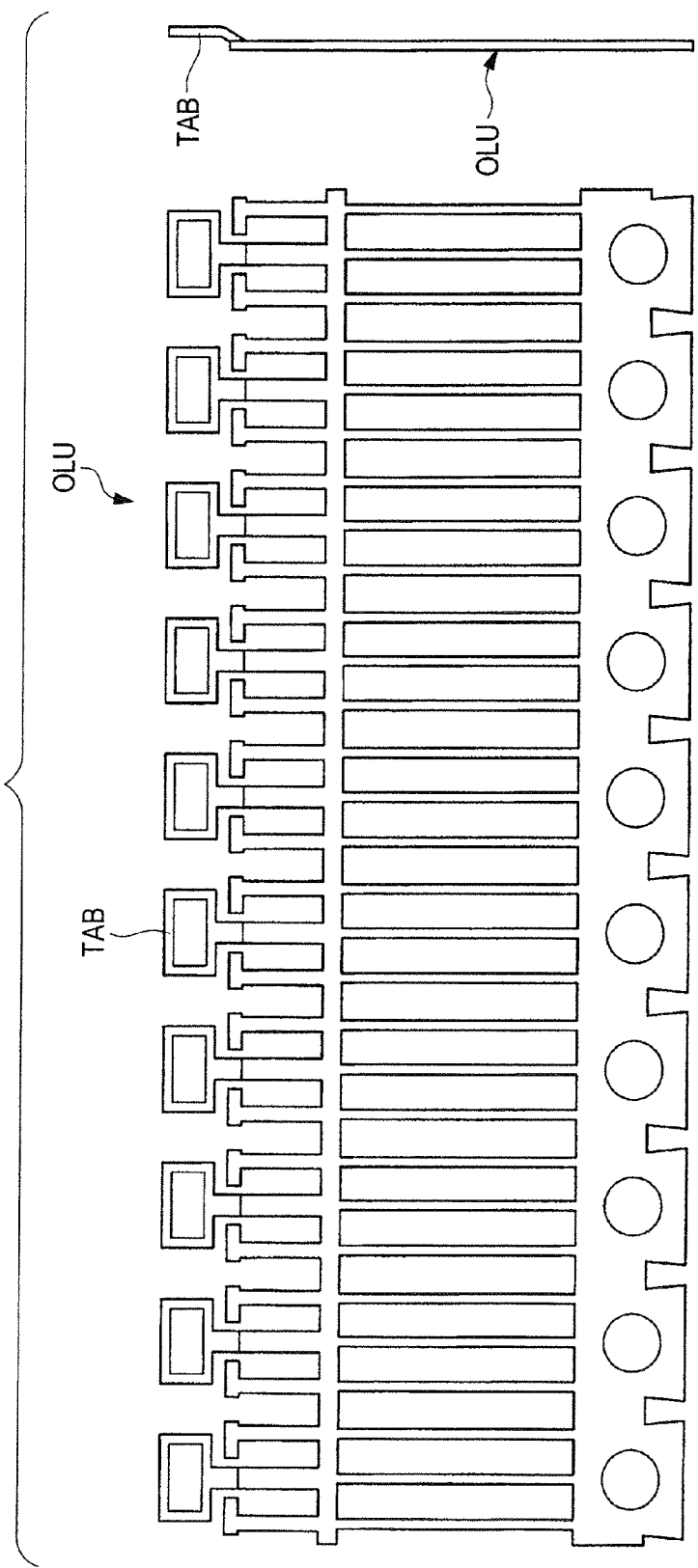
FIG. 28 is a drawing illustrating the manufacturing process of the semiconductor device, following FIG. 27.

As illustrated in FIG. 28, subsequently, the outer lead unit OLU is formed so that the front surface of each chip placement portion TAB is positioned lower than the surfaces of the multiple outer leads. This forming step for the outer lead unit OLU is carried out by bending the chip placement portions TAB by press. At this time, it is difficult to prepare a large press machine in terms of cost and processing and the outer lead unit OLU is formed by press using a small-sized press machine. For this reason, the forming of the outer lead unit OLU by press is not carried out on the multiple chip placement portions TAB formed in one outer lead unit OLU in a lump. Instead, press forming is carried out, for example, by two or three adjoining chip placement portions TAB among the chip placement portions TAB formed in one outer lead unit OLU. Therefore, variation is produced in pressure from press to press and thus there is a possibility that variation is also produced in the forming position of each formed chip placement portion TAB in one outer lead unit OLU. In this embodiment, however, the heat sinks themselves that fix die projections at a resin sealing step are not formed by press; therefore, cracking in the sealing body MR arising from winding (camber) in heat sinks can be suppressed. That is, even if winding (camber) occurs in a chip placement portion TAB, cracking in the sealing body MR does not occur because the chip placement portion TAB itself is not used to fix a die projection at the resin sealing step.

Figure 29:
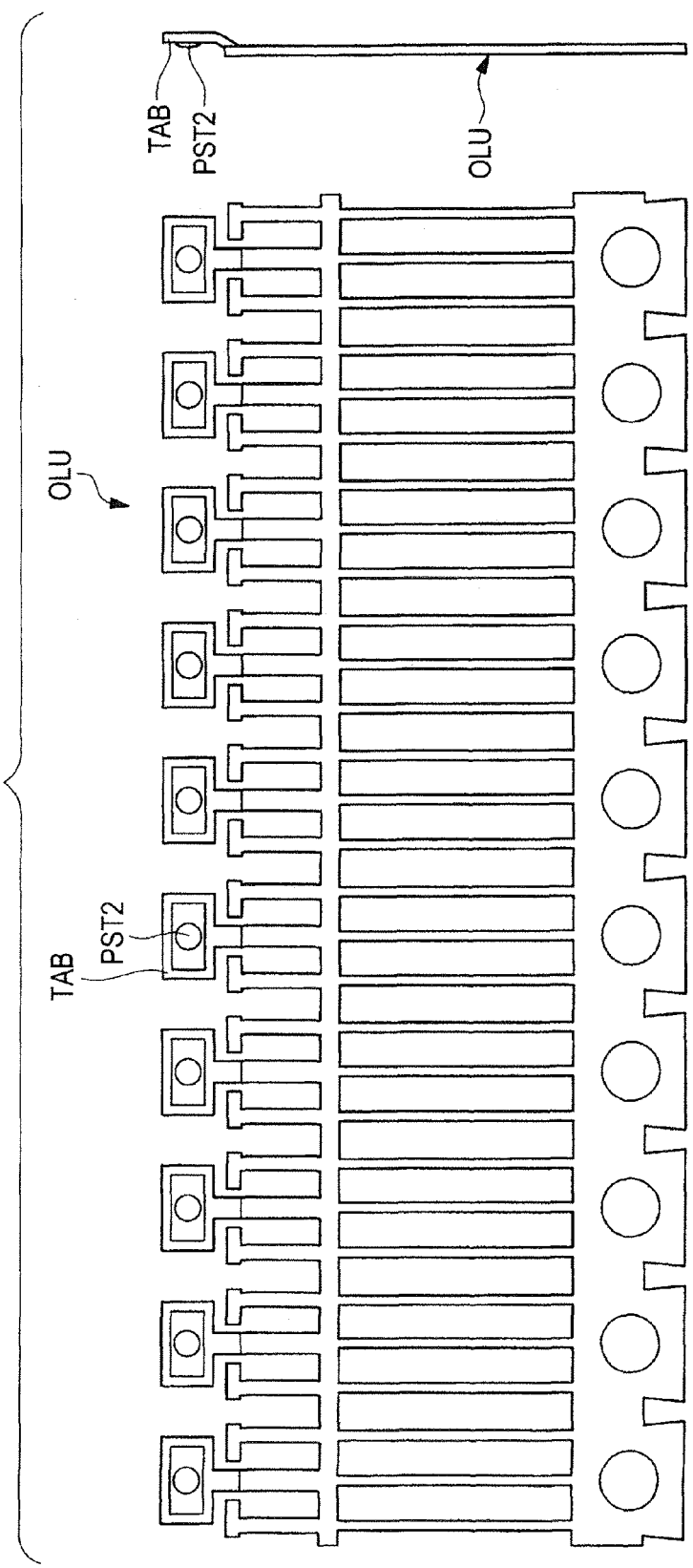
FIG. 29 is a drawing illustrating the manufacturing process of the semiconductor device, following FIG. 28.
Figure 30:
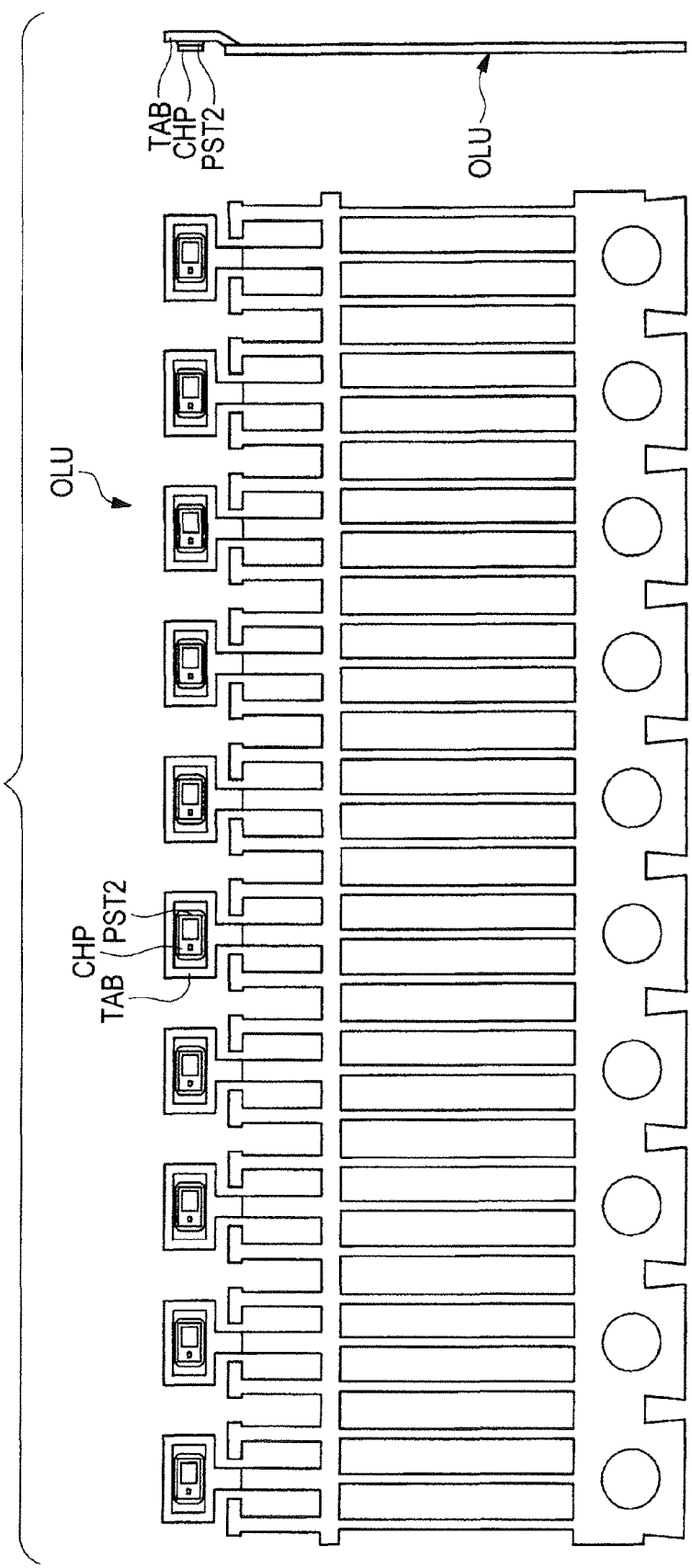
FIG. 30 is a drawing illustrating the manufacturing process of the semiconductor device, following FIG. 29.

As illustrated in FIG. 29, subsequently, solder PST2 is applied to each chip placement portion TAB. Then a semiconductor chip CHP is placed over the chip placement portion TAB with solder PST2 applied thereto as illustrated in FIG. 30 (die bonding) and heating processing is carried out. As the result of this step, the drain electrode formed in the back surface of each semiconductor chip CHP and each chip placement portion TAB are electrically coupled with each other.

The back surface of each semiconductor chip CHP is metalized like, for example, Ti/Ni/Au, Ti/Ni/Ag, Ni/Ti/Ni/Au, or the like outward from the chip side. The solder PST2 and Ni under Au form an alloy and the drain electrode formed in the back surface of each semiconductor chip CHP and each chip placement portion TAB are thereby electrically coupled with each other.

Figure 31:
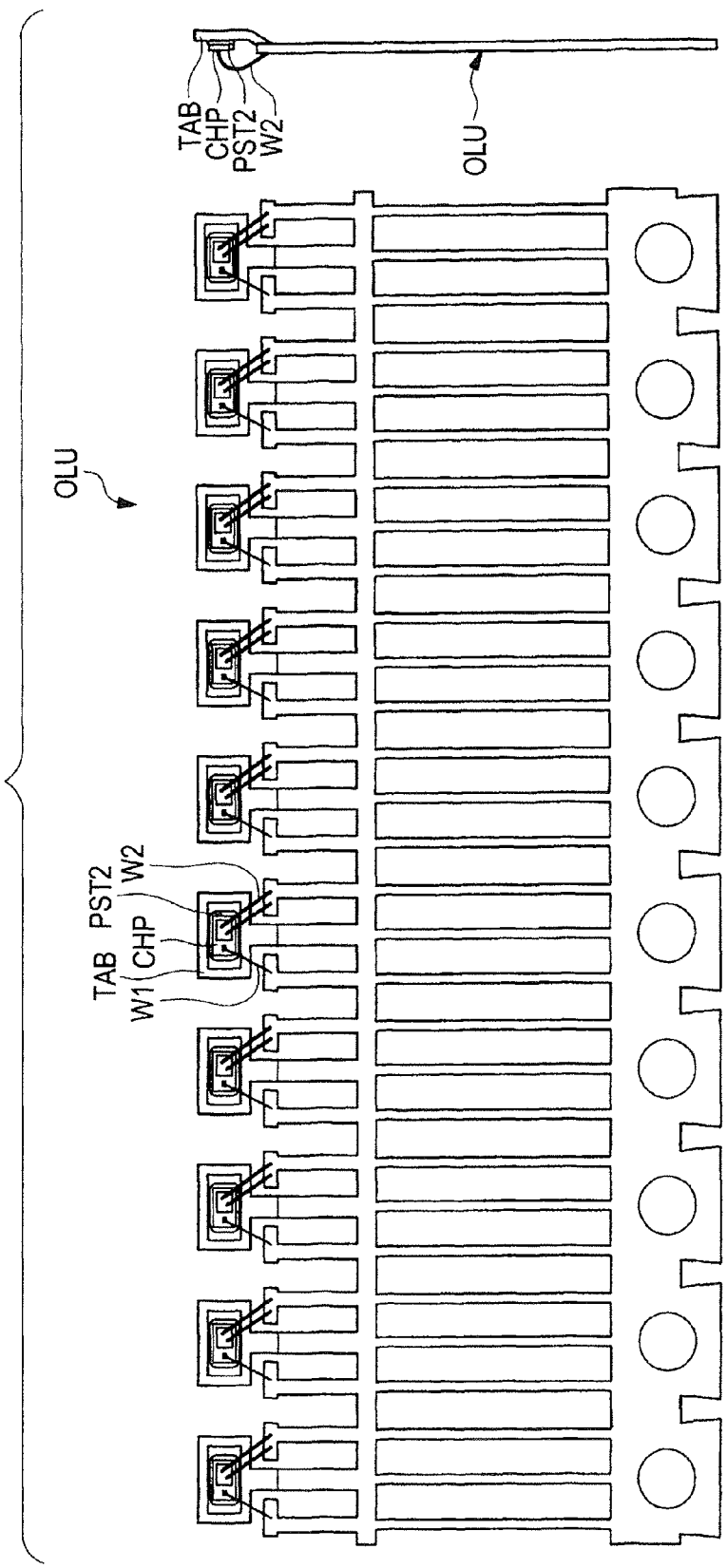
FIG. 31 is a drawing illustrating the manufacturing process of the semiconductor device, following FIG. 30.

As illustrated in FIG. 31, thereafter, the semiconductor chip CHP placed over each chip placement portion TAB and outer leads are joined with each other through wires (wire bonding). Specifically, the gate pad formed in the front surface of each semiconductor chip CHP and a gate terminal (outer lead) are joined together through a wire W1; and the source pad formed in the front surface of each semiconductor chip CHP and a source terminal (outer lead) are joined together through a wire W2. At this time, the wire diameter of the wire W2 is larger than the wire diameter of the wire W1 and the number of wires W1 is one while the number of wires W2 is more than one (two or above).

It is desirable that the wire W2 larger in wire diameter than the wire W1 should be subjected to wire bonding first. The reason for this is as described below. In wire bonding, in general, an ultrasonic wave larger in power is applied to a wire larger in wire diameter than to a wire smaller in the same. Therefore, if a wire smaller in wire diameter is bonded first and then a wire larger in wire diameter is bonded, the ultrasonic wave at that time transmits through the chip; and this increases the possibility that the wire smaller in wire diameter is displaced from a bonding pad.

Figure 32:
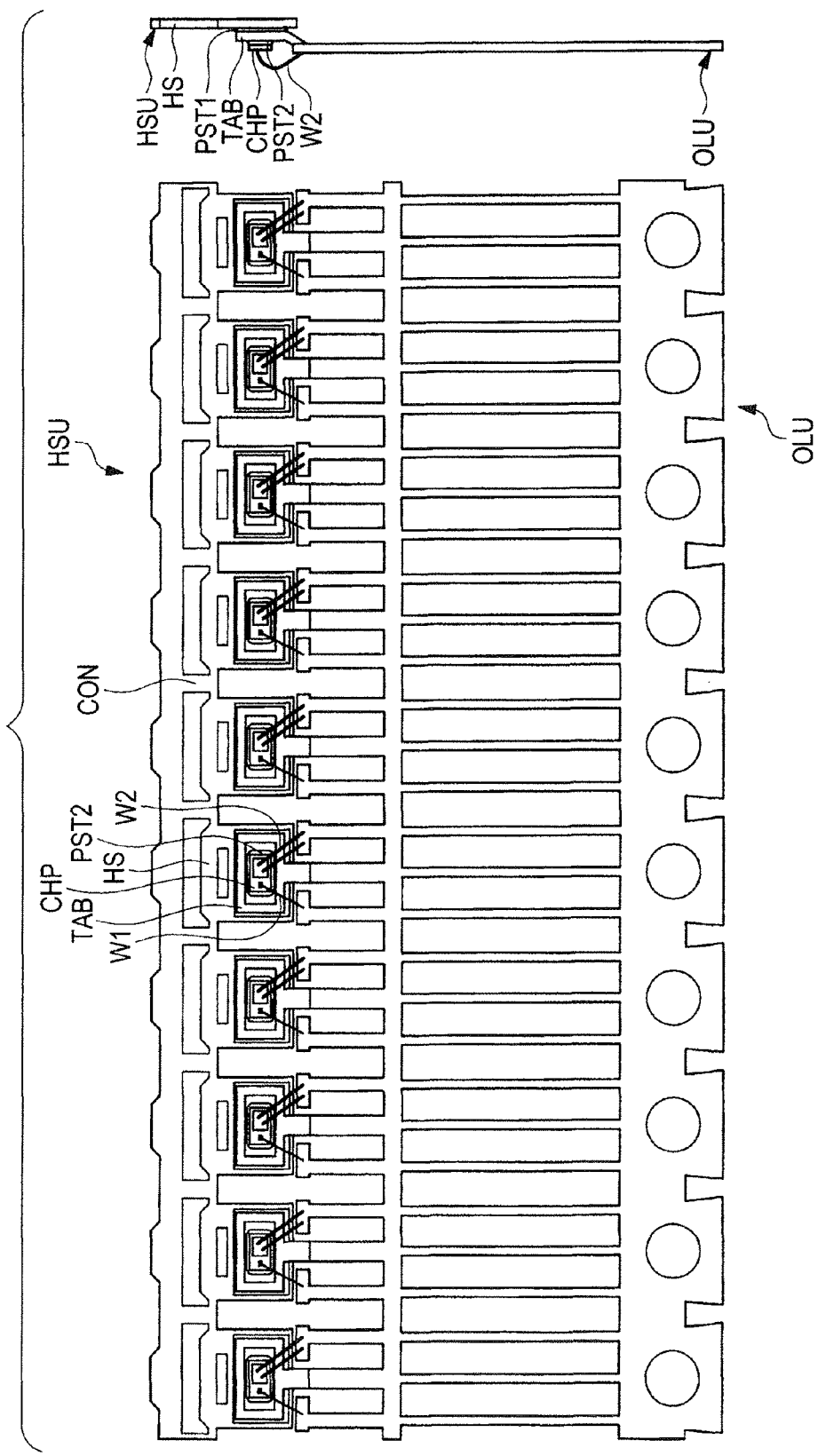
FIG. 32 is a drawing illustrating the manufacturing process of the semiconductor device, following FIG. 31.

As illustrated in FIG. 32, subsequently, a heat sink unit (first frame) HSU in which multiple heat sinks HS are tied together through tying portions CON is prepared. Solder PST1 is applied to each of the heat sinks HS present in this heat sink unit HSU. The heat sink unit HSU prepared at this time is in a straight state.

Thereafter, the heat sink unit HSU and the outer lead unit OLU are joined with each other. Specifically, the heat sink unit HSU and the outer lead unit OLU are so placed that each chip placement portion TAB present in the outer lead unit OLU is placed over each heat sink HS present in the heat sink unit HSU. Then reflow processing (heating processing) is carried out to melt the solder PST1 to join each heat sink HS and each chip placement portion TAB with each other. At this time, the solder PST2 joining each chip placement portion TAB and each semiconductor chip CHP is melted again in the above reflow processing. However, each semiconductor chip CHP and outer leads are joined with each other through a wire W1 or wires W2. For this reason, each semiconductor chip CHP is fixed by the wire W1 and the wires W2; therefore, it is possible to prevent each semiconductor chip CHP from being displaced due to remelting of the solder PST2.

The heat sink unit HSU in which multiple heat sinks HS are formed and the outer lead unit OLU in which outer leads are formed are separated from each other. This makes it unnecessary to carry out difficult forming processing to position heat sinks HS below outer leads just by pressing the heat sinks HS. That is, the heat sink unit HSU can be placed below the outer lead unit OLU without forming the heat sink unit HSU by preparing the heat sink unit HSU and the outer lead unit OLU as separate components. As a result, the necessity for pressing heat sinks HS is obviated and winding (camber) does not occur in the heat sink unit HSU.

Subsequently, the heat sink unit HSU and outer lead unit OLU joined together are cleaned. This cleaning processing is carried out to remove flux contained in the solder PST1 and the solder PST2. To efficiently remove flux, a jet or an ultrasonic wave is frequently used together.

As illustrated in FIG. 33, thereafter, part of each heat sink HS, part of each outer lead, each chip placement portion TAB, and each semiconductor chip CHP are sealed with resin to form the sealing body MR (resin sealing step). More specific description will be given. The heat sink unit HSU and outer lead unit OLU joined together are set in molding dies. At this time, the adjoining heat sinks HS are tied together through tying portions CON. Therefore, the heat sink unit HSU and the outer lead unit OLU are fixed with die projections placed in spaces below the tying portions CON.

Thereafter, the interior of the molding dies is filled with resin. In this embodiment, at this time, the tying portions CON tying the adjoining heat sinks HS together function as a resin leakage prevention stopper; therefore, it is possible to prevent resin burr from being formed outside each sealing body MR. As a result, it is possible to prevent package products from being shipped with resin burr formed thereon. This makes it possible to prevent the following from occurring at the destination of shipment: resin burr drops from a package product and the dropped resin burr sticks to a terminal over a mounting substrate. Therefore, the following can be implemented, for example, when a terminal of a mounting substrate and a lead of a package (semiconductor device) are electrically coupled with each other: it is possible to effectively prevent resin burr as a resin insulator sticking to the terminal of the mounting substrate from interfering with electrical coupling between the terminal over the mounting substrate and the lead of the package.

After the sealing bodies MR are subsequently formed, the heat sink unit HSU and outer lead unit OLU with the sealing bodies MR formed thereon are taken out of the molding dies. In this embodiment, heat sinks HS are not pressed; therefore, winding (camber) does not occur in the heat sink unit HSU. For this reason, the die projections do not bite the heat sink unit HSU when the die projections inserted into the spaces below the tying portions CON are removed. Consequently, the heat sink unit HSU and outer lead unit OLU with the sealing bodies MR formed thereon can be taken out of the molding dies without imposing a stress burden on the sealing bodies MR. This makes it possible to prevent cracking in the sealing body MR caused by the phenomenon in which a die projection bites the heat sink unit HSU and unwanted stress is exerted on the sealing body MR.

Then the heat sink unit HSU and the outer lead unit OLU are cut and formed to manufacture individual packages PK3. The package PK3 (semiconductor device) in this embodiment can be manufactured as mentioned above.

<Problem Involved in Second Package Product>

Description will be given to an example in which the technical idea of the invention is applied to a second package product. First, description will be given to a problem involved in the second package product with reference to drawings.

There are two types of packages in the second package product: a package PK4 of heat sink exposed type and a package PK5 of full mold type. The package PK4 and the package PK5 respectively have advantages and disadvantages.

First, description will be given to the configuration of the package PK4 of heat sink exposed type. FIGS. 34A to 34C illustrate the configuration of the appearance of the package PK4. FIG. 34A is a front view of the package PK4 as viewed from front; FIG. 34B is a side view of the package PK4 as viewed laterally; and FIG. 34C is a back view of the package PK4 as viewed from rear.

In FIG. 34A, the package PK4 has a rectangular sealing body MR and a semiconductor chip in which, for example, an integrated circuit is formed is buried in this sealing body MR. Part of the heat sink HS is protruded from the upper part of the sealing body MR and cutting portions CT2 that are traces of separation from a lead frame are formed at the upper part of the heat sink HS. Meanwhile, a gate terminal GT, a drain terminal DT, and a source terminal ST are protruded from the lower part of the sealing body MR. It is seen from FIG. 34B that the package PK4 is provided at the bottom portion of the sealing body MR with the heat sink HS and, for example, the source terminal ST is protruded from the sealing body MR. Further, it is seen from FIG. 34C that in the package PK4, the heat sink HS is placed in the back surface of the sealing body MR and the heat sink HS is exposed from the back surface of the sealing body MR.

Figure 35A:
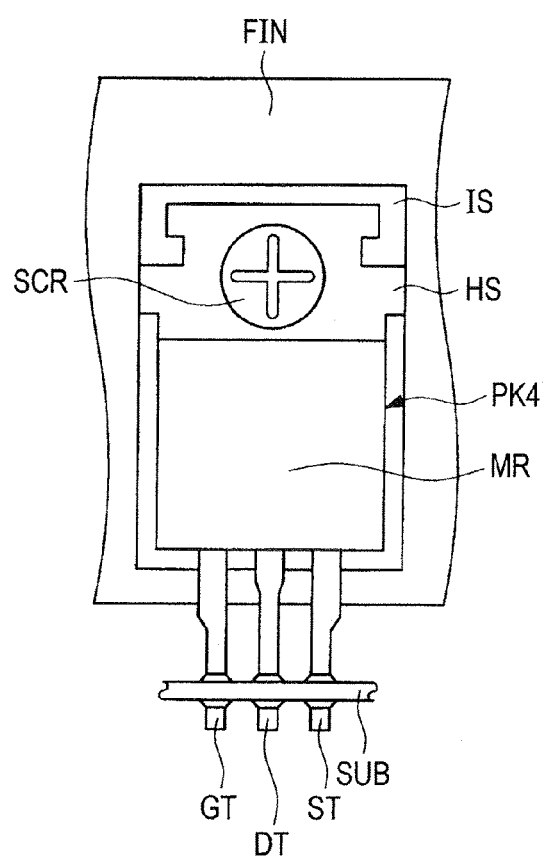
FIG. 35A is a drawing illustrating how the fourth package is mounted over a mounting substrate as viewed from front.
Figure 35B:
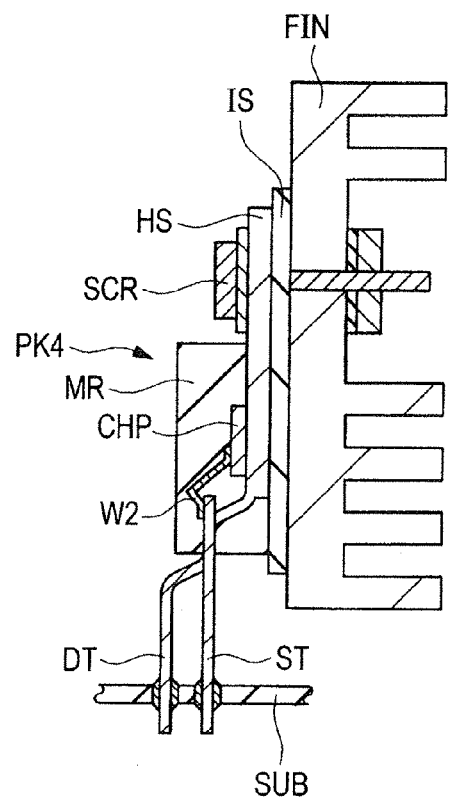
FIG. 35B is a sectional view illustrating how the fourth package is mounted over the mounting substrate as viewed laterally.

Description will be given to a configuration with which the package PK4 is mounted over a mounting substrate. FIGS. 35A and 35B illustrate how the package PK4 is mounted over the mounting substrate SUB. FIG. 35A is a drawing illustrating how the package PK4 is mounted over the mounting substrate SUB as viewed from front; and FIG. 35B is a sectional view illustrating how the package PK4 is mounted over the mounting substrate SUB as viewed laterally.

As illustrated in FIG. 35A and FIG. 35B, the gate terminal GT, drain terminal DT, and source terminal ST formed in the package PK4 are inserted into the mounting substrate SUB. As a result, the package PK4 is mounted over the mounting substrate SUB. It is seen that the package PK4 is fixed over a radiation fin FIN with a screw SCR with an insulation sheet IS in between.

An advantage of the thus configured package PK4 is that the heat sink HS is exposed from the sealing body MR. Since the package PK4 is so structured that the heat sink HS is exposed from the sealing body MR, the following can be implemented with the package PK4: heat produced in the semiconductor chip CHP can be efficiently dissipated from the exposed heat sink HS. A disadvantage of the package PK4 is as described below. In the package PK4, as illustrated in FIG. 35B, the semiconductor chip CHP is placed over the heat sink HS; therefore, the drain electrode formed in the back surface of the semiconductor chip CHP is electrically coupled with the heat sink HS. For this reason, it is necessary to take the following measure when the radiation fin FIN is attached to the package PK4: it is necessary to place the insulation sheet IS between the heat sink HS and the radiation fin FIN to ensure insulation between the heat sink HS and the radiation fin FIN. Since the insulation sheet IS is used when the package PK4 is mounted over the mounting substrate SUB, as mentioned above, the cost is increased by an amount equivalent to use of the insulation sheet IS and the work burden is also increased.

Figures 36A, 36B, 36C:
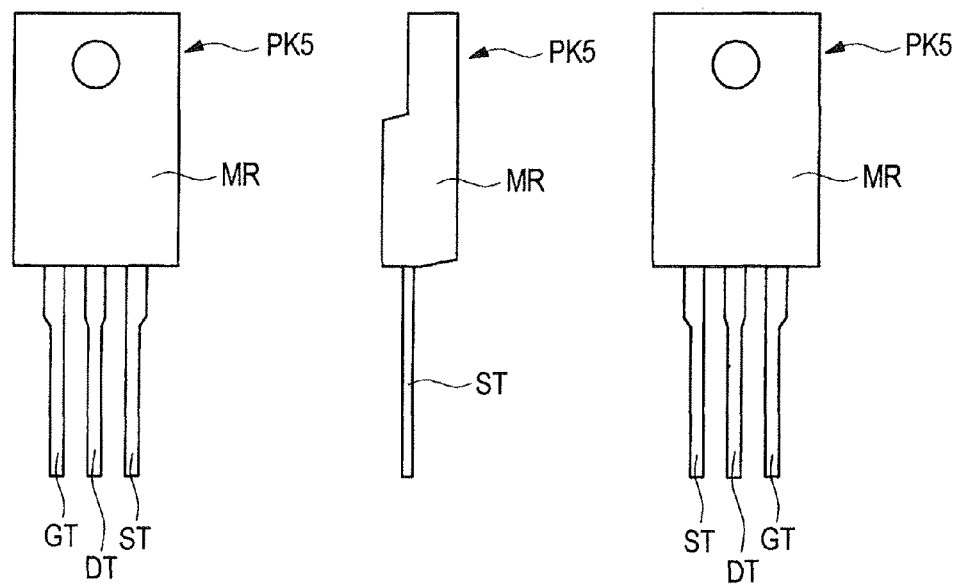
FIG. 36A is a front view of a fifth package as viewed from front.
FIG. 36B is a side view of the fifth package as viewed laterally.
FIG. 36C is a back view of the fifth package as viewed from rear.

Description will be given to the configuration of the package PK5 of full mold type. FIGS. 36A to 36C illustrate the configuration of the appearance of the package PK5. FIG. 36A is a front view of the package PK5 as viewed from front; FIG. 36B is a side view of the package PK5 as viewed laterally; and FIG. 36C is a back view of the package PK5 as viewed from rear.

It is seen from FIG. 36A to FIG. 36C that the package PK5 has a rectangular sealing body MR and a gate terminal GT, a drain terminal DT, and a source terminal ST are protruded from this sealing body MR.

Figures 37A, 37B, 37C:
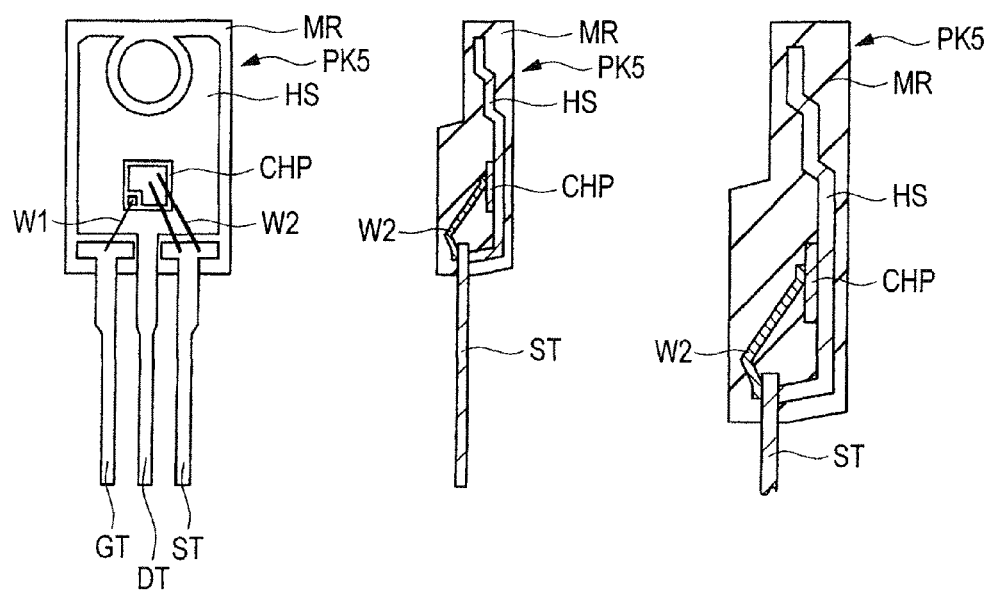
FIG. 37A is a drawing illustrating the interior of a sealing body seen through from front.
FIG. 37B is a sectional view of the interior of the sealing body seen through laterally.
FIG. 37C is a sectional view illustrating part of FIG. 37B in an enlarged manner.

FIGS. 37A to 37C illustrate the internal structure of the package PK5 seen through the sealing body MR. FIG. 37A is a drawing illustrating the interior of the sealing body MR seen through from front and FIG. 37B is a sectional view of the interior of the sealing body MR seen through laterally. FIG. 37C is an enlarged sectional view of part of FIG. 37B. As illustrated in FIG. 37A, a heat sink HS is provided in the sealing body MR and the entire heat sink HS is covered with the sealing body MR. A semiconductor chip CHP is placed over the heat sink HS. The semiconductor chip CHP (gate pad) and the gate terminal GT are coupled with each other through a wire W1 and the semiconductor chip CHP (source pad) and the source terminal ST are coupled with each other through wires W2.

It is seen from FIG. 37B and FIG. 37C that the heat sink HS is covered with the sealing body MR and is not exposed from the sealing body MR. The semiconductor chip CHP is placed over the heat sink HS formed in the sealing body MR and, for example, the semiconductor chip CHP (source pad) and the source terminal ST are coupled with each other through wires W2.

Figure 38A:
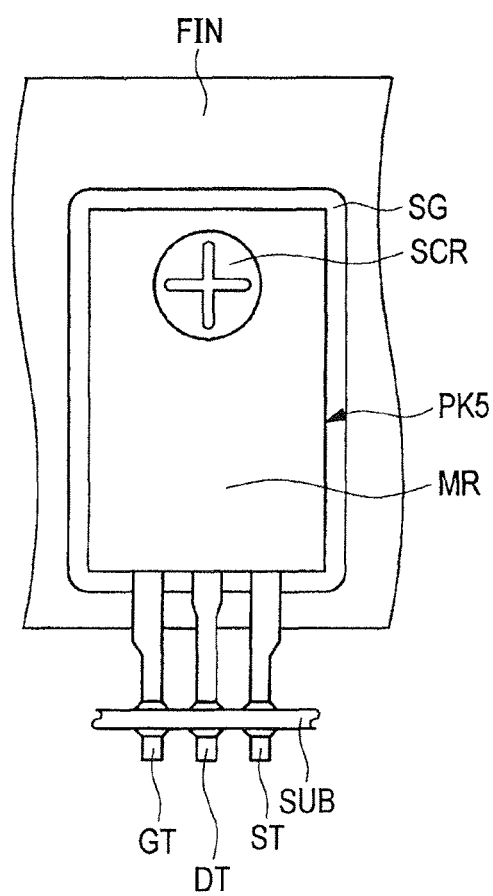
FIG. 38A is a drawing illustrating how the fifth package is mounted over a mounting substrate as viewed from front.
Figure 38B:
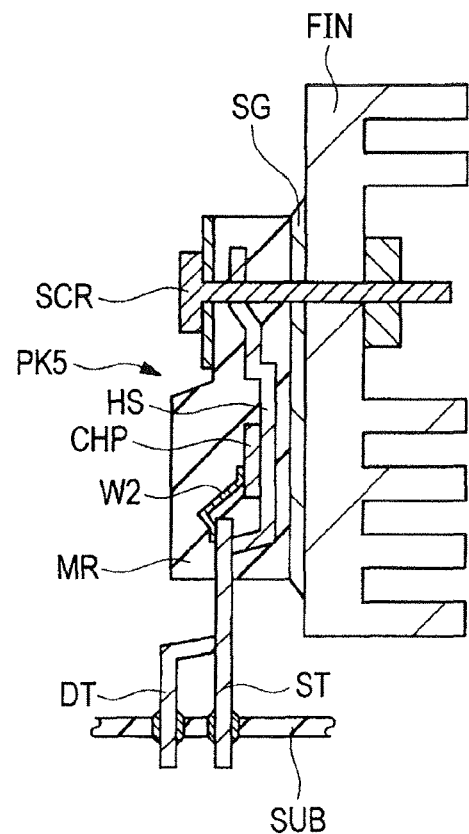
FIG. 38B is a sectional view illustrating how the fifth package is mounted over the mounting substrate as viewed laterally.

Description will be given to a configuration with which the package PK5 is mounted over a mounting substrate. FIGS. 38A and 38B illustrate how the package PK5 is mounted over the mounting substrate SUB. FIG. 38A is a drawing illustrating how the package PK5 is mounted over the mounting substrate SUB as viewed from front; and FIG. 38B is a sectional view illustrating how the package PK5 is mounted over the mounting substrate SUB as viewed laterally.

As illustrated in FIG. 38A and FIG. 38B, the gate terminal GT, drain terminal DT, and source terminal ST formed in the package PK5 are inserted into the mounting substrate SUB. As a result, the package PK5 is mounted over the mounting substrate SUB. It is seen that the package PK5 is fixed over a radiation fin FIN with a screw SCR with silicon grease SG in between.

An advantage of the thus configured package PK5 is that the necessity for the insulation sheet IS is obviated when the package PK5 and the radiation fin FIN are joined with each other. More specific description will be given. Also in the package PK5, as illustrated in FIG. 38B, the semiconductor chip CHP is placed over the heat sink HS. Therefore, the drain electrode formed in the back surface of the semiconductor chip CHP and the heat sink HS are electrically coupled with each other. In the package PK5, however, the entire heat sink HS is covered with the sealing body MR and the insulation sheet IS is unnecessary when the radiation fin FIN is attached to the package PK5. Even though the radiation fin FIN is directly attached to the package PK5 through the silicon grease SG, the heat sink HS itself is present in the sealing body MR. Therefore, insulation can be ensured between the heat sink HS and the radiation fin FIN without the insulation sheet IS. In the package PK5 of full mold type, therefore, it is unnecessary to place the insulation sheet IS to ensure insulation between the heat sink HS and the radiation fin FIN when the radiation fin FIN is attached to the package PK5. This makes it possible to reduce the cost and the work burden as well. It is seen from the foregoing that the package PK5 of full mold type has an advantage that the cost and the work burden can be reduced because the insulation sheet IS is not used.

However, the package PK5 of full mold type has the disadvantage described below. Hereafter, concrete description will be given to the disadvantage of the package PK5. In the package PK5 of full mold type, the entire heat sink HS is covered with the sealing body MR. In the package PK5, that is, insulation is ensured between the heat sink HS and the outside (for example, the radiation fin FIN) by covering the entire heat sink HS with the sealing body MR. In the package PK5, therefore, the thickness of the resin (part of the sealing body MR) present under the heat sink HS is important. When the thickness of the resin (part of the sealing body MR) present under the heat sink HS is reduced, the dielectric strength between the heat sink HS and the radiation fin FIN is reduced. At worst, the resin suffers dielectric breakdown and the heat sink HS and the radiation fin FIN are short-circuited. Meanwhile, when the thickness of the resin (part of the sealing body MR) present under the heat sink HS is increased, the heat radiation characteristic from the heat sink HS is degraded. For this reason, the thickness of the resin (part of the sealing body MR) present under the heat sink HS is determined from the view point of achieving both the securement of dielectric strength and the enhancement of heat radiation characteristic. Meanwhile, the thickness of the resin (part of the sealing body MR) formed over the heat sink HS is determined from the view point of sufficiently covering the constituent elements in the sealing body MR. Thus the following thicknesses are determined from different view points: the thickness of the resin (part of the sealing body MR) formed under the heat sink HS and the thickness of the resin (part of the sealing body MR) formed over the heat sink HS. For this reason, for example, the phenomenon illustrated in FIG. 37C occurs. That is, the thickness of the resin (part of the sealing body MR) formed under the heat sink HS is significantly smaller than the thickness of the resin (part of the sealing body MR) formed over the heat sink HS. This results in a structure in which the thicknesses of the resin (sealing body MR) formed over and under the heat sink HS are ill-balanced.

As a result, the following problem arises in the package PK5 of full mold type: when the sealing body MR is formed, an area where resin is not filled is produced in the back surface of the package PK5. Hereafter, description will be given to a mechanism through which an area unfilled with resin is produced in the back surface of the package PK5 with reference to drawings.

FIG. 39A to FIG. 44C illustrate a resin sealing step for forming the sealing body MR. Especially, FIG. 39A, FIG. 40A, FIG. 41A, FIG. 42A, FIG. 43A, and FIG. 44A are sectional views for explaining how a resin injection process is carried out with a lead frame clamped between an upper die (first die) UM and a lower die (second die) BM; and FIG. 39B, FIG. 40B, FIG. 41B, FIG. 42B, FIG. 43B, and FIG. 44B are plan views of the resin injection process as seen through the upper die UM from above. FIG. 39C, FIG. 40C, FIG. 41C, FIG. 42C, FIG. 43C, and FIG. 44C are plan views of the resin injection process as seen through the lower die BM from below.

Figure 39A:
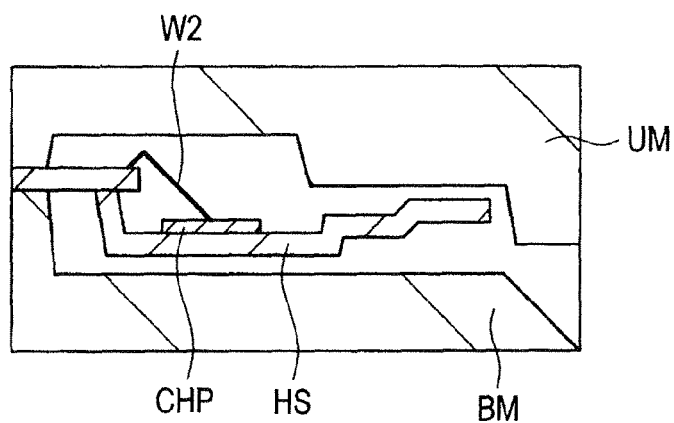
FIG. 39A is a drawing illustrating a resin sealing step for the fifth package.
Figure 39B:
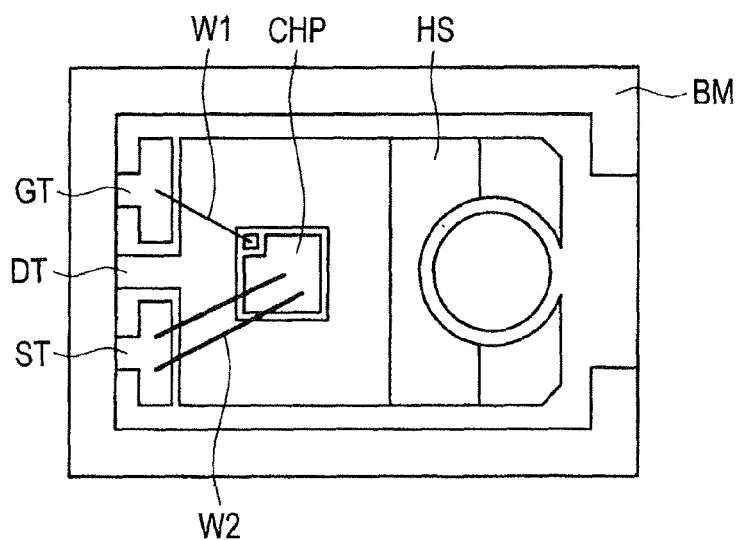
FIG. 39B is a drawing illustrating the resin sealing step for the fifth package.
Figure 39C:
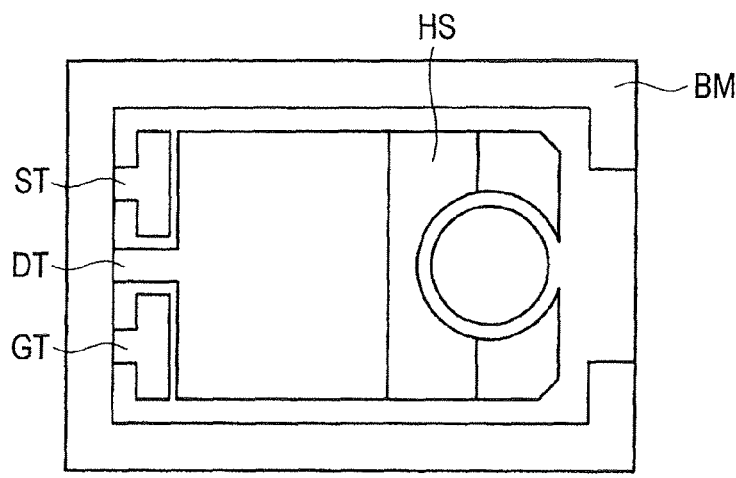
FIG. 39C is a drawing illustrating the resin sealing step for the fifth package.

As illustrated in FIG. 39A to FIG. 39C, first, the lead frame is clamped between the upper die UM and the lower die BM. At this time, the lead frame is placed in the internal space (sealing space) clamped between the upper die UM and the lower die BM. This lead frame includes the heat sink HS and the semiconductor chip CHP is placed over this heat sink HS.

Figure 40A:
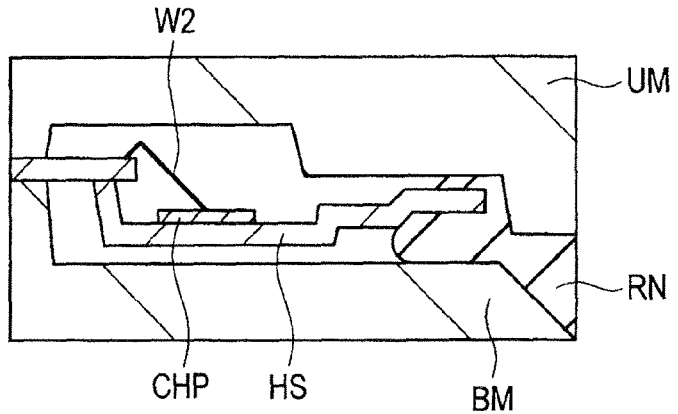
FIG. 40A is a drawing illustrating the resin sealing step, following FIG. 39A.
Figure 40B:
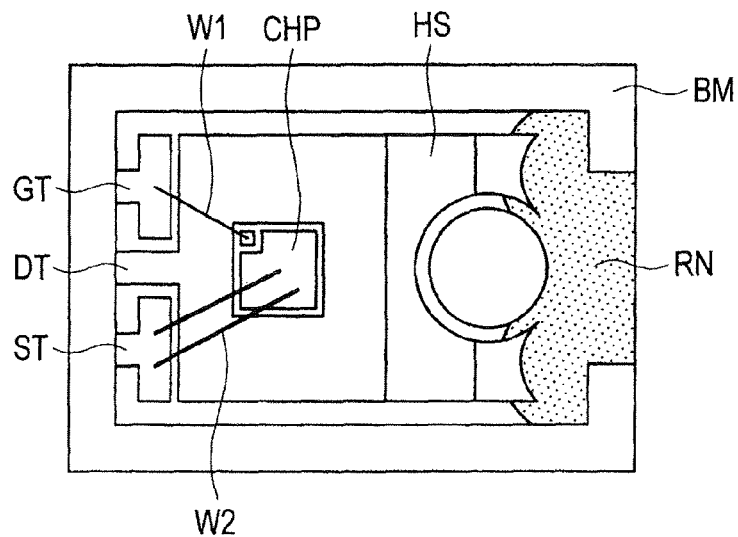
FIG. 40B is a drawing illustrating the resin sealing step, following FIG. 39B.
Figure 40C:
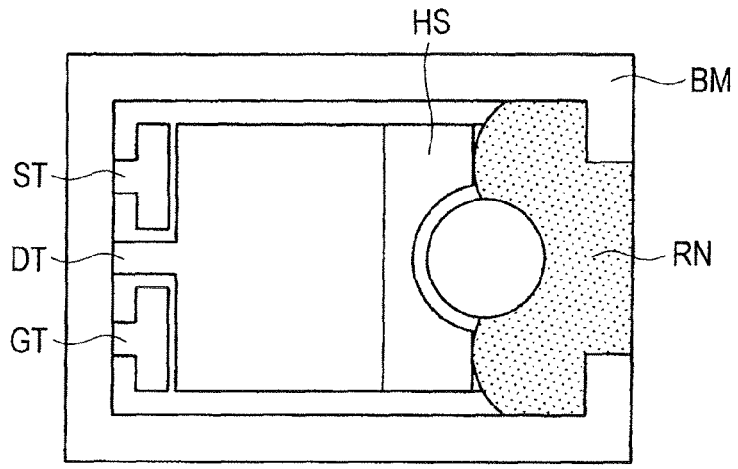
FIG. 40C is a drawing illustrating the resin sealing step, following FIG. 39C.

As illustrated in FIG. 40A to FIG. 40C, injection of resin RN into the above-mentioned internal space (sealing space) is started with the lead frame clamped between the upper die UM and the lower die BM. At this time, resin RN is injected from the direction located obliquely below the heat sink HS. Therefore, the resin RN injected from the direction located obliquely below the heat sink HS is brought into contact with the back surface of the heat sink HS and the resin RN is guided so that it is injected mainly to below the heat sink HS. However, the resin RN is injected also to above the heat sink HS. The heat sink HS is so processed that it is bent stepwise upward and in proximity to the tip of the heat sink HS, the space under the heat sink HS is wider than the space over the heat sink HS. For this reason, at the start of resin RN injection, the resin RN injection rate is higher under the heat sink HS than over the heat sink HS.

Figure 41A:
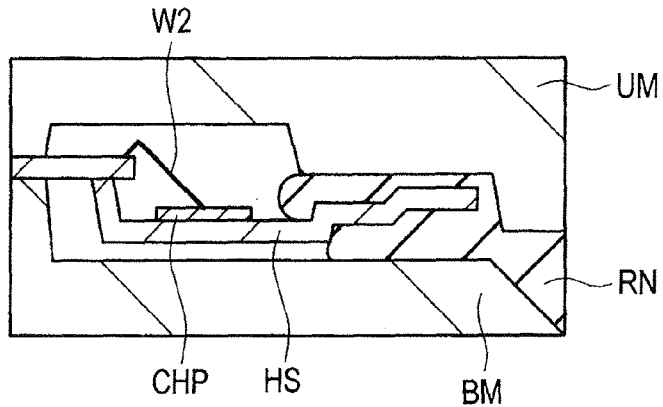
FIG. 41A is a drawing illustrating the resin sealing step, following FIG. 40A.
Figure 41B:
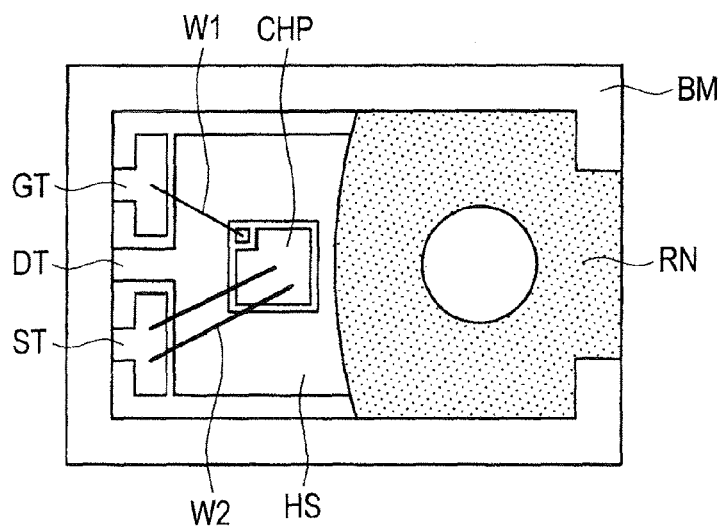
FIG. 41B is a drawing illustrating the resin sealing step, following FIG. 40B.
Figure 41C:
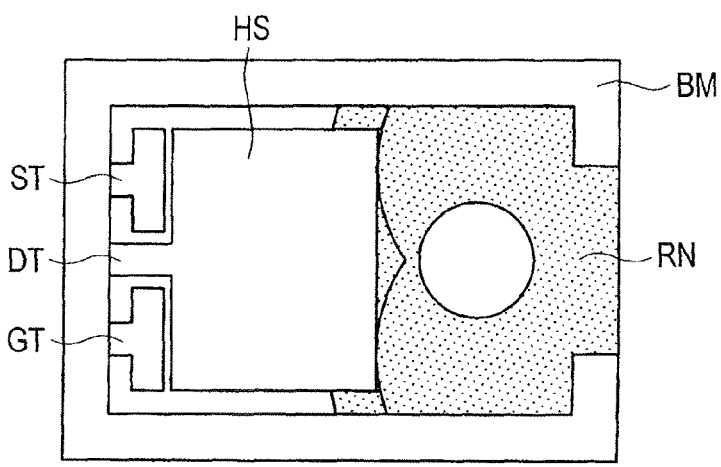
FIG. 41C is a drawing illustrating the resin sealing step, following FIG. 40C.

As illustrated in FIG. 41A to FIG. 41C, subsequently, the resin RN injection is continued. Thus the space under the heat sink HS gradually becomes narrower than the space over the heat sink HS. Therefore, the resin RN injection rate under the heat sink HS becomes lower than the resin RN injection rate over the heat sink HS.

Figure 42A:
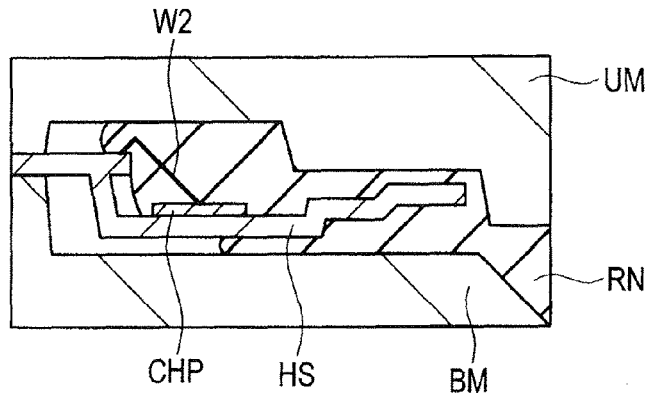
FIG. 42A is a drawing illustrating the resin sealing step, following FIG. 41A.
Figure 42B:
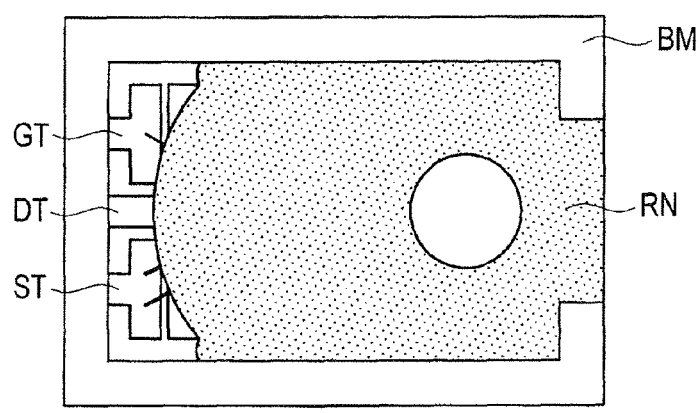
FIG. 42B is a drawing illustrating the resin sealing step, following FIG. 41B.
Figure 42C:
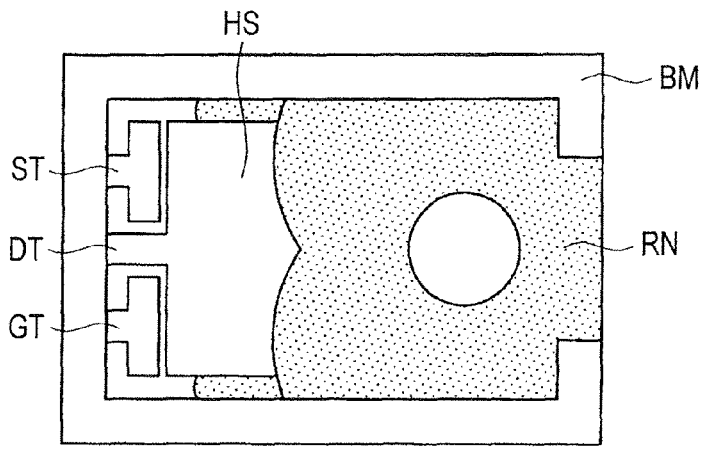
FIG. 42C is a drawing illustrating the resin sealing step, following FIG. 41C.
Figure 43A:
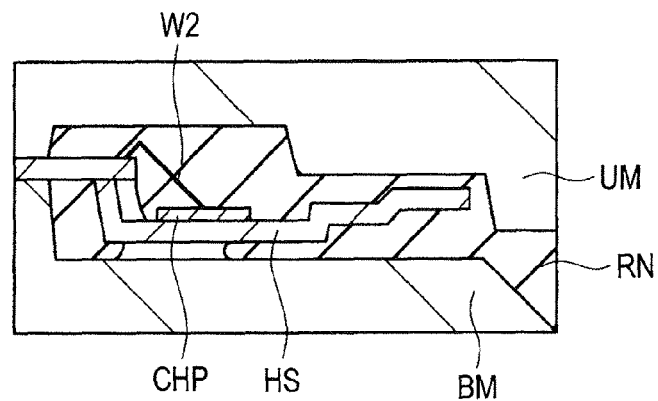
FIG. 43A is a drawing illustrating the resin sealing step, following FIG. 42A.
Figure 43B:
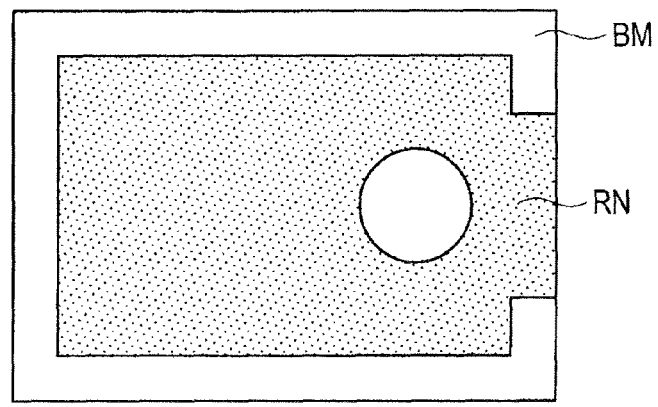
FIG. 43B is a drawing illustrating the resin sealing step, following FIG. 42B.
Figure 43C:
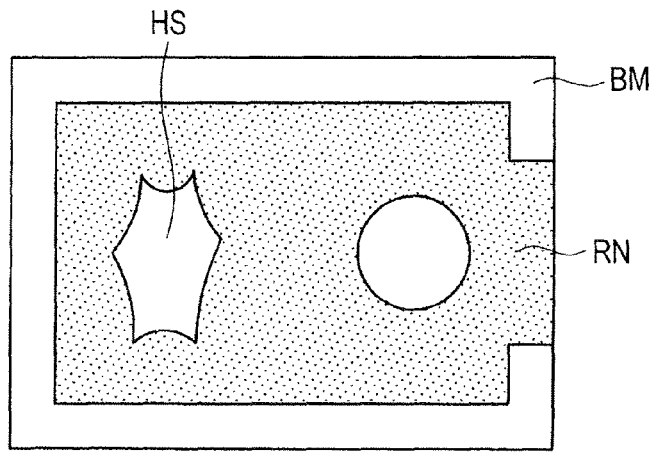
FIG. 43C is a drawing illustrating the resin sealing step, following FIG. 42C.

As illustrated in FIG. 42A to FIG. 42C, subsequently, the injected resin RN reaches the space over the semiconductor chip CHP. Then the following takes place because the space over the semiconductor chip CHP is significantly larger than the space under the heat sink HS: the rate at which the resin RN is filled in the space over the heat sink HS becomes higher in a stroke than the rate at which the resin RN is filled in the space under the heat sink HS. As illustrated in FIG. 43A to FIG. 43C, as a result, the space over the heat sink HS is filled with the resin RN faster than the space under the heat sink HS is. The resin RN that has filled the space over the heat sink HS goes around from the space over the heat sink HS toward the space under it.

Figure 44A:
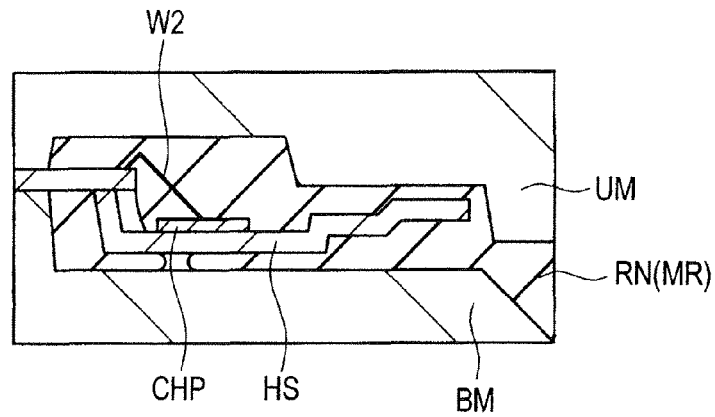
FIG. 44A is a drawing illustrating the resin sealing step, following FIG. 43A.
Figure 44B:
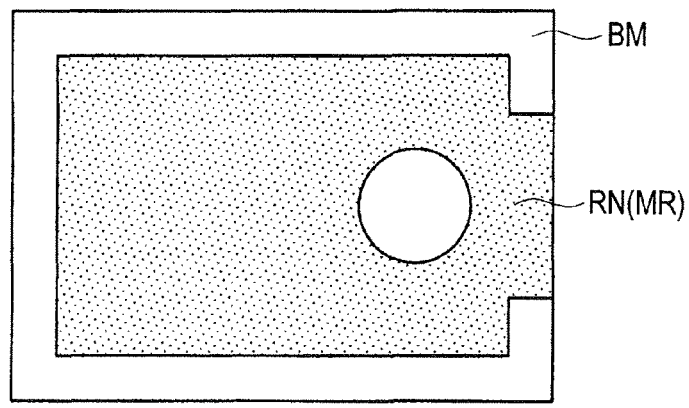
FIG. 44B is a drawing illustrating the resin sealing step, following FIG. 43B.
Figure 44C:
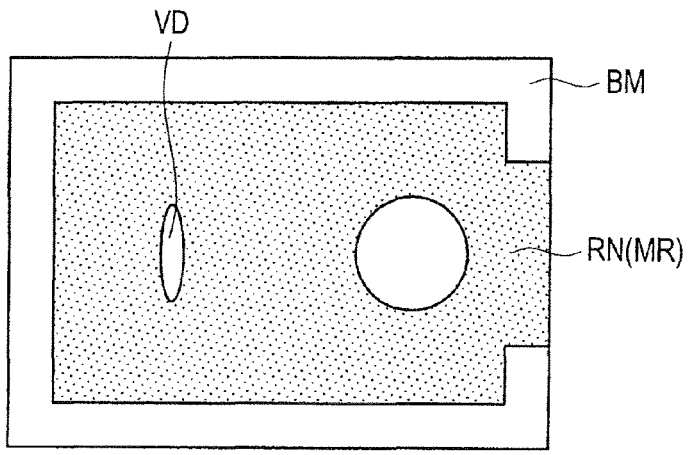
FIG. 44C is a drawing illustrating the resin sealing step, following FIG. 43C.

As illustrated in FIG. 44A to FIG. 44C, thereafter, air is eventually trapped in the space under the heat sink HS and the resin sealing step is competed with this air bubble remaining unbroken. As a result, a void VD is produced in the space under the heat sink HS. That is, an area unfilled with the resin RN is formed in the space under the heat sink HS.

When such an area unfilled with resin RN is formed in the package PK5, the reliability of the package PK5 is degraded. More specific description will be given. The sealing body MR formed of resin RN has the functions of, for example: protecting a semiconductor chip from the external environment, such as humidity and temperature; preventing breakage and degradation in the characteristics of the semiconductor chip arising from vibration or impact; and the like. If an area unfilled with resin RN is produced in the sealing body MR, the sealing body MR cannot carry out these functions and the reliability of the package PK5 is degraded. When an area unfilled with resin RN is produced in the package PK5, part of the heat sink HS is exposed from this unfilled area. As a result, the following problem also arises when the radiation fin FIN is attached to the package PK5: the dielectric strength between the part of the heat sink HS exposed form the unfilled area and the radiation fin FIN is degraded.

As mentioned above, the package PK5 of full mold type is so structured that an area unfilled with resin RN is prone to be produced in part of the sealing body MR. As a result, the package PK5 has a disadvantage of degraded reliability.

There are two types of packages in, for example, the second package product: the package PK4 of heat sink exposed type and the package PK5 of full mold type. When the package PK4 of heat sink exposed type is mounted over a mounting substrate SUB, the insulation sheet IS is used. Therefore, the package PK4 has the following disadvantage: the cost is increased by an amount equivalent to use of the insulation sheet IS and the work burden is also increased. Meanwhile, the package PK5 of full mold type is so structured that an area unfilled with resin RN is prone to be produced in part of the sealing body MR. As a result, the package PK5 has a disadvantage of degraded reliability.

To cope with this, the technical idea of the invention is applied to the second package product to solve both the problems of increase in cost and work burden and degradation in the reliability of the package. Hereafter, description will be given to this technical idea.

<Structure Obtained by Applying the Invention to Second Package Product>

Description will be given to the configuration of a package PK6 manufactured by applying the technical idea of the invention. FIGS. 45A to 45C illustrate the structure of the package PK6. FIG. 45A is a front view of the package PK6 as viewed from front; FIG. 45B is a side view of the package PK6 as viewed laterally; and FIG. 45C is a back view of the package PK6 as viewed from rear.

In FIG. 45A, the package PK6 has a rectangular sealing body MR and a semiconductor chip in which, for example, an integrated circuit is formed is buried in this sealing body MR. Part of the heat sink HS is protruded from the upper part of the sealing body MR and cutting portions CT2 that are traces of separation from a lead frame are formed at the upper part of the heat sink HS. Meanwhile, a gate terminal GT, a drain terminal DT, and a source terminal ST are protruded from the lower part of the sealing body MR. It is seen from FIG. 45B that the package PK6 is provided at the bottom portion of the sealing body MR with the heat sink HS and, for example, the source terminal ST is protruded from the sealing body MR. Further, it is seen from FIG. 45C that in the package PK6, the heat sink HS is placed in the back surface of the sealing body MR and the heat sink HS is exposed form the back surface of the sealing body MR.

Figure 46A:
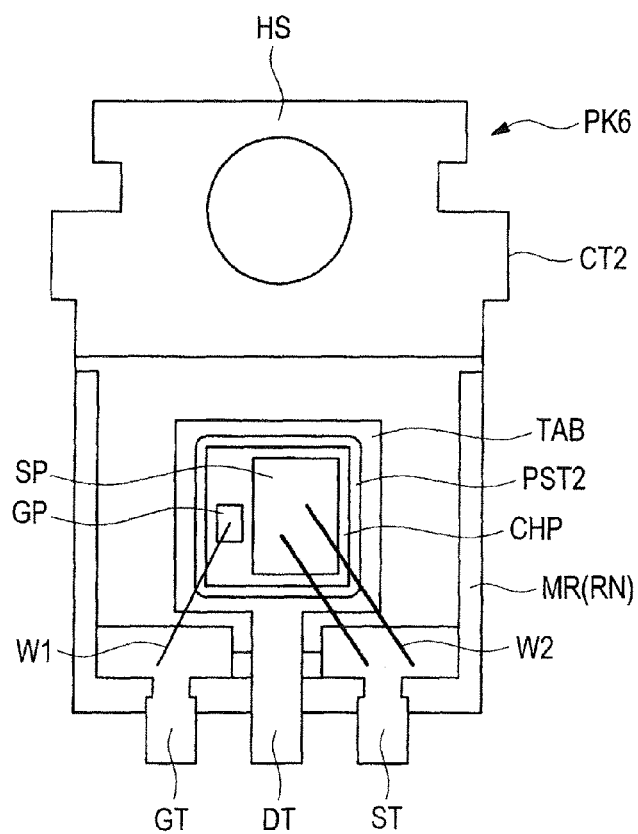
FIG. 46A is a plan view illustrating the internal structure of a package in an embodiment.
Figure 46B:
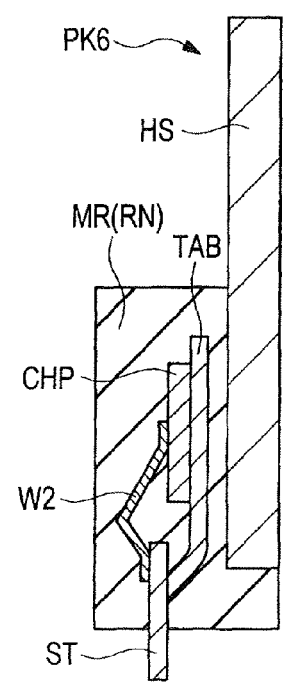
FIG. 46B is a sectional view illustrating the internal structure of the package in the embodiment.

Description will be given to the internal structure of the package PK6. FIGS. 46A and 46B illustrate the internal structure of the package PK6 in this embodiment. FIG. 46A is a plan view illustrating the internal structure of the package PK6 in this embodiment; and FIG. 46B is a sectional view illustrating the internal structure of the package PK6 in this embodiment.

FIG. 46A illustrates the internal structure of the package PK6 seen through the sealing body MR. As illustrated in FIG. 46A, the package PK6 in this embodiment has the heat sink HS and part of this heat sink HS is exposed from the upper part of the sealing body MR. At the side of the heat sink HS exposed from the upper part of the sealing body MR, there are formed cutting portions CT2 obtained by cutting tying portions. A chip placement portion TAB is formed over the heat sink HS and this chip placement portion TAB is formed integrally with the drain terminal DT. Therefore, the chip placement portion TAB and the drain terminal DT are electrically coupled with each other.

The semiconductor chip CHP is placed over the chip placement portion TAB with solder PST2 in between. In this semiconductor chip CHP, for example, a power MOSFET is formed. More specific description will be given. For example, a source pad SP and a gate pad GP are formed in the front surface of the semiconductor chip CHP with the power MOSFET formed therein. The gate pad GP is electrically coupled with the gate terminal (outer lead) GT through a wire W1; and the source pad SP is electrically coupled with the source terminal (outer lead) ST through a wire W2. A drain electrode (not shown) is formed in the back surface of the semiconductor chip CHP and this drain electrode is electrically coupled with the drain terminal (outer lead) through the chip placement portion TAB.

Description will be given to the cross section structure of the package PK6 with reference to FIG. 46B. As illustrated in FIG. 46B, the heat sink HS is so formed that it is exposed from the bottom surface of the sealing body MR and the chip placement portion TAB is placed over the heat sink HS with resin RN in between. That is, in the package PK6 in this embodiment, the heat sink HS and the chip placement portion TAB are separated from each other; and the resin RN is placed between the heat sink HS and the chip placement portion TAB to insulate the heat sink HS and the chip placement portion TAB from each other.

The semiconductor chip CHP is placed over the chip placement portion TAB with solder PST2 (not shown in FIG. 46B) in between. The source pad (not shown in FIG. 46B) formed in the front surface of the semiconductor chip CHP and the source terminal ST are coupled together through the wire W2. The position of the chip placement portion TAB is lower than the position of the source terminal ST and the heat sink HS is placed below the chip placement portion TAB with resin RN in between.

The following is a summary of the above configuration of the package PK6. The package PK6 in this embodiment includes: (a) the heat sink HS having a first front surface and a first back surface located on the opposite side to the first front surface; and a lead portion having multiple leads (gate terminal GT, source terminal ST, drain terminal DT) and the chip placement portion TAB having a second front surface and a second back surface located on the opposite side to the second front surface. The package PK6 further includes: (c) the semiconductor chip CHP placed over the second front surface of the chip placement portion TAB; and (d) the sealing body MR that seals part of the heat sink HS, part of the lead portion, and the semiconductor chip CHP. The semiconductor chip CHP and the leads (gate terminal GT, source terminal ST, drain terminal DT) making up the lead portion are electrically coupled with each other. In the sealing body MR, the first front surface of the heat sink HS and the second back surface of the chip placement portion TAB are so arranged that they are opposed to each other. The first front surface of the heat sink HS and the second back surface of the chip placement portion TAB are electrically insulated from each other.

The above-mentioned semiconductor chip CHP is a chip including a power transistor (power MOSFET). The semiconductor chip CHP includes the source pad SP and the gate pad GP in the chip front surface and the drain electrode in the chip back surface located on the opposite side to the chip front surface. Meanwhile, the lead portion includes a source lead (source terminal ST), a gate lead (gate terminal GT), and a drain lead (drain terminal DT). The chip placement portion TAB and the drain lead (drain terminal DT) are joined with each other. The second front surface of the chip placement portion TAB and the drain electrode formed in the chip back surface of the semiconductor chip CHP are electrically coupled with each other through a first conductive member (solder). The source pad SP and the source lead (source terminal ST) are electrically coupled with each other through a second conductive member (wire W2); and the gate pad GP and the gate lead (gate terminal GT) are electrically coupled with each other through a third conductive member (wire W1).

Description will be given to a configuration with which the package PK6 is mounted over a mounting substrate. FIGS. 47A and 47B illustrate how the package PK6 in this embodiment is mounted over the mounting substrate SUB. FIG. 47A is a drawing illustrating how the package PK6 is mounted over the mounting substrate SUB as viewed from front; and FIG. 47B is a sectional view illustrating how the package PK6 is mounted over the mounting substrate SUB as viewed laterally.

As illustrated in FIG. 47A and FIG. 47B, the gate terminal GT, drain terminal DT, and source terminal ST formed in the package PK6 are inserted into the mounting substrate SUB. As a result, the package PK6 is mounted over the mounting substrate SUB. It is seen that the package PK6 is fixed over a radiation fin FIN with a screw SCR with silicon grease SG in between.

(1) Description will be given to features of the technical idea of the invention. As illustrated in, for example, FIG. 46B, a first feature of the technical idea of the invention is that: the chip placement portion TAB formed integrally with an outer lead (drain terminal) is provided; the semiconductor chip CHP is placed over this chip placement portion TAB and resin RN is placed between the chip placement portion TAB and the heat sink HS; the chip placement portion TAB and the heat sink HS are thereby electrically separated from each other. This makes it possible to electrically separate the drain electrode of the semiconductor chip CHP placed over the chip placement portion TAB and the heat sink HS from each other.

As illustrated in, for example, FIG. 47B, as a result, the following can be implemented: the heat sink HS can be exposed from the back surface of the package PK6 in this embodiment and the heat sink HS and the radiation fin FIN can be directly joined together through the silicon grease SG. The reason for this is as described below. In the package PK6 in this embodiment, the heat sink HS and the chip placement portion TAB over which the semiconductor chip CHP is placed are electrically separated from each other; therefore, the drain electrode of the semiconductor chip CHP is not electrically coupled with the radiation fin FIN even though the heat sink HS and the radiation fin FIN are directly joined together. In the package PK6 in this embodiment, consequently, it is unnecessary to place an insulation sheet between the heat sink HS and the radiation fin FIN. This makes it possible to reduce the cost and the work burden as compared with cases where an insulation sheet is used. In the package PK6 in this embodiment, in addition, the heat sink HS and the radiation fin FIN can be directly joined together without placing an insulation sheet between the heat sink HS and the radiation fin FIN. Therefore, the efficiency of heat radiation from the heat sink HS to the radiation fin FIN can be enhanced. That is, in the package PK6 in this embodiment, the disadvantage of the package PK4 illustrated in FIG. 35B can be overcome.

(2) A second feature of the technical idea of the invention is as illustrated in, for example, FIG. 46B. That is, the heat sink HS and the radiation fin FIN can be joined together without placing an insulation sheet between the heat sink HS and the radiation fin FIN even though the heat sink HS is exposed from the sealing body MR. Therefore, it is unnecessary to take the trouble to cover the entire heat sink HS with the sealing body MR. More specific description will be given. In the package PK6 in this embodiment, the heat sink HS is electrically separated from the chip placement portion TAB over which the semiconductor chip CHP is placed. Therefore, it is possible to expose the heat sink HS from the bottom portion of the sealing body MR and directly join the heat sink HS and the radiation fin FIN together. As a result, in the package PK6 in this embodiment, it is unnecessary to cover the entire heat sink HS with resin RN to directly join the heat sink HS and the radiation fin FIN together like the package PK5 illustrated in FIG. 38B. This means that in the package PK6 in this embodiment, such a structure in which an area unfilled with resin RN is formed in part of the sealing body MR can be avoided. This makes it possible to enhance the reliability of the package PK6 in this embodiment. That is, in the package PK6 in this embodiment, the disadvantage of the package PK5 can be overcome.

(3) A third feature of the technical idea of the invention is as follows. As illustrated in, for example, FIG. 46B, the heat sink HS and the chip placement portion TAB are separated from each other. This makes it easier to arbitrarily set, for example, the thickness of the chip placement portion TAB and the thickness of the heat sink HS. For example, when the drain terminal (outer lead) DT and the heat sink HS are integrally formed, it is difficult to make the thickness of the drain terminal DT and the thickness of the heat sink HS different from each other. Meanwhile, when the heat sink HS and the chip placement portion TAB are so configured that they are separated from each other as in the package PK6, it is easy to separately design the following thicknesses: the thickness of the chip placement portion TAB and the thickness of the heat sink HS. For example, the thickness of the heat sink HS can be made larger than the thickness of the chip placement portion TAB from the view point of the enhancement of the heat radiation efficiency of the heat sink HS. Meanwhile, the thickness of the heat sink HS can be made smaller than the thickness of the chip placement portion TAB from the view point of further reducing the profile of the package PK6. Needless to add, it is possible to make the thickness of the heat sink HS and the thickness of the chip placement portion TAB equal to each other. As mentioned above, in the package PK6 in this embodiment, the heat sink HS and the chip placement portion TAB are separated from each other; therefore, an advantage of the enhanced degree of freedom in designing the heat sink HS and the chip placement portion TAB is also obtained.

(4) A fourth feature of the technical idea of the invention, which relates to the above-mentioned third feature, is as follows. As illustrated in, for example, FIG. 46B, the heat sink HS and the chip placement portion TAB are separated from each other. Therefore, it is easy to make, for example, the material of the chip placement portion TAB and the material of the heat sink HS different from each other. For example, when the drain terminal (outer lead) DT and the heat sink HS are integrally formed, it is difficult to make the material of the drain terminal DT and the material of the heat sink HS different from each other. Meanwhile, when the heat sink HS and the chip placement portion TAB are so configured that they are separated from each other as in the package PK6 in this embodiment, it is easy to separately design the following materials: the material of the chip placement portion TAB and the material of the heat sink HS. For example, a material high in thermal conductivity can be used from the view point of the enhancement of the heat radiation efficiency of the heat sink HS. For example, it is possible to use copper as the material of the chip placement portion TAB and aluminum as the material of the heat sink HS. According to the technical idea of the invention, as mentioned above, the efficiency of heat radiation from the heat sink HS can be further enhanced through a combination of the following configurations: a configuration in which the heat sink HS is exposed from the bottom surface of the sealing body MR and a configuration in which the thickness and material of the heat sink HS are coordinated.

Figure 48:
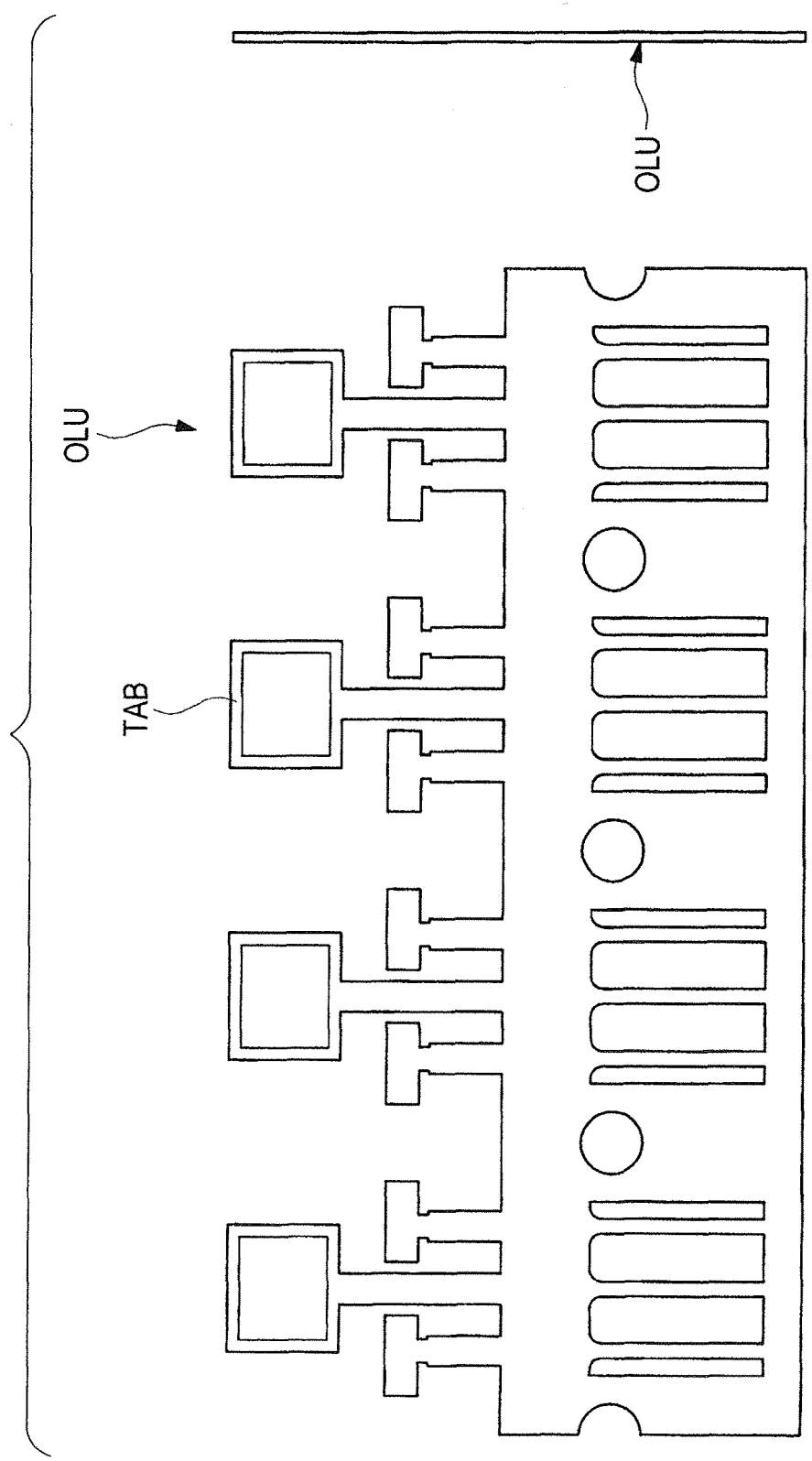
FIG. 48 is a drawing illustrating a manufacturing process of a semiconductor device in an embodiment.

The package PK6 (semiconductor device) in this embodiment is configured as mentioned above and hereafter, description will be given to an example of a manufacturing method thereof with reference to drawings. As illustrated in FIG. 48, first, an outer lead unit (second frame) OLU in which multiple lead portions each having multiple outer leads and a chip placement portion TAB are tied together is prepared. At this stage, the outer lead unit OLU is accepted as is flattened (straight state) with transportation after purchase taken into account. That is, the outer lead unit OLU is prepared as is in the straight state in consideration of the suppression of bulkiness in packing, the prevention of bending of the frame, and the like.

Figure 49:
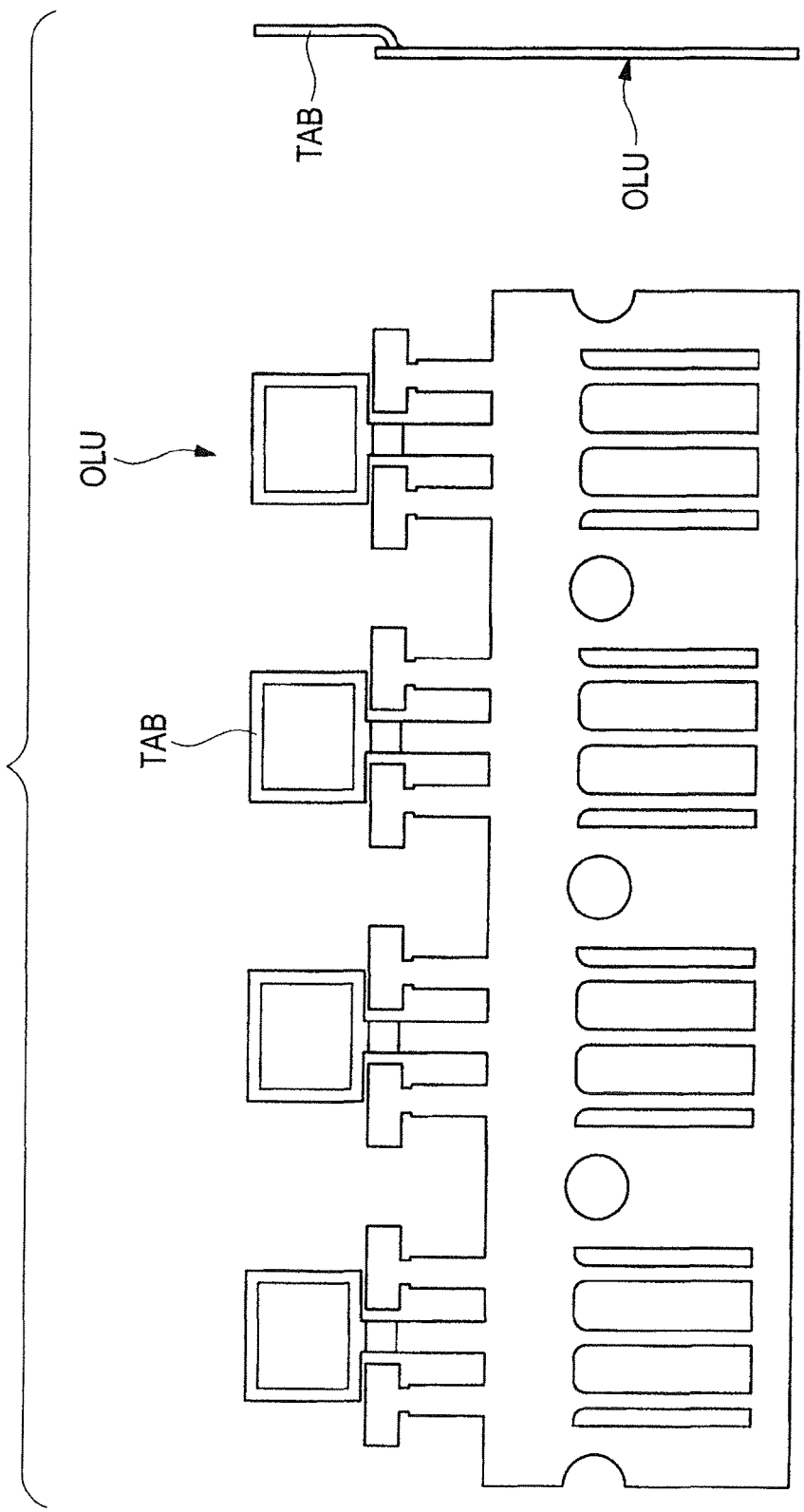
FIG. 49 is a drawing illustrating the manufacturing process of the semiconductor device, following FIG. 48.

As illustrated in FIG. 49, subsequently, the outer lead unit OLU is formed so that the front surface of each chip placement portion TAB is positioned lower than the surfaces of the multiple outer leads. This forming step for the outer lead unit OLU is carried out by bending the chip placement portions TAB by press.

Figure 50:
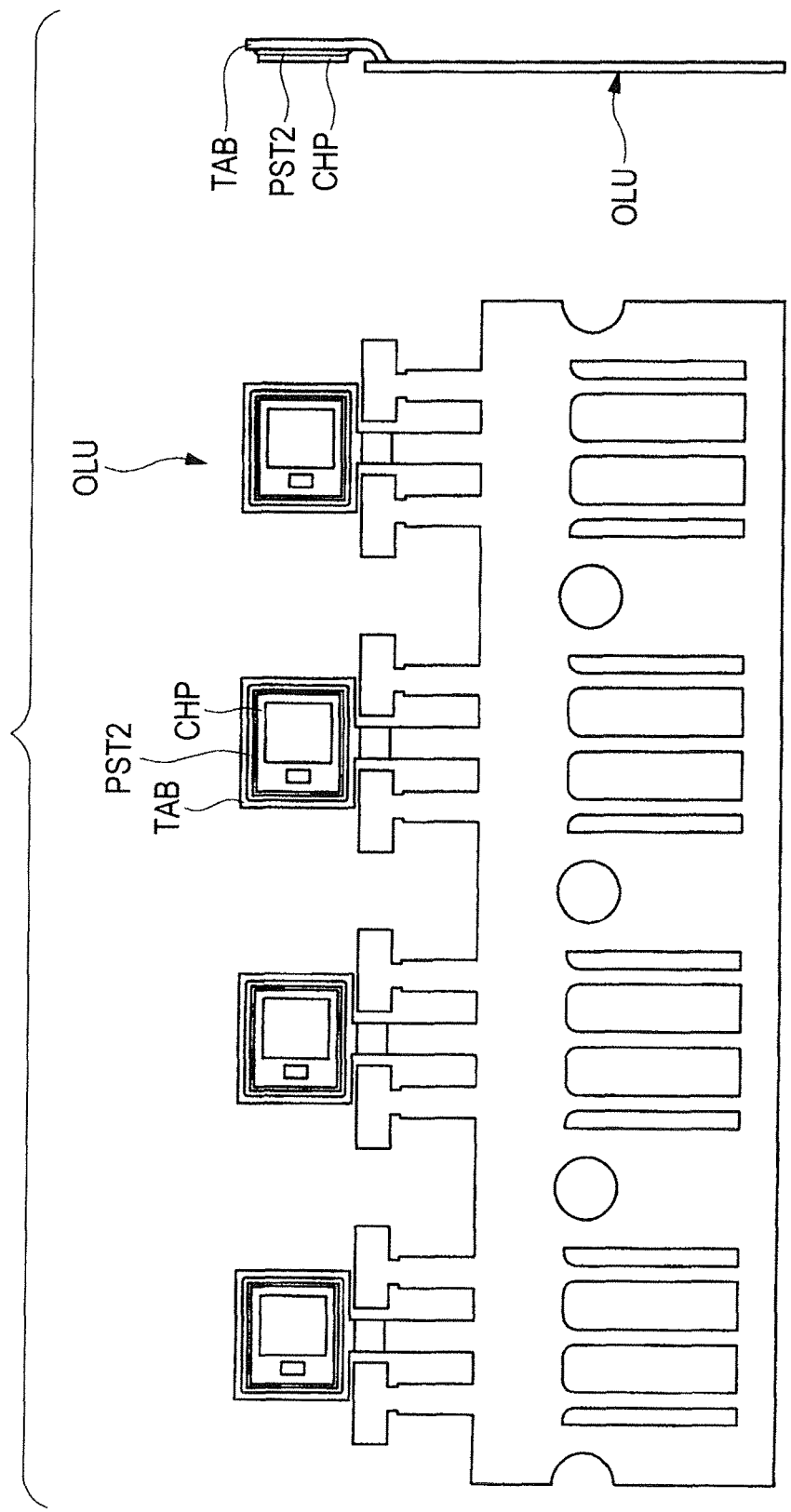
FIG. 50 is a drawing illustrating the manufacturing process of the semiconductor device, following FIG. 49.

As illustrated in FIG. 50, subsequently, solder PST2 is applied to each chip placement portion TAB. Then a semiconductor chip CHP is placed over the chip placement portion TAB with solder PST2 applied thereto (die bonding) and heating processing is carried out. As the result of this step, the drain electrode formed in the back surface of each semiconductor chip CHP and each chip placement portion TAB are electrically coupled with each other.

The back surface of each semiconductor chip CHP is metalized like, for example, Ti/Ni/Au, Ti/Ni/Ag, Ni/Ti/Ni/Au, or the like outward from the chip side. The solder PST2 and Ni under Au form an alloy and the drain electrode formed in the back surface of each semiconductor chip CHP and each chip placement portion TAB are thereby electrically coupled with each other.

Figure 51:
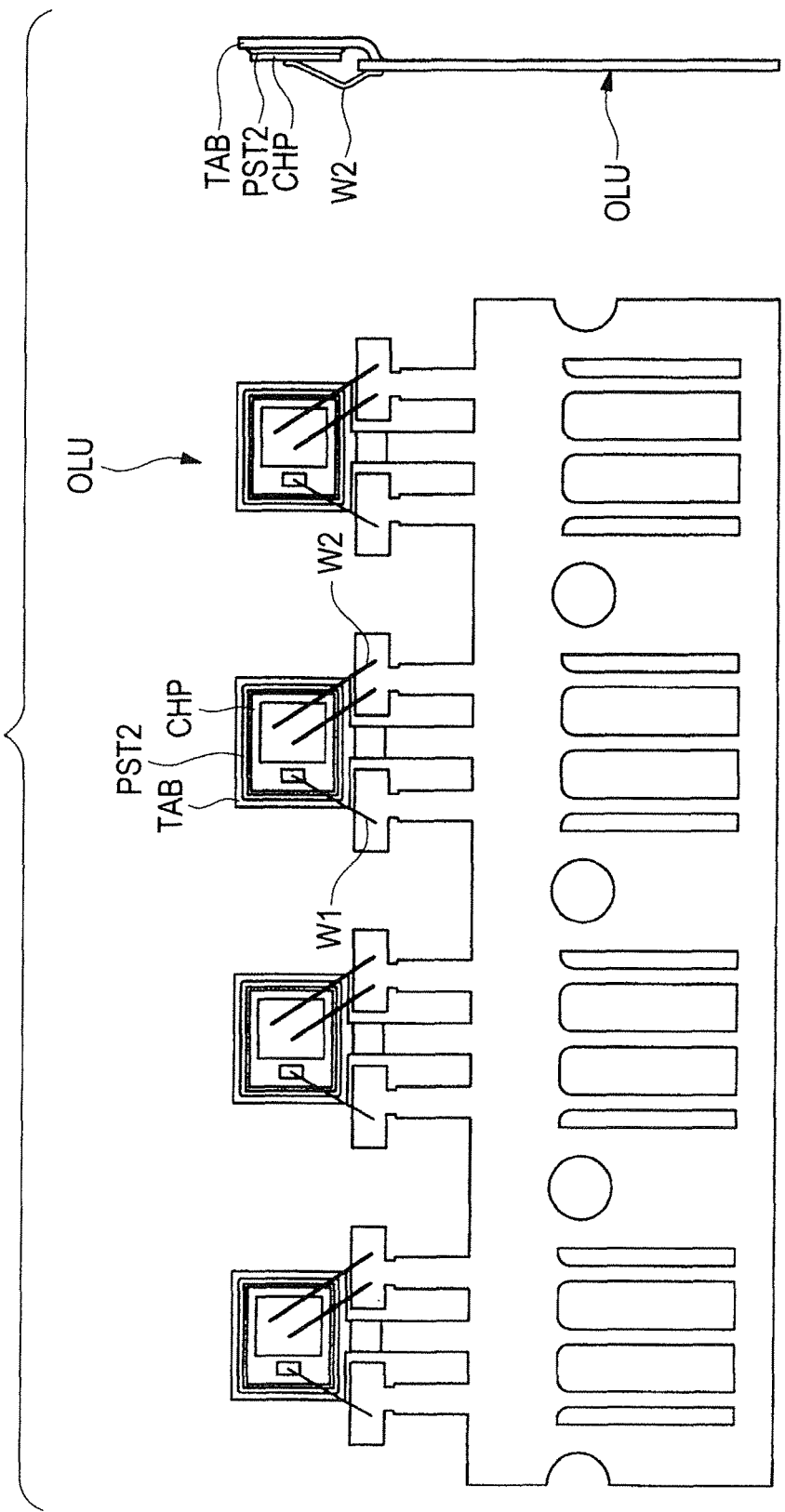
FIG. 51 is a drawing illustrating the manufacturing process of the semiconductor device, following FIG. 50.

As illustrated in FIG. 51, thereafter, the semiconductor chip CHP placed over each chip placement portion TAB and outer leads are joined with each other through wires (wire bonding). Specifically, the gate pad formed in the front surface of each semiconductor chip CHP and a gate terminal (outer lead) are joined together through a wire W1; and the source pad formed in the front surface of each semiconductor chip CHP and a source terminal (outer lead) are jointed together through a wire W2. At this time, the wire diameter of the wire W2 is larger than the wire diameter of the wire W1 and the number of wires W1 is one while the number of wires W2 is more than one (two or above).

It is desirable that the wire W2 larger in wire diameter than the wire W1 should be subjected to wire bonding first. The reason for this is as described below. In wire bonding, in general, an ultrasonic wave larger in power is applied to a wire larger in wire diameter than to a wire smaller in the same. Therefore, if a wire smaller in wire diameter is bonded first and then a wire larger in wire diameter is bonded, the ultrasonic wave at that time transmits through the chip; and this increases the possibility that the wire smaller in wire diameter is displaced from a bonding pad.

Then part of each heat sink HS, part of each outer lead, each chip placement portion TAB, and each semiconductor chip CHP are sealed with resin to form the sealing body MR (resin sealing step). Hereafter, detailed description will be given to this resin sealing step.

Figure 52:
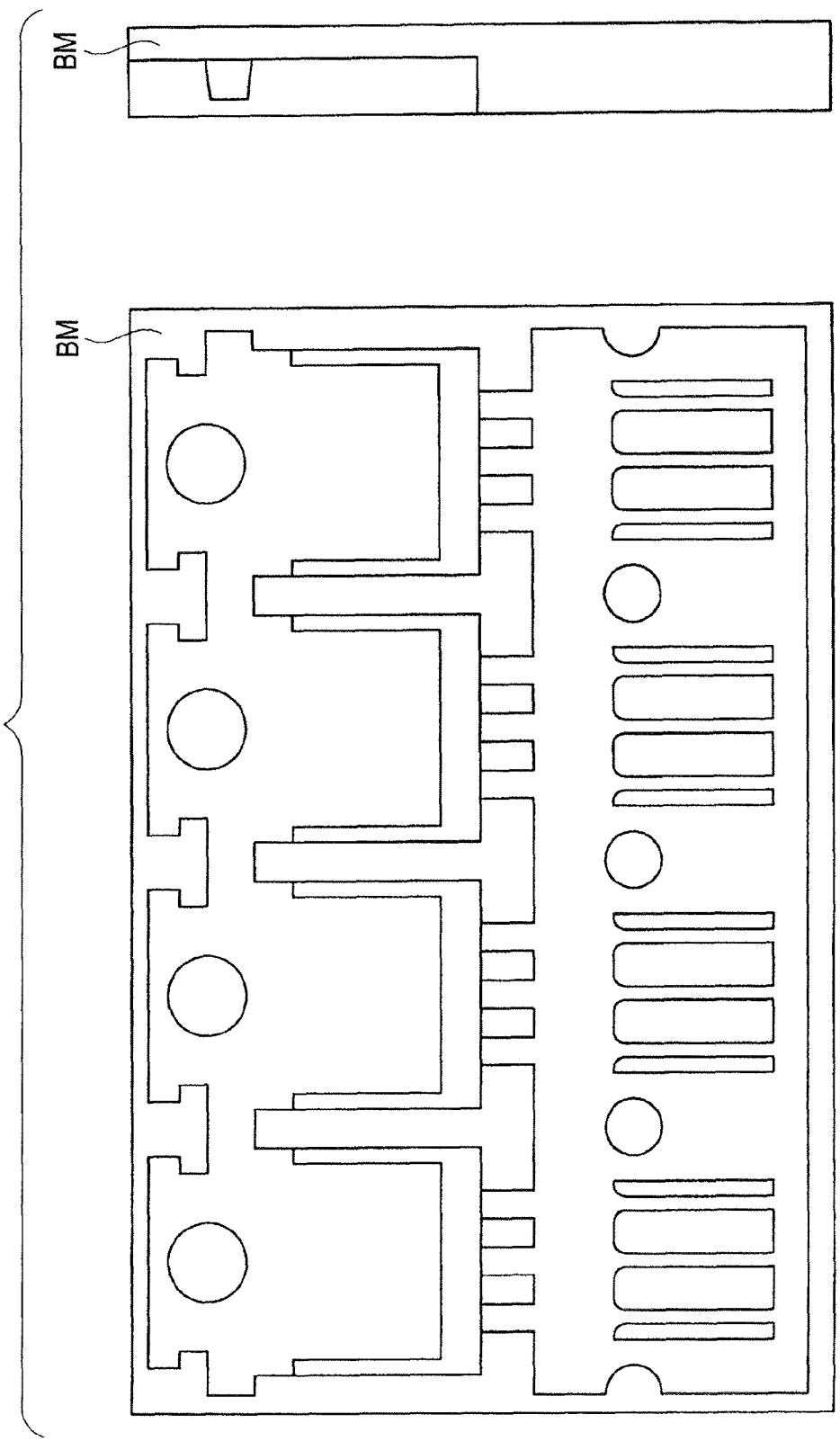
FIG. 52 is a drawing illustrating the manufacturing process of the semiconductor device, following FIG. 51.
Figure 53:
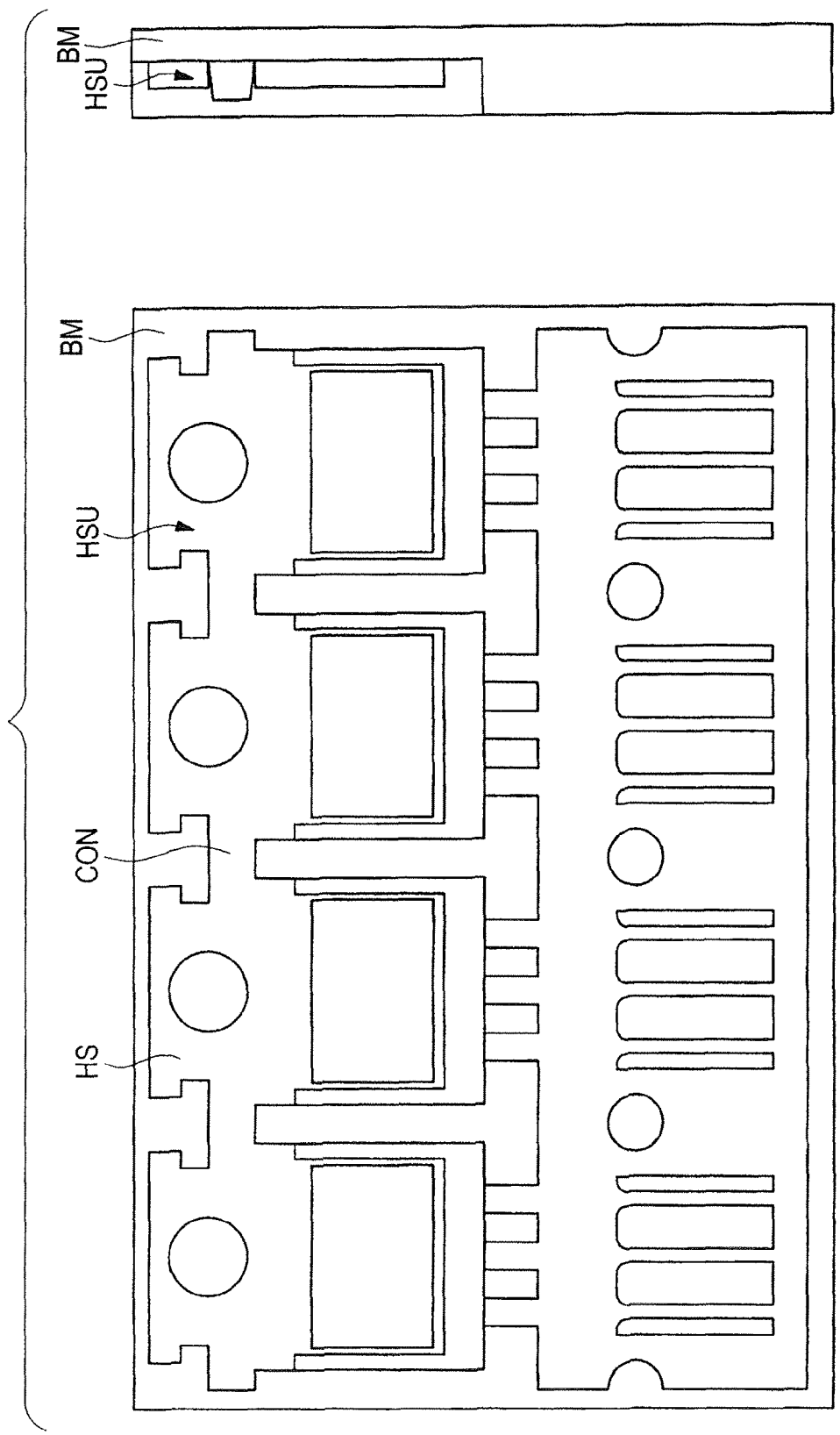
FIG. 53 is a drawing illustrating the manufacturing process of the semiconductor device, following FIG. 52.

As illustrated in FIG. 52, first, a lower die (second die) BM is prepared. Then, as illustrated in FIG. 53, a heat sink unit (first frame) HSU in which multiple heat sinks HS are tied together through tying portions CON is prepared. Thereafter, the prepared heat sink unit HSU is set in the lower die BM.

As illustrated in FIG. 54, subsequently, the following unit is also set in the lower die BM: an outer lead unit OLU in which a semiconductor chip CHP has been placed over each chip placement portion TAB and the semiconductor chips CHP and outer leads have been joined together through wires W1 and wires W2. As is apparent from FIG. 54, at this time, the units are so set that the following is implemented: each chip placement portion TAB formed in the outer lead unit OLU and each heat sink HS formed in the heat sink unit HSU overlap with each other as viewed in a plane; and each chip placement portion TAB and each heat sink HS are not in contact with each other in the direction of height. In other words, each chip placement portion TAB and each heat sink HS are so placed that a space (gap) is provided between them.

As illustrated in FIG. 55, subsequently, an upper die (first die) UM is placed over the lower die BM in which the heat sink unit HSU and the outer lead unit OLU are set. Thereafter, resin is injected into the internal space sandwiched between the upper die UM and the lower die BM to from each sealing body. Hereafter, description will be given to the step of injecting resin into the internal space sandwiched between the upper die UM and the lower die BM to form each sealing body.

FIG. 56A to FIG. 60C illustrate the resin sealing step for forming the sealing bodies MR. Especially, FIG. 56A, FIG. 57A, FIG. 58A, FIG. 59A, and FIG. 60A are sectional views for explaining how a resin injection process is carried out in the following state: a state in which the heat sinks HS and the chip placement portions TAB integrated with outer leads are clamped between the upper die UM and the lower die BM. FIG. 56B, FIG. 57B, FIG. 58B, FIG. 59B, and FIG. 60B are plan views of the resin injection process as seen through the upper die UM from above. FIG. 56C, FIG. 57C, FIG. 58C, FIG. 59C, and FIG. 60C are plan views of the resin injection process as seen through the lower die BM from below.

Figure 56A:
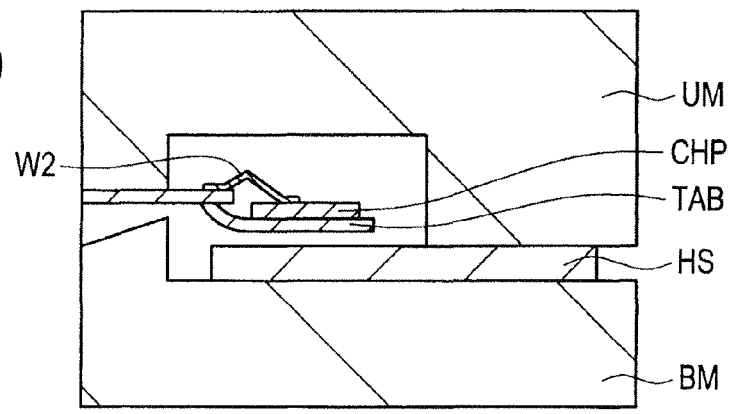
FIG. 56A is a drawing illustrating a resin sealing step of a package in an embodiment.
Figure 56B:
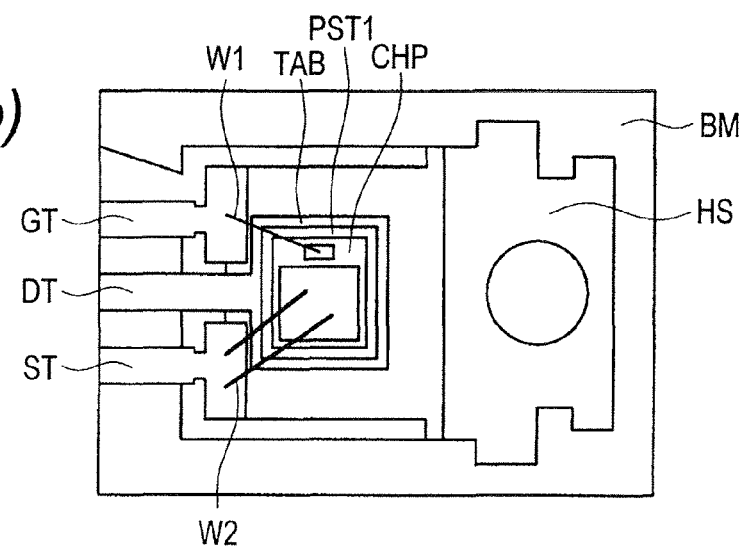
FIG. 56B is a drawing illustrating the resin sealing step of the package in the embodiment.
Figure 56C:
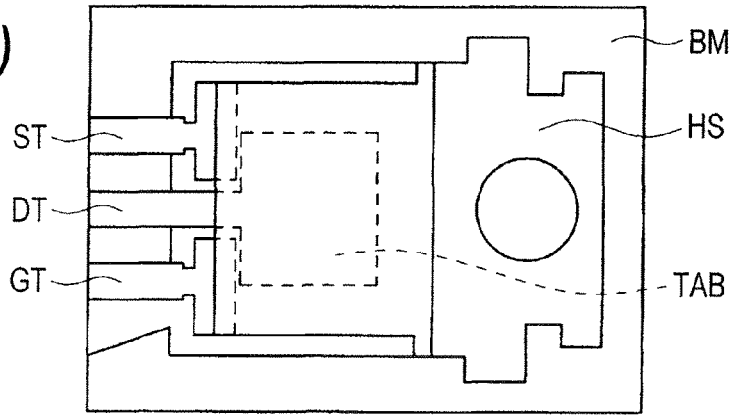
FIG. 56C is a drawing illustrating the resin sealing step of the package in the embodiment.

As illustrated in FIG. 56A to FIG. 56C, first, the heat sink HS and the chip placement portion TAB integrated with outer leads are clamped between the upper die UM and the lower die BM. At this time, the heat sink HS and the chip placement portion TAB are placed in the internal space (sealing space) sandwiched between the upper die UM and the lower die BM. Between the heat sink HS and the chip placement portion TAB, there is a gap (space) in the direction of height. That is, the heat sink HS and the chip placement portion TAB are physically separated from each other. The semiconductor chip CHP has been placed over the chip placement portion TAB.

Figure 57A:
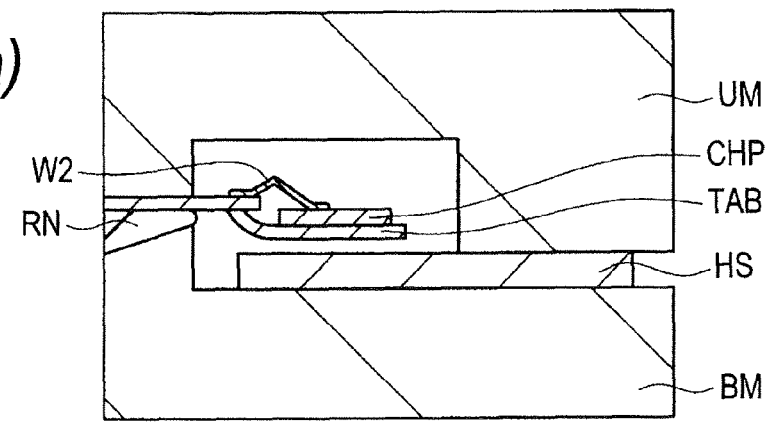
FIG. 57A is a drawing illustrating the resin sealing step of the package, following FIG. 56A.
Figure 57B:
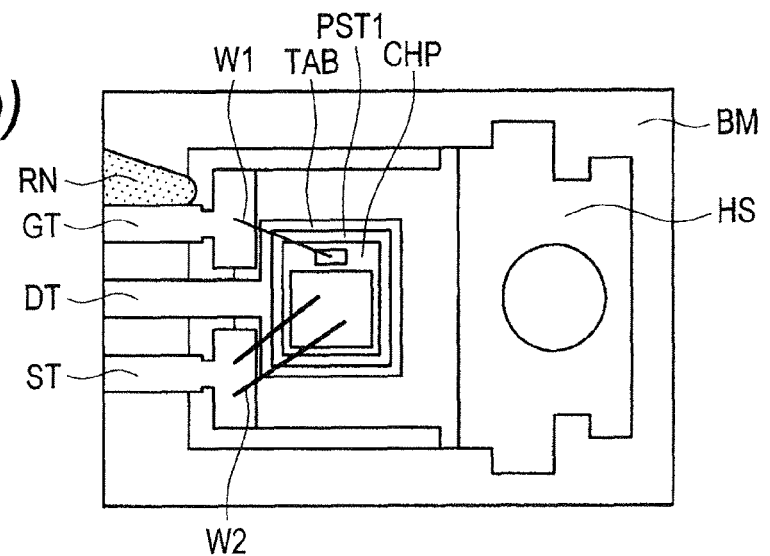
FIG. 57B is a drawing illustrating the resin sealing step of the package, following FIG. 56B.
Figure 57C:
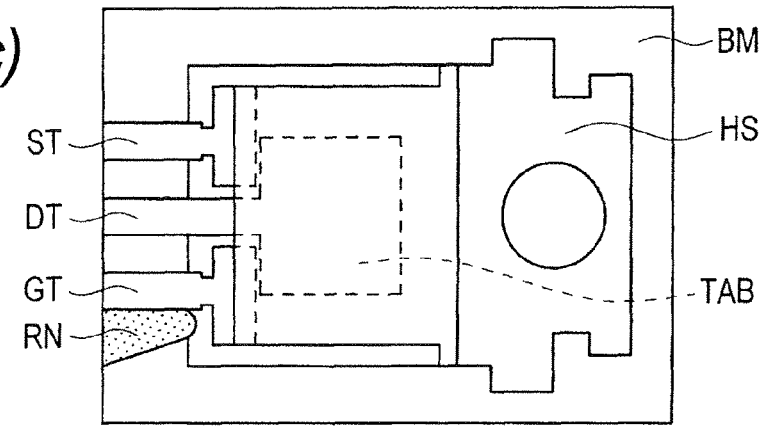
FIG. 57C is a drawing illustrating the resin sealing step of the package, following FIG. 56C.
Figure 58A:
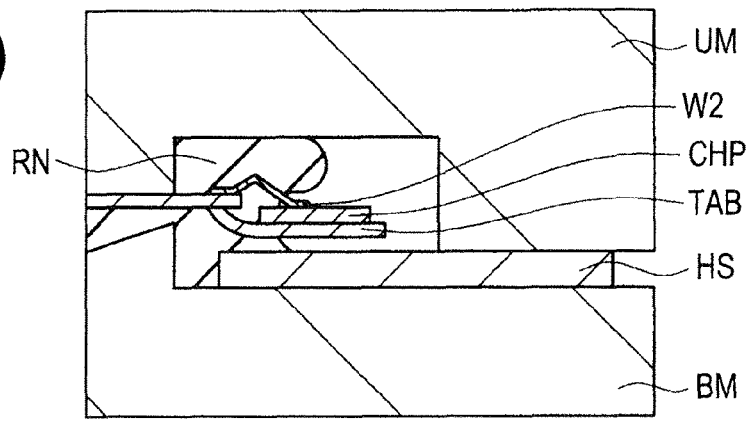
FIG. 58A is a drawing illustrating the resin sealing step of the package, following FIG. 57A.
Figure 58B:
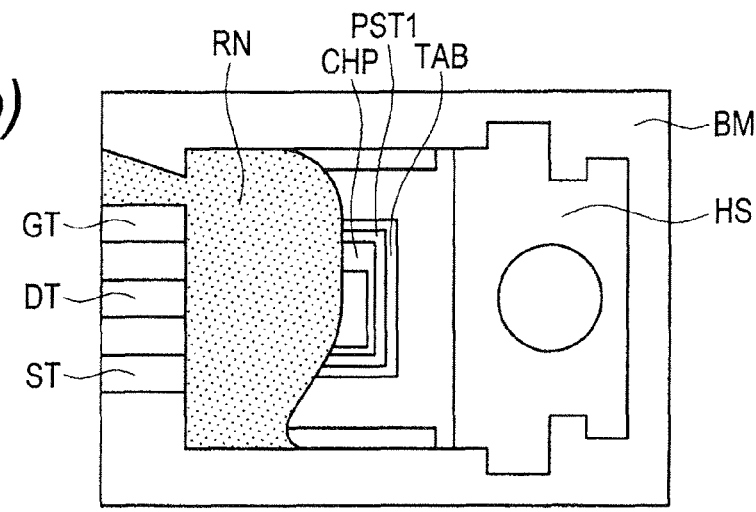
FIG. 58B is a drawing illustrating the resin sealing step of the package, following FIG. 57B.
Figure 58C:
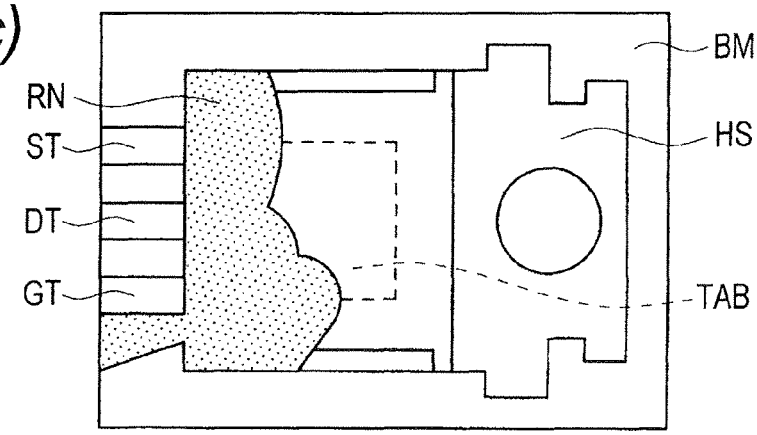
FIG. 58C is a drawing illustrating the resin sealing step of the package, following FIG. 57C.

As illustrated in FIG. 57A to FIG. 57C, subsequently, injection of resin RN into the internal space sandwiched between the upper die UM and the lower die BM is started. As the injection of resin RN into the internal space is continued, the resin RN is gradually filled in the internal space as illustrated in FIG. 58A to FIG. 58C. Specifically, the resin RN is filled throughout the areas over and under the chip placement portion TAB. At this time, the resin RN is injected also into the gap provided between the chip placement portion TAB and the heat sink HS.

Figure 59A:
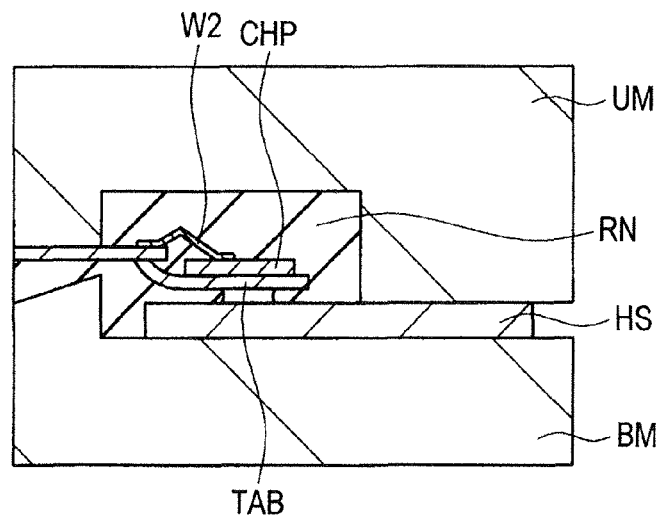
FIG. 59A is a drawing illustrating the resin sealing step of the package, following FIG. 58A.
Figure 59B:
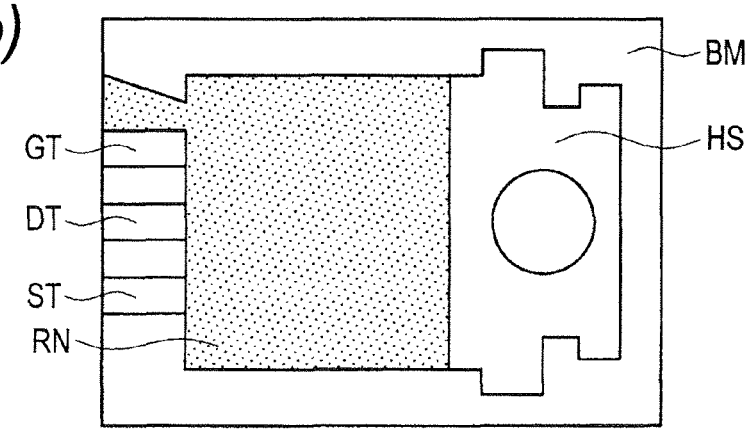
FIG. 59B is a drawing illustrating the resin sealing step of the package, following FIG. 58B.
Figure 59C:
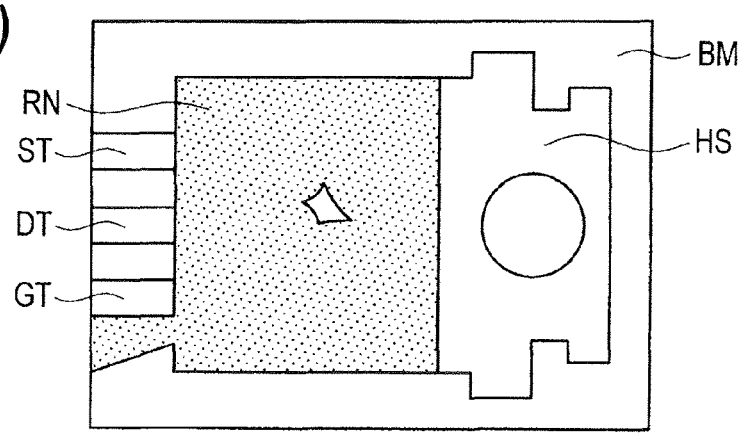
FIG. 59C is a drawing illustrating the resin sealing step of the package, following FIG. 58C.
Figure 60A:
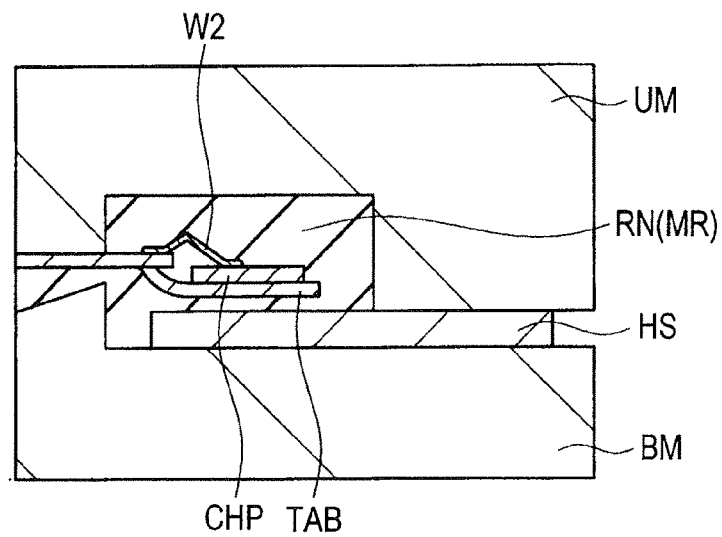
FIG. 60A is a drawing illustrating the resin sealing step of the package, following FIG. 59A.
Figure 60B:
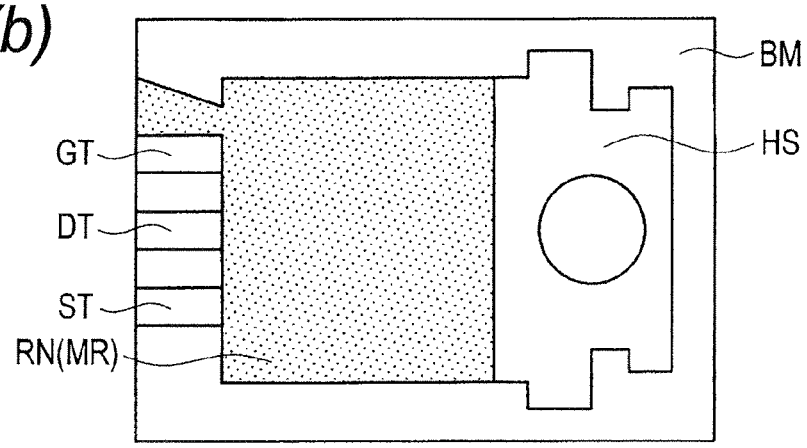
FIG. 60B is a drawing illustrating the resin sealing step of the package, following FIG. 59B.
Figure 60C:
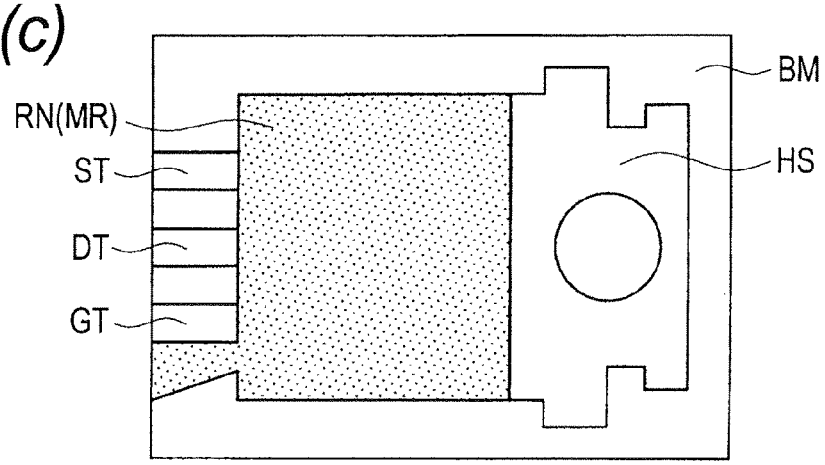
FIG. 60C is a drawing illustrating the resin sealing step of the package, following FIG. 59C.

As illustrated in FIG. 59A to FIG. 59C, thereafter, the area over the chip placement portion TAB is completely filled first with the resin RN injected into the internal space. Then the gap provided between the chip placement portion TAB and the heat sink HS is also gradually filled with the resin RN. Then, as illustrated in FIG. 60A to FIG. 60C, the internal space sandwiched between the upper die UM and the lower die BM is entirely filled with the resin RN and the sealing body MR is formed. At this time, the gap located between the chip placement portion TAB and the heat sink HS is also completely filled with the resin RN.

In this embodiment, the resin RN is interposed between the chip placement portion TAB and the heat sink HS to separate and insulate the chip placement portion TAB and the heat sink HS from each other. The thickness of this resin RN interposed between the chip placement portion TAB and the heat sink HS is determined from the view point of achieving both the securement of dielectric strength and the enhancement of heat radiation characteristic. Therefore, it is estimated that the thickness of the resin RN interposed between the chip placement portion TAB and the heat sink HS is substantially equal to the following thickness: the thickness of the resin RN present under the heat sink HS in the above-mentioned package PK5 of full mold type. Therefore, it is suspected that such a problem of the formation of an area unfilled with resin RN as in the package PK5 of full mold type arise also when the following processing is carried out in this embodiment: resin RN is filled in the gap formed between the chip placement portion TAB and the heat sink HS. In this embodiment, however, it is supposed that there is hardly no possibility that an unfilled area is formed when resin RN is filled in the gap formed between the chip placement portion TAB and the heat sink HS.

The reason for this will be described below. In the above-mentioned package PK5 of full mold type, for example, the area of the heat sink HS is large and resin RN is less prone to go round from the periphery of the heat sink HS toward the center. For this reason, it is supposed that an area unfilled with resin RN is prone to be formed under the central part of the heat sink HS. In the package PK6 in this embodiment, meanwhile, the area of the chip placement portion TAB is as small as the area of the semiconductor chip CHP. Since the area of the chip placement portion TAB is small, the resin RN that went round from the periphery of the chip placement portion TAB toward the center easily reaches the center point of the chip placement portion TAB. In this embodiment, therefore, the resin RN that went round from the periphery of the chip placement portion TAB small in area is prone to reach the area located under the center of the chip placement portion TAB. For this reason, it is possible to suppress the production of an unfilled area in the gap formed between the chip placement portion TAB and the heat sink HS.

After each sealing body MR is formed as mentioned above, the heat sink unit HSU and the outer lead unit OLU are taken out of the upper die UM and the lower die BM and cut and formed to manufacture individual packages PK6. The package PK6 (semiconductor device) in this embodiment can be manufactured as mentioned above.

<Problem Involved in Third Package Product>

Description will be given to an example in which the technical idea of the invention is applied to a third package product. First, description will be given to a problem involved in the third package product with reference to drawings.

Figure 61:
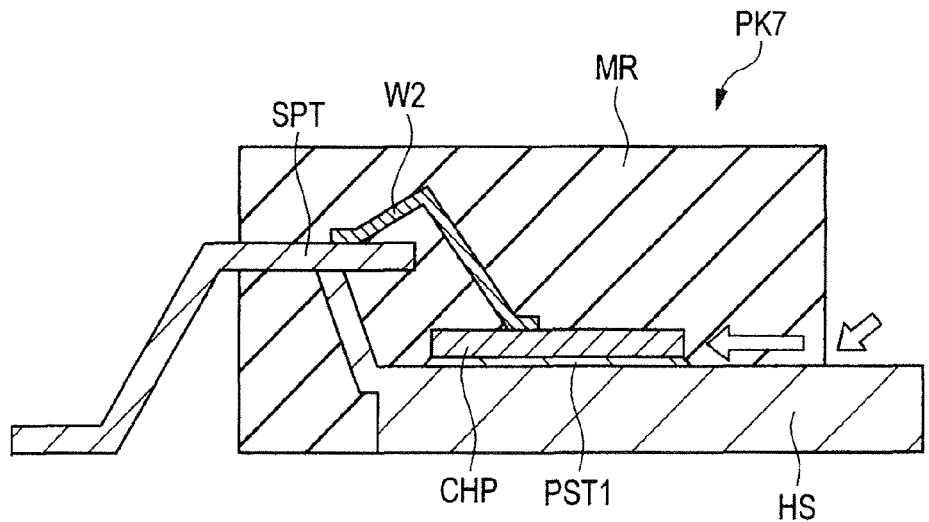
FIG. 61 is a sectional view illustrating the structure of a seventh package.

FIG. 61 is a sectional view illustrating the structure of a package PK7 applied to the third package product. In the package PK7, as illustrated in FIG. 61, a heat sink HS and outer leads are integrally formed. A semiconductor chip CHP is placed over the heat sink HS with solder PST1 in between. For example, this semiconductor chip CHP and a source lead post SPT joined to an outer lead are electrically coupled with each other through a wire W2. The semiconductor chip CHP, source lead post SPT, and wire W2 are sealed with a sealing body MR formed of resin. Meanwhile, part of the heat sink HS is exposed from the bottom surface of the sealing body MR.

In the package PK7 configured as mentioned above, the heat sink HS is formed of, for example, copper material while the sealing body MR is formed of, for example, epoxy resin. That is, in the package PK7, the heat sink HS and the sealing body MR are formed of different materials and this weakens the adhesion between the heat sink HS and the sealing body MR. For this reason, when, for example, a heat cycle test is conducted on the package PK7, peeling occurs in the boundary, weak in adhesion, between the heat sink HS and the sealing body MR. When this peeling progresses in the direction of arrows in FIG. 61 and reaches the solder PST1 joining the heat sink HS and the semiconductor chip CHP together, cracking occurs in this solder PST1. When cracking occurs in the solder PST1, it leads to thermal resistance failure in the package PK7.

Figure 62:
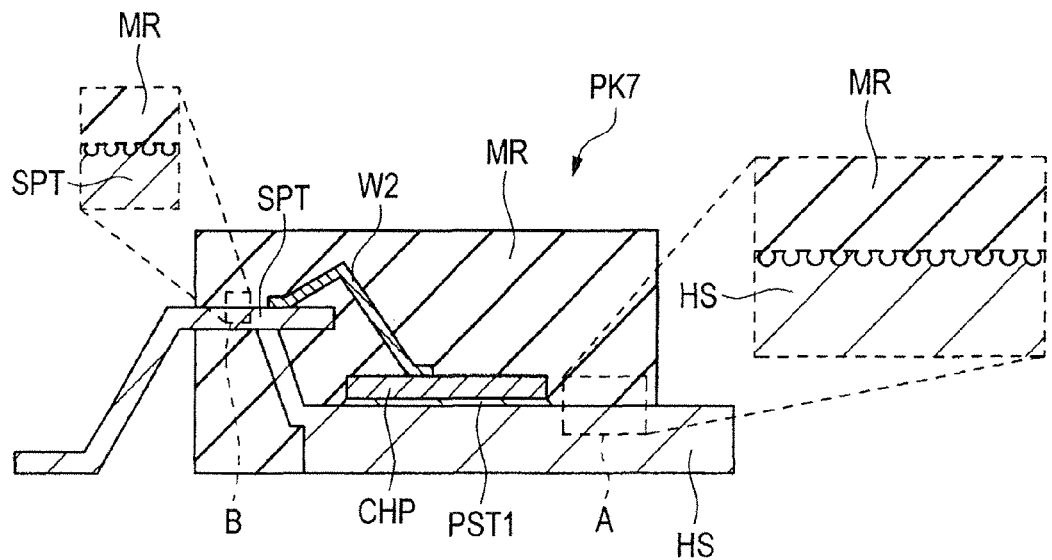
FIG. 62 is a drawing illustrating the configuration of the seventh package and illustrating some areas of the seventh package in an enlarged manner.

Consequently, the front surface of the heat sink HS is roughened to enhance the reliability of the package PK7 (enhance the heat cycle resistance). FIG. 62 illustrates the configuration of the package PK7 and shows part of the package PK7 in an enlarged manner. Attention will be given to an enlarged view of, for example, area A, embracing the boundary between the heat sink HS and the sealing body MR, in FIG. 62. It is seen from the drawing that asperities are formed in the front surface of the heat sink HS. That is, the front surface of the heat sink HS is roughened to form asperities there. As a result, resin enters the asperities formed in the front surface of the heat sink HS and the adhesion between the heat sink HS and the sealing body MR is enhanced by the anchor effect arising from the entry of resin into asperities. Consequently, the heat cycle resistance of the package PK7 is enhanced and thus it is possible to enhance the reliability of the package PK7.

However, when roughening processing is carried out, a new problem arises in the package PK7. Hereafter, description will be given to this problem. In the package PK7, as illustrated in, for example, FIG. 62, the heat sink HS and the source lead post SPT are integrally formed. Therefore, when the front surface of the heat sink HS is roughened, the front surface of the source lead post SPT is also roughened unintentionally. It is seen from the enlarged view of area B, embracing the front surface of the source lead post SPT, in FIG. 62 that asperities are formed also in the front surface of the source lead post SPT. When these asperities are formed in the front surface of the source lead post SPT, a problem that the wire W2 joined to the source lead post SPT is peeled off manifests itself. It is suspected that the cause of this is as follows: the front surface of the source lead post SPT is roughened and thus the adhesion between the source lead post SPT and the wire W2 is degraded.

Therefore, it is supposed that this problem of peeling of the wire W2 joined to the source lead post SPT can be solved by roughening only the front surface of the heat sink HS. However, the technology for partly roughening only the front surface of the heat sink HS in the presence of the integrally formed source lead post SPT and heat sink HS has not developed as of now. More specific description will be given. Roughening is a technology in which the following processing is carried out: the surface of an object (frame material) to be processed is chemically etched to etch only a specific substance contained in the object (frame material) to be processed; and asperities are thereby formed in the surface of the object (frame material) to be processed. It is possible to roughen only one surface by this roughening processing; however, a technology for roughening only part of one surface has not been developed yet.

As mentioned above, roughening the front surface of the heat sink HS is effective in preventing peeling in the boundary between the heat sink HS and the sealing body MR. However, since in the package PK7, the source lead post SPT joined with the wire W2 is formed integrally with the heat sink HS, the following takes place when the front surface of the heat sink HS roughened: the front surface of the source lead post SPT is also roughened automatically. As a result, the problem of peeling of the wire W2 joined with the source lead post SPT manifests itself. That is the structure of the package PK7 involves the following problem: it is difficult to achieve both the improvement of the heat cycle characteristic by the enhancement of adhesion between the heat sink HS and the sealing body MR and the enhancement of the reliability of junction between the source lead post SPT and the wire W2.

To cope with this, the technical idea of the invention is applied to the third package product to achieve both the enhancement of heat cycle characteristic and the enhancement of the reliability of wire junction. Hereafter, description will be given to this technical idea.

<Structure Obtained by Applying the Invention to Third Package Product>

Figure 63:
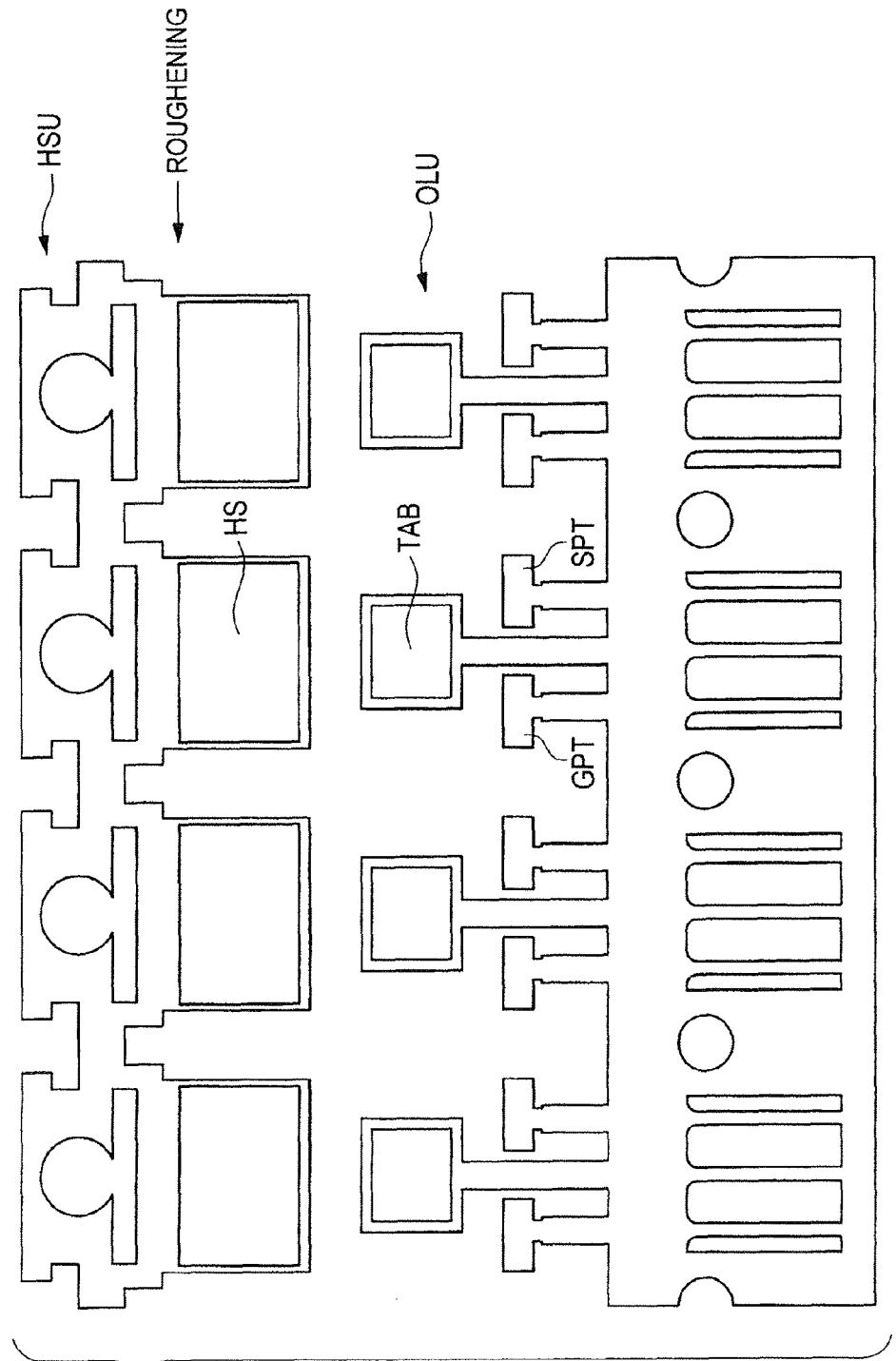
FIG. 63 is a drawing illustrating a frame structure for realizing the technical idea of the invention.

FIG. 63 illustrates a frame structure for implementing the technical idea of the invention. In the technical idea of the invention, as illustrated in FIG. 63, a frame includes a heat sink unit HSU and an outer lead unit OLU and the heat sink unit HSU and the outer lead unit OLU are separated from each other. That is, a feature of the technical idea of the invention is that: a heat sink unit HSU in which multiple heat sinks HS are tied together and an outer lead unit OLU in which source lead posts SPT, gate lead posts GPT, and chip placement portions TAB are formed are separated from each other; and only the heat sink unit HSU is roughened. An advantage of this technical idea of the invention is as follows: only the heat sink unit HSU can be roughened by separating the heat sink unit HSU and the outer lead unit OLU from each other. When the heat sink unit HSU and the outer lead unit OLU are integrally formed, it is difficult to roughen only the heat sink unit HSU. To avoid this, the heat sink unit HSU and the outer lead unit OLU are separated from each other.

Hereafter, description will be given to the structure of a package PK8 in this embodiment formed using the frame illustrated in FIG. 63. FIGS. 64A and 64B illustrate the structure of the package PK8. FIG. 64A is a plan view illustrating the internal structure of the package PK8 and FIG. 64B is a sectional view illustrating the internal structure of the package PK8. The package PK8 is so structured that it is covered with a rectangular sealing body MR and FIG. 64A shows the internal structure of the package PK8 as is seen through this sealing body MR. As illustrated in FIG. 64A, the package PK8 includes a heat sink HS and part of this heat sink HS is exposed from the upper part of the sealing body MR. A chip placement portion TAB is formed over the heat sink HS and the chip placement portion TAB is formed integrally with a drain terminal DT. Therefore, the chip placement portion TAB and the drain terminal DT are electrically coupled with each other.

A semiconductor chip CHP is placed over the chip placement portion TAB with solder PST2 in between. In this semiconductor chip CHP, for example, a power MOSFET is formed. More specific description will be given. The semiconductor chip CHP with the power MOSFET formed therein has a source pad SP and a gate pad GP formed, for example, in the front surface of the semiconductor chip CHP. The gate pad GP is electrically coupled with a gate lead post GPT forming part of a gate terminal (outer lead) GT through a wire W1; and the source pad SP is electrically coupled with a source lead post SPT forming part of a source terminal (outer lead) ST through a wire W2. A drain electrode (not shown) is formed in the back surface of the semiconductor chip CHP and this drain electrode is electrically coupled with a drain terminal (outer lead) through the chip placement portion TAB.

Description will be given to the cross section structure of the package PK8 with reference to FIG. 64B. As illustrated in FIG. 64B, the heat sink HS is so formed that it is exposed from the bottom surface of the sealing body MR and the chip placement portion TAB is placed over the heat sink HS with solder PST1 in between. The semiconductor chip CHP is placed over the chip placement portion TAB with solder PST2 in between. The source pad (not shown in FIG. 64B) formed in the front surface of the semiconductor chip CHP and the source lead post SPT are joined with each other through the wires W2. The position of the chip placement portion TAB is lower than the position of the source lead post SPT and the heat sink HS is placed below this chip placement portion TAB.

(1) A first feature of the package PK8 in this embodiment is as shown in the enlarged view of area A in FIG. 64B. That is, the front surface of the heat sink HS is roughened to form asperities in the front surface of the heat sink HS. As a result, resin enters the asperities formed in the front surface of the heat sink HS. The adhesion between the heat sink HS and the sealing body MR can be enhanced by the anchor effect arising from the entry of resin into asperities. As a result, the heat cycle resistance of the package PK8 is enhanced and thus the reliability of the package PK8 can be enhanced.

(2) A second feature of the package PK8 in this embodiment is as shown in the enlarged view of area B in FIG. 64B. That is, the front surface of the source lead post SPT is not roughened but the front surface of the source lead post SPT is flattened. Since the front surface of the source lead post SPT is not roughened, the wires W2 are less prone to be peeled off from the source lead post SPT. This makes it possible to enhance the reliability of junction between the source lead post SPT and the wires W2.

In the package PK8 in this embodiment, as mentioned above, it is possible to achieve both of the following: the enhancement of adhesion between the heat sink HS and the sealing body MR and the enhancement of the strength of bond between the source lead post SPT and the wires W2. As a result, it is possible to achieve both the enhancement of heat cycle characteristic and the enhancement of the reliability of wire junction. As described with reference to FIG. 63, this remarkable effect is brought about by configuring a frame by separating the following units from each other: the heat sink unit HSU in which multiple heat sinks HS are tied together and the outer lead unit OLU in which source lead posts SPT, gate lead posts GPT, and chip placement portions TAB are formed. As illustrated in FIG. 63, it is possible to roughen only the heat sink unit HSU by separating the heat sink unit HSU and the outer lead unit OLU from each other. As a result, the package PK8 illustrated in FIG. 64A and FIG. 64B can be configured and the above-mentioned remarkable effect can be thereby obtained.

Figure 65:
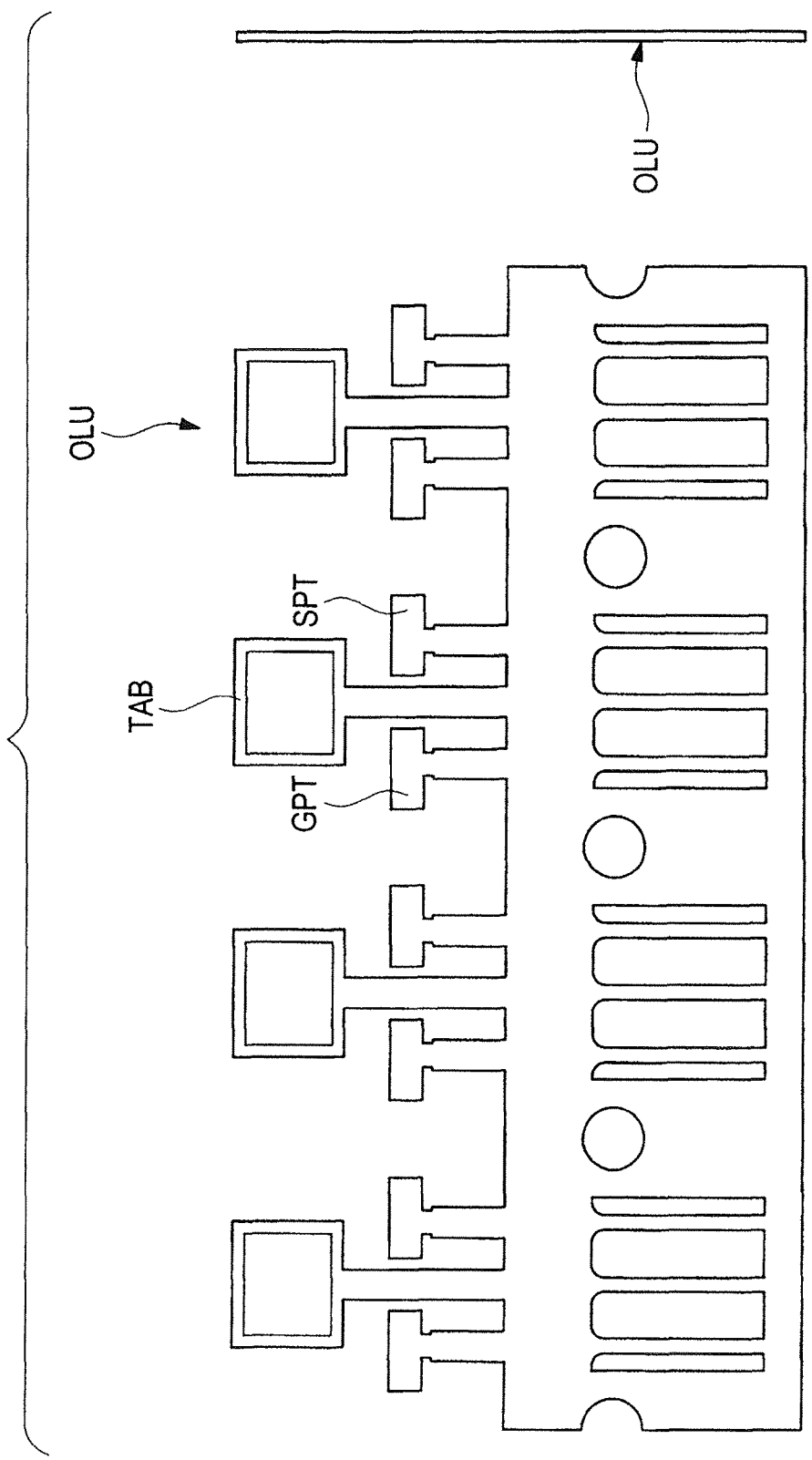
FIG. 65 is a drawing illustrating a manufacturing process of a semiconductor device in an embodiment.

The package PK8 (semiconductor device) in this embodiment is configured as mentioned above and hereafter, description will be given to an example of a manufacturing method thereof with reference to drawings. As illustrated in FIG. 65, first, an outer lead unit (second frame) OLU in which multiple lead portions each having a gate lead post GPT, a source lead post SPT, and a chip placement portion TAB are tied together is prepared. At this stage, the outer lead unit OLU is accepted as is flattened (straight state) with transportation after purchase taken into account. That is, the outer lead unit OLU is prepared as is in the straight state in consideration of the suppression of bulkiness in packing, the prevention of bending of the frame, and the like.

Figure 66:
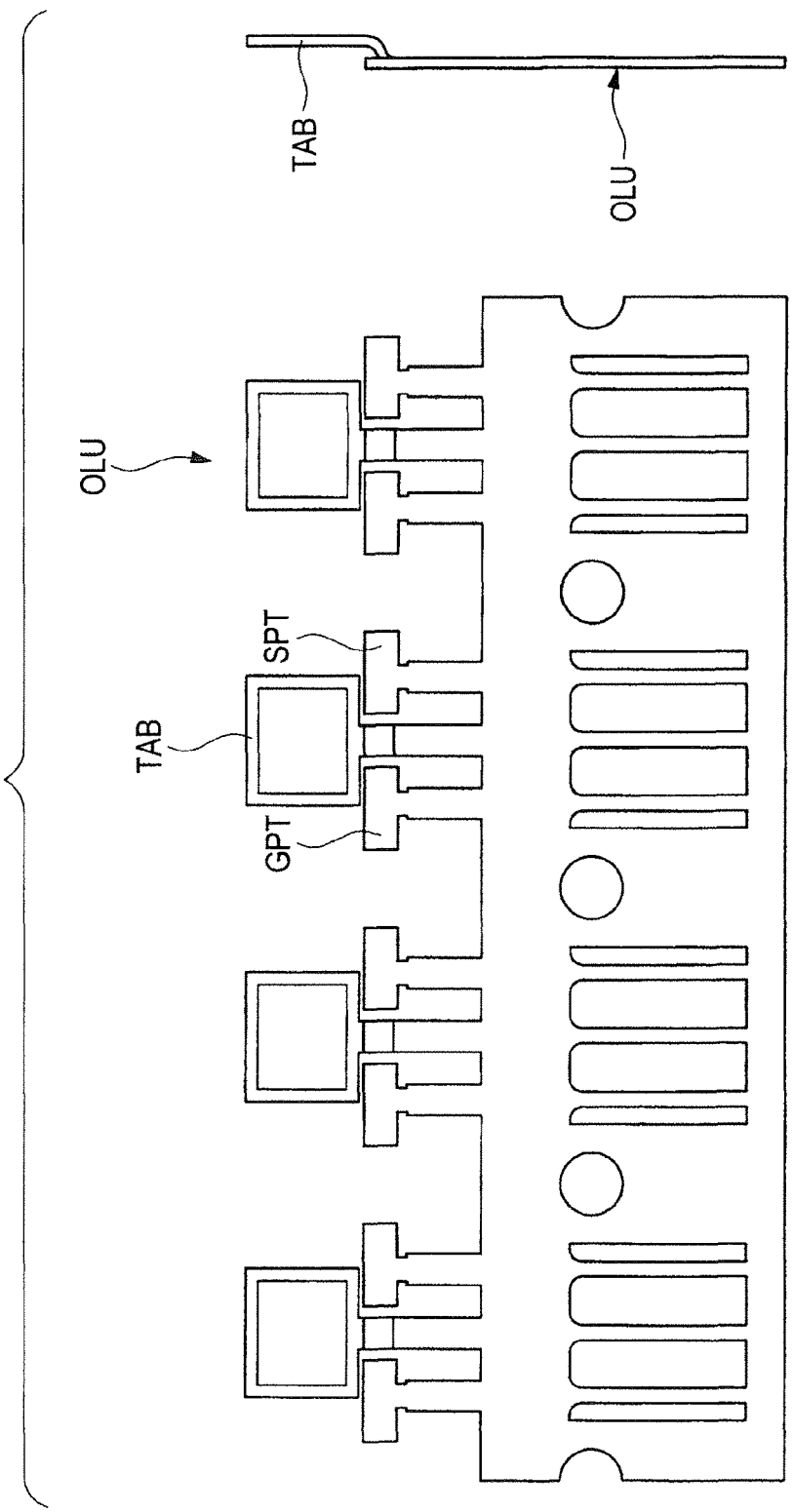
FIG. 66 is a drawing illustrating the manufacturing process of the semiconductor device, following FIG. 65.

As illustrated in FIG. 66, subsequently, the outer lead unit OLU is formed so that the front surface of each chip placement portion TAB is positioned lower than the surfaces of the gate lead posts GPT and the source lead posts SPT. This forming step for the outer lead unit OLU is carried out by bending the chip placement portion TAB by press.

Figure 67:
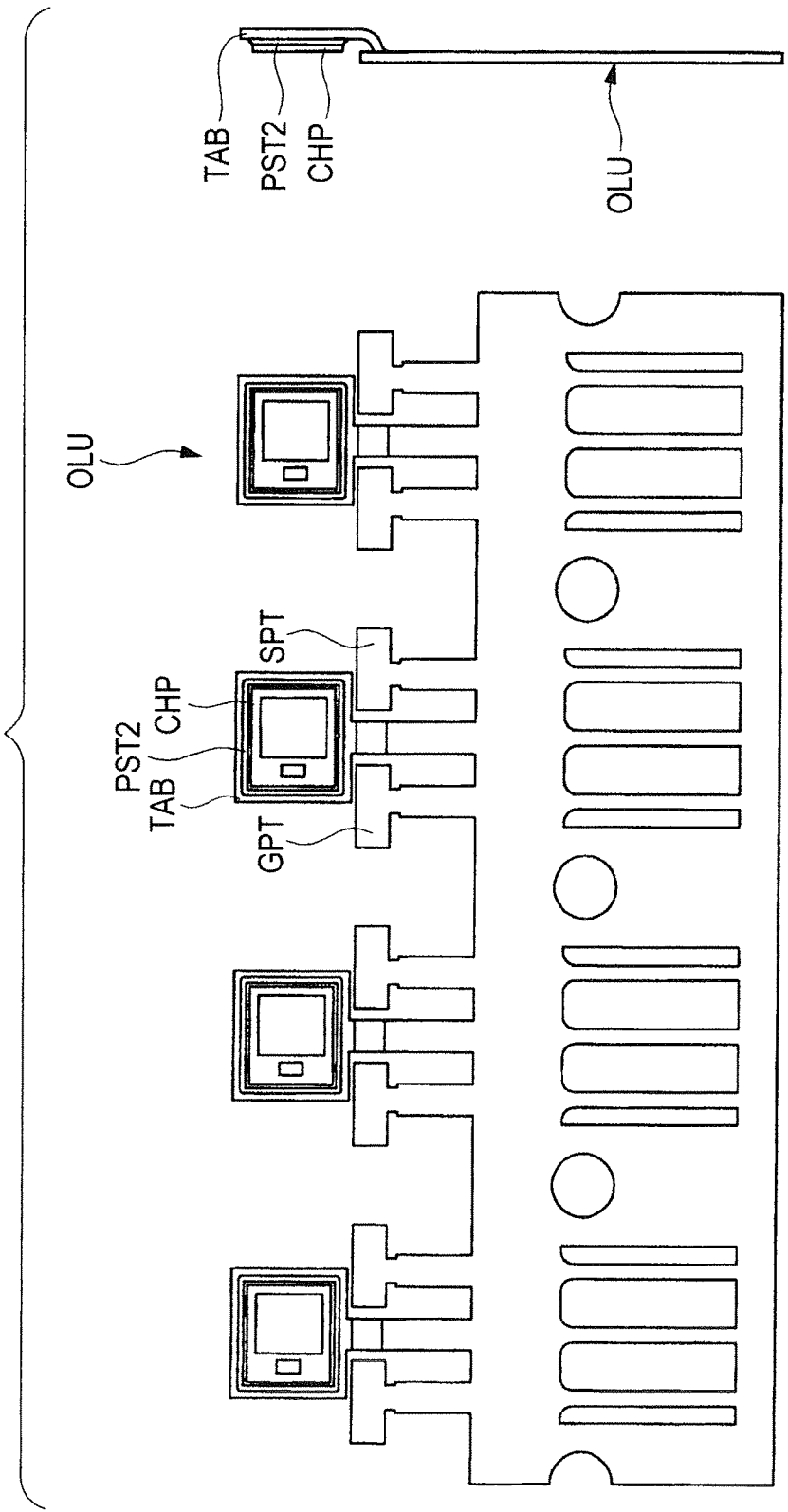
FIG. 67 is a drawing illustrating the manufacturing process of the semiconductor device, following FIG. 66.

As illustrated in FIG. 67, subsequently, solder PST2 is applied to each chip placement portion TAB. Then a semiconductor chip CHP is placed over the chip placement portion TAB with solder PST2 applied thereto (die bonding) and heating processing is carried out. As the result of this step, the drain electrode formed in the back surface of each semiconductor chip CHP and each chip placement portion TAB are electrically coupled with each other.

The back surface of each semiconductor chip CHP is metalized like, for example, Ti/Ni/Au, Ti/Ni/Ag, Ni/Ti/Ni/Au, or the like outward from the chip side. The solder PST2 and Ni under Au form an alloy and the drain electrode formed in the back surface of the semiconductor chip CHP and each chip placement portion TAB are thereby electrically coupled with each other.

Figure 68:
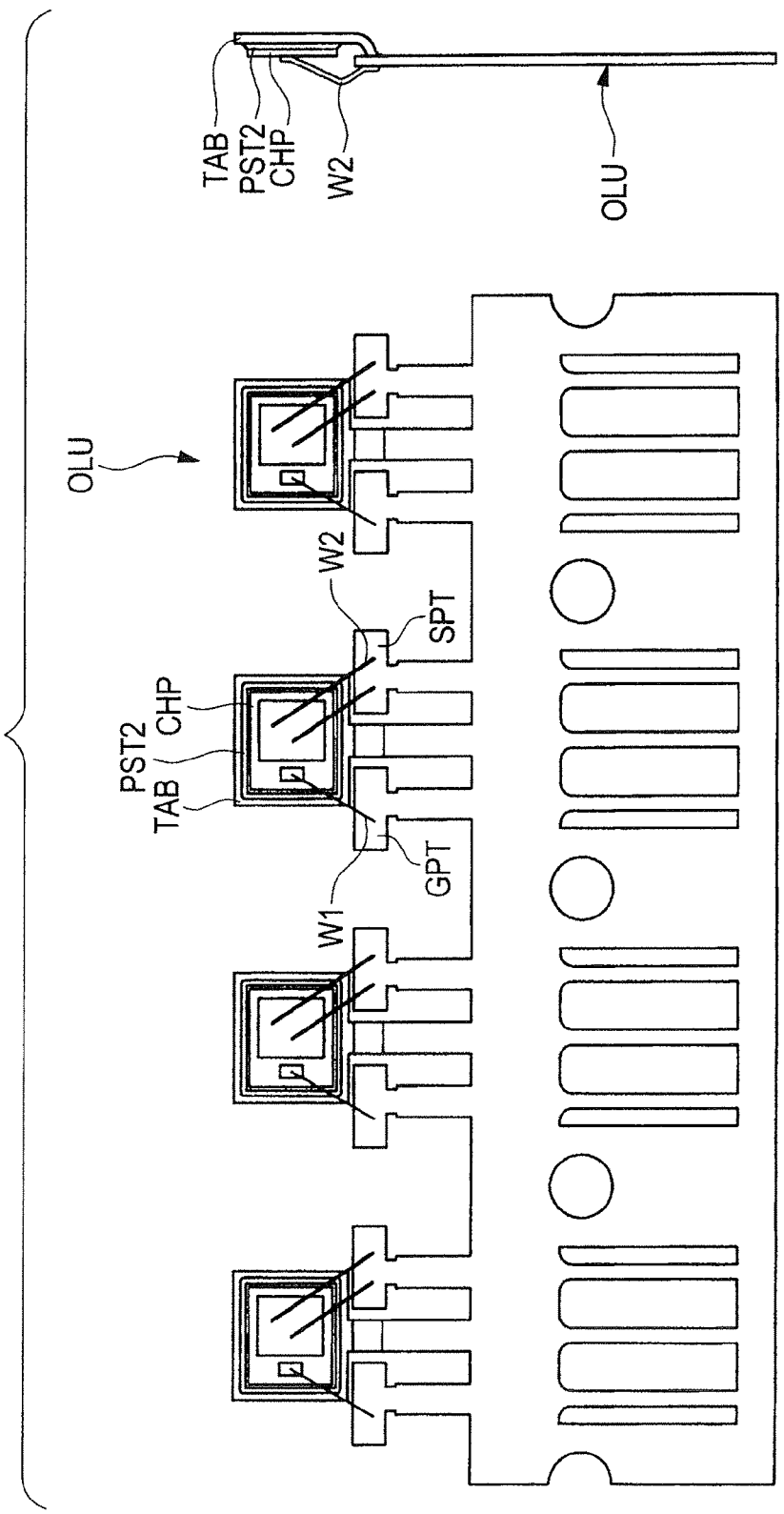
FIG. 68 is a drawing illustrating the manufacturing process of the semiconductor device, following FIG. 67.

As illustrated in FIG. 68, thereafter, the semiconductor chip CHP placed over each chip placement portion TAB and leads are joined with each other through wires (wire bonding). Specifically, the gate pad formed in the front surface of each semiconductor chip CHP and a gate lead post GPT are joined together through a wire W1; and the source pad formed in the front surface of each semiconductor chip CHP and a source lead post SPT are joined together through a wire W2. At this time, the wire diameter of the wire W2 is larger than the wire diameter of the wire W1 and the number of wires W1 is one while the number of wires W2 is more than one (two or above).

It is desirable that the wire W2 larger in wire diameter than the wire W1 should be subjected to wire bonding first. The reason for this is as described below. In wire bonding, in general, an ultrasonic wave larger in power is applied to a wire larger in wire diameter than to a wire smaller in the same. Therefore, if a wire smaller in wire diameter is bonded first and then a wire larger in wire diameter is bonded, the ultrasonic wave at that time transmits through the chip; and this increases the possibility that the wire smaller in wire diameter is displaced from a bonding pad.

Figure 69:
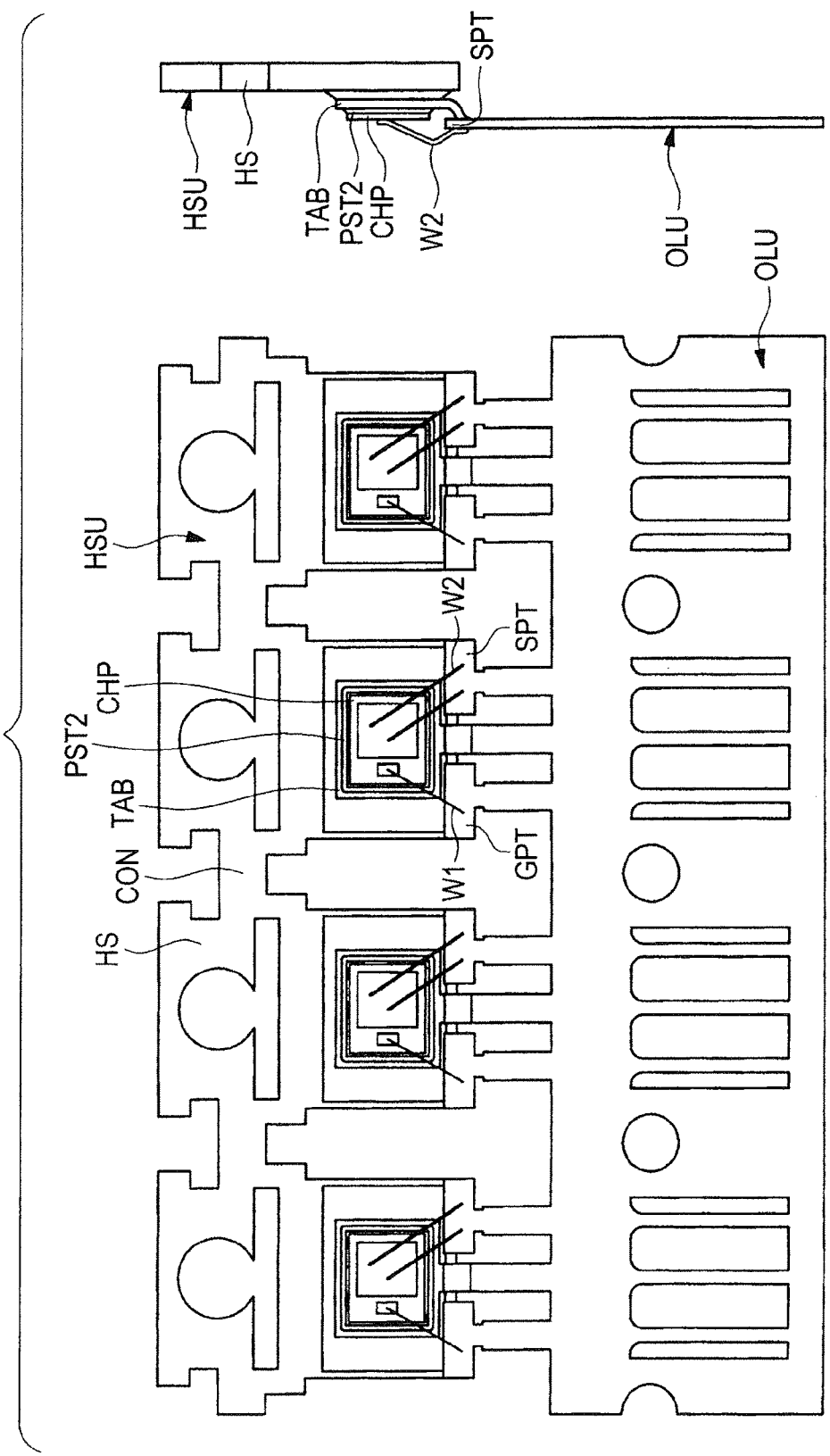
FIG. 69 is a drawing illustrating the manufacturing process of the semiconductor device, following FIG. 68.

As illustrated in FIG. 69, subsequently, a heat sink unit (first frame) HSU in which multiple heat sinks HS are tied together through tying portions CON is prepared. Solder PST1 is applied to each of the heat sinks HS present in this heat sink unit HSU. The heat sink unit HSU prepared at this time is in a straight state. The front surface of each heat sink HSU has been roughened and asperities have been formed in the front surface of each heat sink HS.

Thereafter, the heat sink unit HSU and the outer lead unit OLU are joined with each other. Specifically, the heat sink unit HSU and the outer lead unit OLU are so placed that each chip placement portion TAB present in the outer lead unit OLU is placed over each heat sink HS present in the heat sink unit HSU. Then reflow processing (heating processing) is carried out to melt the solder PST1 to join each heat sink HS and each chip placement portion TAB with each other. At this time, the solder PST2 joining each chip placement portion TAB and each semiconductor chip CHP is melted again in the above reflow processing. However, each semiconductor chip CHP and outer leads are joined with each other through a wire W1 or wires W2. For this reason, each semiconductor chip CHP is fixed by the wire W1 and the wires W2; therefore, it is possible to prevent each semiconductor chip CHP from being displaced due to remelting of the solder PST2.

Subsequently, the heat sink unit HSU and outer lead unit OLU joined together are cleaned. This cleaning processing is carried out to remove flux contained in the solder PST1 and the solder PST2.

Figure 70:
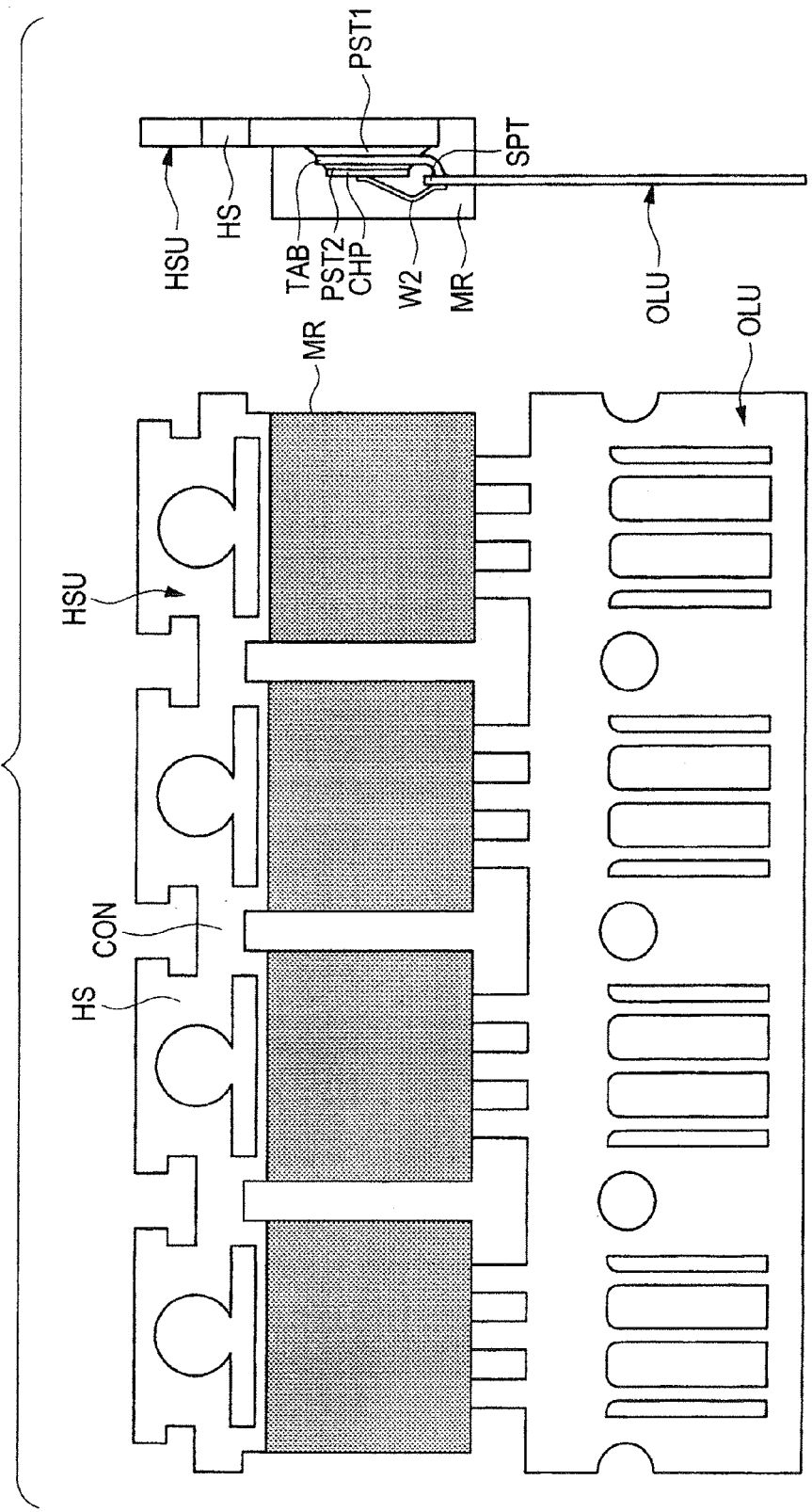
FIG. 70 is a drawing illustrating the manufacturing process of the semiconductor device, following FIG. 69.

As illustrated in FIG. 70, thereafter, part of each heat sink HS, part of each gate lead post GPT, each source lead post SPT, each chip placement portion TAB, and each semiconductor chip CHP are sealed with resin to form the sealing body MR (resin sealing step). More specific description will be given. The heat sink unit HSU and outer lead unit OLU joined together are set in molding dies. Thereafter, resin is filled in the molding dies. When each sealing body MR is subsequently formed, the heat sink unit HSU and outer lead unit OLU with the sealing bodies MR formed thereon are taken out of the molding dies. Thereafter, the heat sink unit HSU and the outer lead unit OLU are cut and formed to manufacture individual packages PK8. The package PK8 (semiconductor device) in this embodiment can be manufactured as mentioned above.

<Modifications>

Figure 71A:
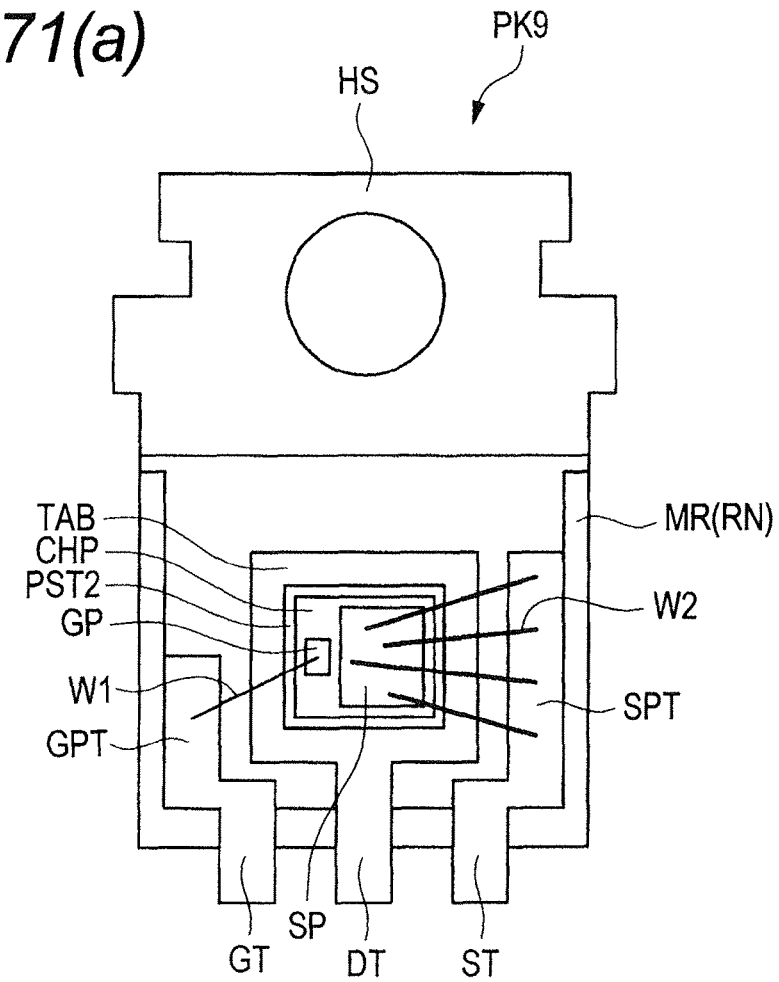
FIG. 71A is a plan view illustrating the internal structure of a ninth package.
Figure 71B:
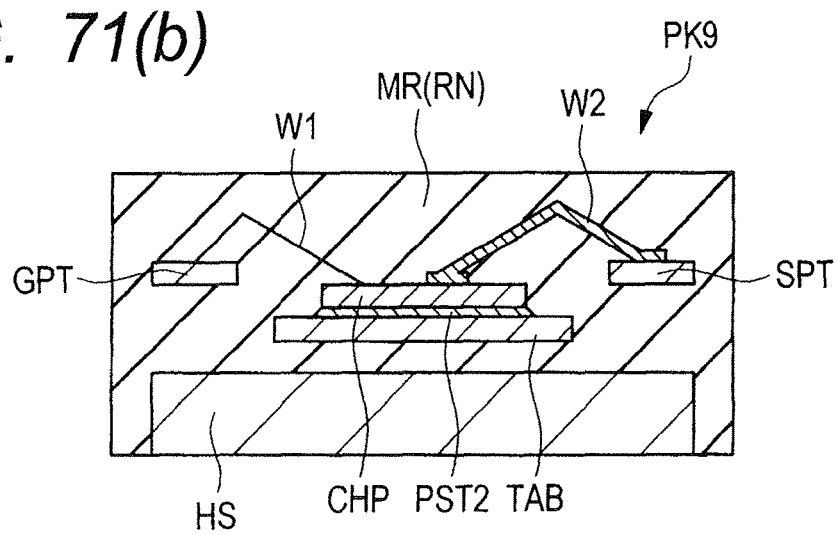
FIG. 71B is a sectional view illustrating the internal structure of the ninth package.

Description will be given to a first modification to the package PK6 obtained, for example, by applying the technical idea of the invention to the second package product. FIGS. 71A and 71B illustrate the structure of a package PK9 in the first modification. Especially, FIG. 71A is a plan view illustrating the internal structure of the package PK9 in the first modification; and FIG. 71B is a sectional view illustrating the internal structure of the package PK9 in the first modification.

FIG. 71A illustrates the internal structure of the package PK9 as is seen through a sealing body MR. As illustrated in FIG. 71A, the package PK9 in the first modification includes a heat sink HS and part of this heat sink HS is exposed from the sealing body MR. A chip placement portion TAB is formed over the heat sink HS and the chip placement portion TAB is formed integrally with a drain terminal DT. Therefore, the chip placement portion TAB and the drain terminal DT are electrically coupled with each other.

A semiconductor chip CHP is placed over the chip placement portion TAB with solder PST2 in between. In this semiconductor chip CHP, for example, a power MOSFET is formed. More specific description will be given. For example, a source pad SP and a gate pad GP are formed in the front surface of the semiconductor chip CHP with the power MOSFET formed therein. The gate pad GP is electrically coupled with a gate lead post GPT forming part of a gate terminal (outer lead) GT through a wire W1; and the source pad SP is electrically coupled with a source lead post SPT forming part of a source terminal (outer lead) ST through a wire W2. A drain electrode (not shown) is formed in the back surface of the semiconductor chip CHP and this drain electrode is electrically coupled with a drain terminal (outer lead) through the chip placement portion TAB.

Description will be given to the cross section structure of the package PK9 with reference to FIG. 71B. As illustrated in FIG. 71B, the heat sink HS is so formed that it is exposed from the bottom surface of the sealing body MR and the chip placement portion TAB is placed over the heat sink HS with resin RN in between. That is, in the package PK9 in the first modification, the heat sink HS and the chip placement portion TAB are separated from each other; and the resin RN is interposed between the heat sink HS and the chip placement portion TAB to insulate the heat sink HS and the chip placement portion TAB from each other.

The semiconductor chip CHP is placed over the chip placement portion TAB with solder PST2 in between. The source pad formed in the front surface of the semiconductor chip CHP and the source lead post SPT are coupled together through the wires W2. The position of the chip placement portion TAB is lower than the position of the source lead post SPT and the heat sink HS is placed below the chip placement portion TAB with resin RN in between.

A feature of the package PK9 is as illustrated in, for example, FIG. 71A. That is, the length of a gate lead post GPT and the length of a source lead post SPT are long and they are extended to the areas opposed to sides of the chip placement portion TAB. More specific description will be given. In the package PK9, the source terminal (source lead) ST has the source lead post SPT and the gate terminal (gate lead) GT has the gate lead post GPT. The chip placement portion TAB is placed between the source lead post SPT and the gate lead post GPT. The semiconductor chip CHP is placed over the second front surface of the chip placement portion TAB so that the source pad SP is closer to the source lead post SPT than the gate pad GP is. The wires W2 (second conductive members) are electrically coupled with the source lead post SPT and the wire W1 (third conductive member) is electrically coupled with the gate lead post GPT. Since the source lead post SPT is extended to the area opposed to a side of the chip placement portion TAB, the following can be implemented: the source pad SP formed in the semiconductor chip CHP and the source lead post SPT forming part of the source terminal ST can be electrically coupled with each other through a larger number of wires W2 than in the package PK6 illustrated in FIG. 46A. For this reason, the coupling resistance between the source pad SP and the source lead post SPT can be reduced and as a result, the on-resistance of the package PK9 can be further reduced.

Figure 72A:
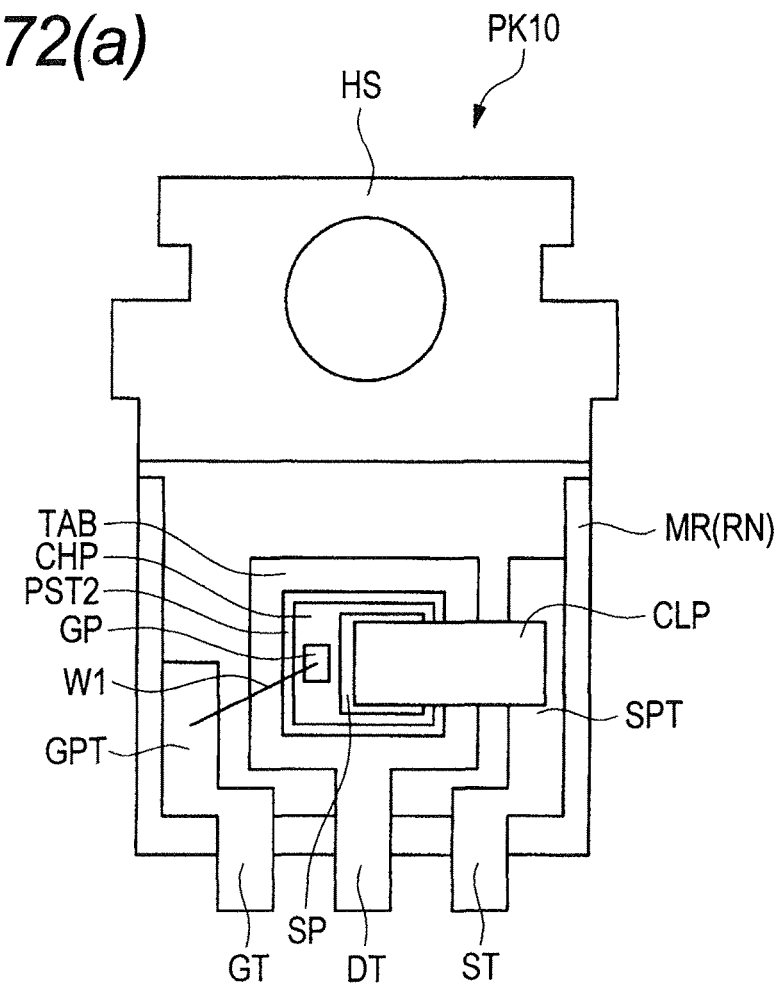
FIG. 72A is a plan view illustrating the internal structure of a 10th package.
Figure 72B:
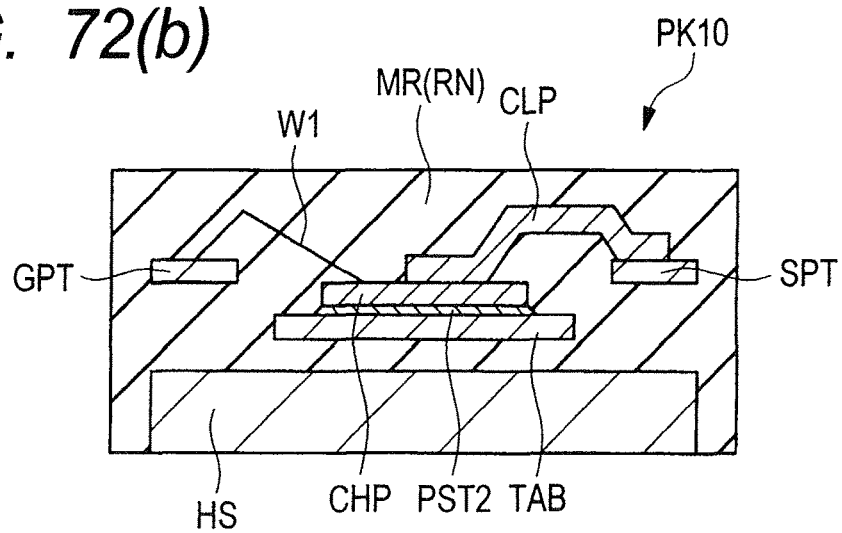
FIG. 72B is a sectional view illustrating the internal structure of the 10th package.

Description will be given to a second modification to the package PK6 obtained, for example, by applying the technical idea of the invention to the second package product. FIGS. 72A and 72B illustrate the structure of a package PK10 in the second modification. Especially, FIG. 72A is a plan view illustrating the internal structure of the package PK10 in the second modification; and FIG. 72B is a sectional view illustrating the internal structure of the package PK10 in the second modification.

The structure of the package PK10 in the second modification is substantially identical with the structure of the package PK9 illustrated in FIG. 71A and FIG. 71B and description will be given to a difference. In the package PK10 in the second modification, as illustrated in FIG. 72A and FIG. 72B, the source lead post SPT is extended to the area opposed to a side of the chip placement portion TAB as in the package PK9 in the first modification. Therefore, the source pad SP formed in the semiconductor chip CHP and the source lead post SPT forming part of the source terminal ST can be electrically coupled with each other using, for example, a plate-like electrode designated as clip CLP. For this reason, the coupling resistance between the source pad SP and the source lead post SPT can be reduced and as a result, the on-resistance of the package PK9 can be further reduced. For example, an Al ribbon formed using aluminum, a copper clip formed using copper, or the like can be used as the clip CLP.

Figure 73A:
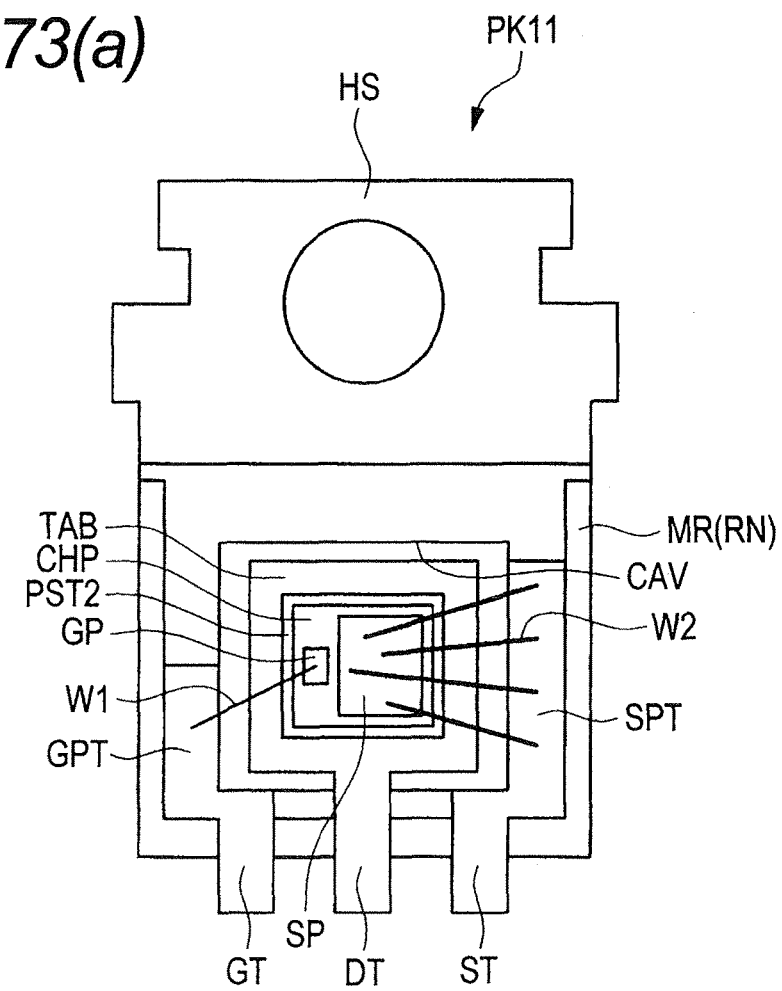
FIG. 73A is a plan view illustrating the internal structure of an 11th package.
Figure 73B:
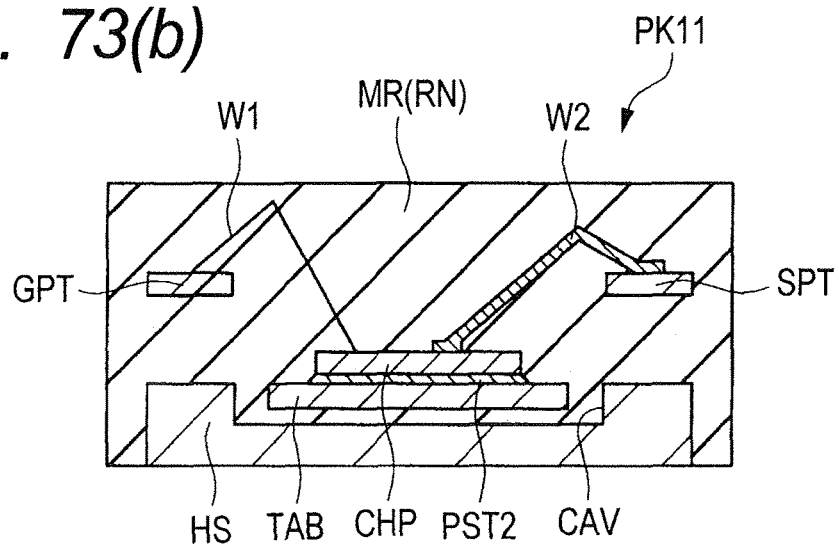
FIG. 73B is a sectional view illustrating the internal structure of the 11th package.

Description will be given to a third modification to the package PK6 obtained, for example, by applying the technical idea of the invention to the second package product. FIGS. 73A and 73B illustrate the structure of a package PK11 in the third modification. Especially, FIG. 73A is a plan view illustrating the internal structure of the package PK11 in the third modification; and FIG. 73B is a sectional view illustrating the internal structure of the package PK11 in the third modification.

The structure of the package PK11 in the third modification is substantially identical with the structure of the package PK9 illustrated in FIG. 71A and FIG. 71B and description will be given to a difference. In the package PK11 in the third modification, as illustrated in FIG. 73A and FIG. 73B, a cavity portion CAV is formed in the heat sink HS and the chip placement portion TAB is placed in this cavity portion CAV. In the third modification, for this reason, the chip placement portion TAB is opposed not only to the upper surface of the heat sink HS high in thermal conductivity but also to the side surfaces thereof. Therefore, the efficiency of thermal conduction from the chip placement portion TAB to the heat sink HS is enhanced. As a result, the heat radiation efficiency of the package PK11 can be enhanced. More specific description will be given. The semiconductor chip CHP as a heat source is placed over the chip placement portion TAB and heat produced at the semiconductor chip CHP is partly transmitted to the chip placement portion TAB joined with the semiconductor chip CHP. The heat that reached the chip placement portion TAB is transmitted to the heat sink HS through resin RN. In the third modification, the chip placement portion TAB is placed in the cavity portion CAV formed in the heat sink HS. At the above-mentioned time, therefore, heat from the chip placement portion TAB is efficiently transmitted to the heat sink HS. In the package PK11 in the third modification, for this reason, the efficiency of heat radiation from the heat sink HS can be enhanced.

Figure 74A:
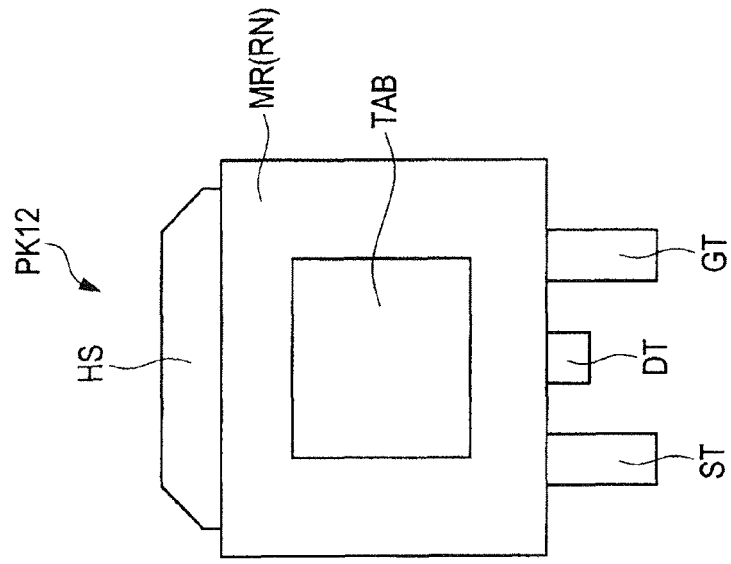
FIG. 74A is a plan view illustrating a 12th package as viewed from front.
Figure 74B:
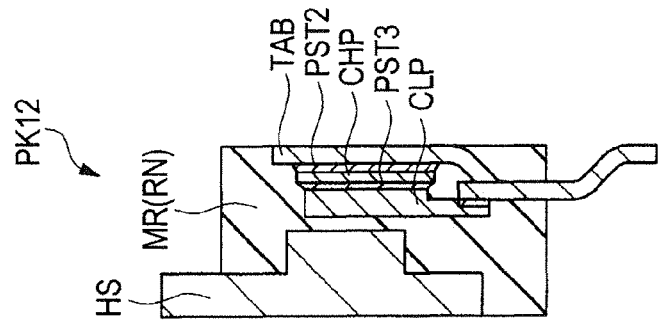
Figure 74C:
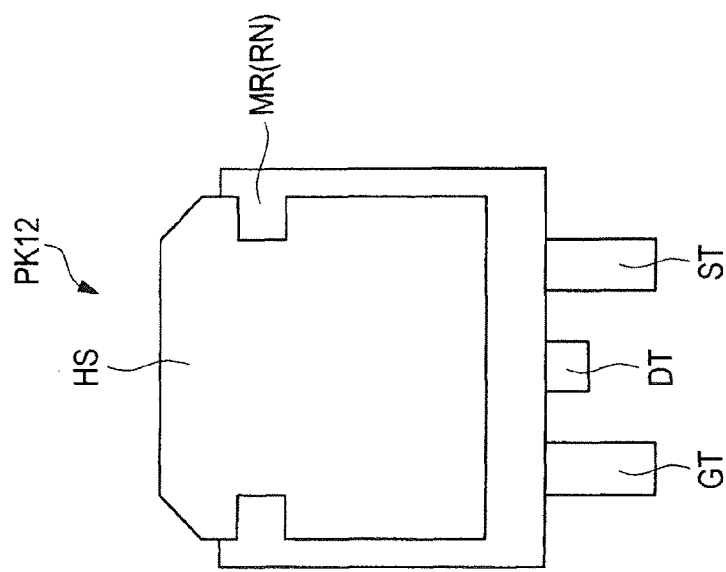

Lastly, description will be given to a fourth modification to which the technical idea of the invention is applied. FIGS. 74A to 74C illustrate the structure of a package PK12 in the fourth modification. Especially, FIG. 74A is a plan view of the package PK12 as viewed from front; and FIG. 74C is a plan view of the package PK12 as viewed from rear.

In FIG. 74A, the package PK12 has a rectangular sealing body MR and a semiconductor chip in which, for example, an integrated circuit is formed is buried in this sealing body MR. A heat sink HS is formed over the front surface of the sealing body MR. Meanwhile, a gate terminal GT, a drain terminal DT, and a source terminal ST are protruded from the lower part of the sealing body MR. It is seen from FIG. 74C that in the package PK12, the chip placement portion TAB is exposed from the back surface of the sealing body MR.

Description will be given to the internal structure of the package PK12. FIG. 74B illustrates the cross section structure of the package PK12 in the fourth modification. As illustrated in FIG. 74B, the chip placement portion TAB is so formed that it is exposed from the bottom surface of the sealing body MR; and the semiconductor chip CHP is placed over the chip placement portion TAB with solder PST2 in between. A clip CLP is placed over the semiconductor chip with solder PST3 in between and the heat sink HS is formed above this clip CLP with resin RN in between.

A feature of the thus configured package PK12 is as described below. The chip placement portion TAB is so formed that it is exposed from the back surface of the sealing body MR and the heat sink HS is placed on the front surface side of the sealing body MR. More specific description will be given. In the fourth modification, the chip placement portion TAB is placed below the semiconductor chip CHP as a heat source and the heat sink HS is placed above the semiconductor chip CHP. As a result, of heat produced at the semiconductor chip CHP, part transmitted to below the semiconductor chip CHP can be dissipated from the chip placement portion TAB; and part transmitted to above the semiconductor chip CHP can be dissipated from the heat sink HS. For this reason, it is possible to efficiently dissipate heat produced at the semiconductor chip CHP to the external space located outside the package PK12. That is, in the package PK12 in the fourth modification, the heat radiation efficiency can be enhanced.

In the fourth modification, a convex portion is provided under the heat sink HS and the convex portion formed in the heat sink HS is so configured that it is sufficiently close to the semiconductor chip CHP. This makes it possible to efficiently pick up heat produced at the semiconductor chip CHP by the convex portion and thus further enhancement of the heat radiation efficiency can be achieved.

Figure 75:
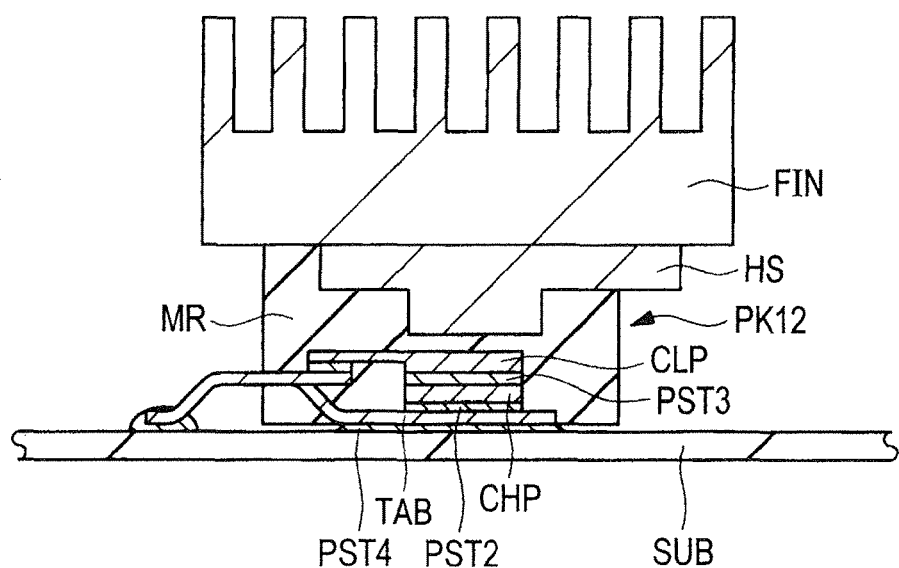

FIG. 75 is a sectional view illustrating how the package PK12 in the fourth modification is mounted over a mounting substrate SUB. As illustrated in FIG. 75, the chip placement portion TAB exposed from the back surface of the package PK12 and terminals of the mounting substrate SUB are joined with each other through, for example, solder PST4. The outer leads protruded from the package PK12 are also joined with the mounting substrate SUB using solder. Meanwhile, the heat sink HS exposed from the upper surface (front surface) of the package PK12 has a radiation fin FIN directly attached thereto. As a result, heat transmitted from the semiconductor chip CHP to the heat sink HS is more efficiently dissipated to the external space from the radiation fin FIN directly joined to the heat sink HS.

Up to this point, concrete description has been given to the invention made by the present inventors based on embodiments thereof. However, the invention is not limited to these embodiments and can be variously modified without departing from the subject matter thereof, needless to add.

The above-mentioned MOSFETs are not limited to those in which a gate insulating film is formed of an oxide film. They are intended to also include MISFETs (Metal Insulator Semiconductor Field Effect Transistors) in which a gate insulating film is formed of a wide range of insulating films. In this specification, that is, the term of MOSFET is used for the sake of convenience. In this specification, however, the term of MOSFET is used as a term intended to also include MISFET.

The invention can be widely utilized in the manufacturing industry that manufactures semiconductor devices.

What is claimed is:

1. A semiconductor device comprising:
   (a) a heat sink having a first front surface and a first back surface located on the opposite side to the first front surface;
   (b) a lead portion having a plurality of leads and a chip placement portion having a second front surface and a second back surface located on the opposite side to the second front surface;
   (c) a semiconductor chip placed over the second front surface of the chip placement portion; and
   (d) a sealing body sealing part of the heat sink, part of the lead portion, and the semiconductor chip,
   wherein the semiconductor chip and the leads comprising the lead portion are electrically coupled with each other, and
   wherein in the sealing body, the first front surface of the heat sink and the second back surface of the chip placement portion are placed opposite to each other,
   wherein the semiconductor chip is a chip including a power transistor and having a source pad and a gate pad in the chip front surface and a drain electrode in a chip back surface located on the opposite side to the chip front surface,
   wherein the lead portion includes a source lead, a gate lead, and a drain lead,
   wherein the chip placement portion and the drain lead are joined with each other,
   wherein the second front surface of the chip placement portion and the drain electrode are electrically coupled with each other through a first conductive member,
   wherein the source pad and the source lead are electrically coupled with each other through a second conductive member, and
   wherein the gate pad and the gate lead are electrically coupled with each other through a third conductive member.

2. The semiconductor device according to claim 1, wherein the first front surface of the heat sink and the second back surface of the chip placement portion are electrically coupled with each other.

3. The semiconductor device according to claim 2, wherein the first front surface of the heat sink and the second back surface of the chip placement portion are coupled with each other through solder.

4. The semiconductor device according to claim 3, wherein of the first front surface of the heat sink, an area in contact with the sealing body is roughened as compared with the first back surface of the heat sink.

5. The semiconductor device according to claim 1, wherein the first front surface of the heat sink and the second back surface of the chip placement portion are electrically insulated from each other.

6. The semiconductor device according to claim 5, wherein part of the sealing body is placed between the first front surface of the heat sink and the second back surface of the chip placement portion.

7. The semiconductor device according to claim 6, wherein the first back surface of the heat sink is exposed from the sealing body.

8. The semiconductor device according to claim 6, wherein the material of the heat sink and the material of the lead portion are different from each other.

9. The semiconductor device according to claim 8, wherein the material of the heat sink is aluminum and the material of the lead portion is copper.

10. The semiconductor device according to claim 6, wherein a recessed portion larger than the outside shape of the chip placement portion as viewed in a plane is formed in the first front surface of the heat sink.

11. The semiconductor device according to claim 10, wherein the chip placement portion is placed in the recessed portion formed in the first front surface of the heat sink.

12. The semiconductor device according to claim 1, wherein the source lead includes a source lead post, wherein the gate lead includes a gate lead post, wherein the chip placement portion is placed between the source lead post and the gate lead post, wherein the semiconductor chip is placed over the second front surface of the chip placement portion so that the source pad is closer to the source lead post than the gate pad is, wherein the second conductive member is electrically coupled with the source lead post, and wherein the third conductive member is electrically coupled with the gate lead post.

13. The semiconductor device according to claim 1, wherein the second conductive member is comprised of a plurality of first wires using aluminum as the material thereof.

14. The semiconductor device according to claim 1, wherein the second conductive member is comprised of a ribbon using aluminum as the material thereof or a clip using copper as the material thereof.

15. The semiconductor device according to claim 1, wherein the second conductive member is comprised of a first wire and the third conductive member is comprised of a second wire, and wherein the wire diameter of the first wire is larger than the wire diameter of the second wire.

16. The semiconductor device according to claim 1, wherein the first conductive member is comprised of solder.

* * * * *